United States Patent
Egi et al.

(10) Patent No.: US 10,224,433 B2
(45) Date of Patent: Mar. 5, 2019

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Yuji Egi, Isehara (JP); Hideomi Suzawa, Atsugi (JP); Shinya Sasagawa, Chigasaki (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/467,288

(22) Filed: Mar. 23, 2017

(65) Prior Publication Data

US 2017/0200828 A1  Jul. 13, 2017

Related U.S. Application Data

(63) Continuation of application No. 14/609,814, filed on Jan. 30, 2015, now Pat. No. 9,608,123, which is a (Continued)

(30) Foreign Application Priority Data

Nov. 30, 2011 (JP) ................................ 2011-263027

(51) Int. Cl.
*H01L 21/02* (2006.01)
*H01L 21/44* (2006.01)
(Continued)

(52) U.S. Cl.
CPC ...... *H01L 29/7869* (2013.01); *H01L 21/0206* (2013.01); *H01L 21/44* (2013.01);
(Continued)

(58) Field of Classification Search
CPC .......... H01L 29/78603; H01L 29/7869; H01L 29/78693
See application file for complete search history.

(56) References Cited

U.S. PATENT DOCUMENTS

| 4,478,679 A | 10/1984 | Chang et al. |
| 5,731,856 A | 3/1998 | Kim et al. |

(Continued)

FOREIGN PATENT DOCUMENTS

| CN | 101252134 A | 8/2008 |
| CN | 101582453 A | 11/2009 |

(Continued)

OTHER PUBLICATIONS

Taiwanese Office Action (Application No. 106110592) dated Jul. 19, 2017.
(Continued)

*Primary Examiner* — Joshua King
(74) *Attorney, Agent, or Firm* — Robinson Intellectual Property Law Office; Eric J. Robinson

(57) ABSTRACT

In a semiconductor device including a transistor in which an oxide semiconductor layer, a gate insulating layer, and a gate electrode layer on side surfaces of which sidewall insulating layers are provided are stacked in this order, a source electrode layer and a drain electrode layer are provided in contact with the oxide semiconductor layer and the sidewall insulating layers. In a process for manufacturing the semiconductor device, a conductive layer and an interlayer insulating layer are stacked to cover the oxide semiconductor layer, the sidewall insulating layers, and the gate electrode layer. Then, parts of the interlayer insulating layer and the conductive layer over the gate electrode layer are removed by a chemical mechanical polishing method, so that a source electrode layer and a drain electrode layer are formed. Before formation of the gate insulating layer, clean-
(Continued)

ing treatment is performed on the oxide semiconductor layer.

21 Claims, 24 Drawing Sheets

Related U.S. Application Data continuation of application No. 13/677,663, filed on Nov. 15, 2012, now Pat. No. 8,956,929.

(51) Int. Cl.
| | | |
|---|---|---|
| H01L 27/12 | (2006.01) | |
| H01L 29/04 | (2006.01) | |
| H01L 29/06 | (2006.01) | |
| H01L 29/66 | (2006.01) | |
| H01L 21/465 | (2006.01) | |
| H01L 27/146 | (2006.01) | |
| H01L 29/786 | (2006.01) | |
| H01L 21/4757 | (2006.01) | |
| H01L 21/4763 | (2006.01) | |

(52) U.S. Cl.
CPC ........ *H01L 21/465* (2013.01); *H01L 21/4757* (2013.01); *H01L 21/47635* (2013.01); *H01L 27/127* (2013.01); *H01L 27/1225* (2013.01); *H01L 27/1255* (2013.01); *H01L 27/14616* (2013.01); *H01L 29/045* (2013.01); *H01L 29/0684* (2013.01); *H01L 29/66969* (2013.01); *H01L 29/78603* (2013.01); *H01L 29/78693* (2013.01); *H01L 21/02565* (2013.01)

(56) References Cited

U.S. PATENT DOCUMENTS

| | | | |
|---|---|---|---|
| 5,744,864 A | | 4/1998 | Cillessen et al. |
| 5,827,768 A | * | 10/1998 | Lin .................... H01L 21/76895 438/300 |
| 6,001,697 A | * | 12/1999 | Chang ............... H01L 21/76895 257/E21.438 |
| 6,049,092 A | | 4/2000 | Konuma et al. |
| 6,162,690 A | * | 12/2000 | Lee .................... H01L 21/28525 257/E21.166 |
| 6,294,274 B1 | | 9/2001 | Kawazoe et al. |
| 6,352,899 B1 | | 3/2002 | Sakiyama et al. |
| 6,563,174 B2 | | 5/2003 | Kawasaki et al. |
| 6,727,522 B1 | | 4/2004 | Kawasaki et al. |
| 6,759,285 B2 | | 7/2004 | Dennison et al. |
| 6,794,229 B2 | | 9/2004 | Asami et al. |
| 6,897,150 B1 | | 5/2005 | Aoki et al. |
| 7,049,190 B2 | | 5/2006 | Takeda et al. |
| 7,061,014 B2 | | 6/2006 | Hosono et al. |
| 7,064,346 B2 | | 6/2006 | Kawasaki et al. |
| 7,105,868 B2 | | 9/2006 | Nause et al. |
| 7,126,174 B2 | | 10/2006 | Segawa et al. |
| 7,211,825 B2 | | 5/2007 | Shih et al. |
| 7,282,782 B2 | | 10/2007 | Hoffman et al. |
| 7,297,977 B2 | | 11/2007 | Hoffman et al. |
| 7,323,356 B2 | | 1/2008 | Hosono et al. |
| 7,378,286 B2 | | 5/2008 | Hsu et al. |
| 7,385,224 B2 | | 6/2008 | Ishii et al. |
| 7,402,506 B2 | | 7/2008 | Levy et al. |
| 7,411,209 B2 | | 8/2008 | Endo et al. |
| 7,453,065 B2 | | 11/2008 | Saito et al. |
| 7,453,087 B2 | | 11/2008 | Iwasaki |
| 7,462,862 B2 | | 12/2008 | Hoffman et al. |
| 7,468,304 B2 | | 12/2008 | Kaji et al. |
| 7,501,293 B2 | | 3/2009 | Ito et al. |
| 7,541,216 B2 | | 6/2009 | Yates et al. |
| 7,563,661 B2 | | 7/2009 | Tanaka |
| 7,645,655 B2 | | 1/2010 | Watanabe et al. |
| 7,674,650 B2 | | 3/2010 | Akimoto et al. |
| 7,732,819 B2 | | 6/2010 | Akimoto et al. |
| 7,791,072 B2 | | 9/2010 | Kumomi et al. |
| 7,968,396 B2 | | 6/2011 | Watanabe et al. |
| 8,237,166 B2 | | 8/2012 | Kumomi et al. |
| 8,384,076 B2 | | 2/2013 | Park et al. |
| 8,501,564 B2 | | 8/2013 | Suzawa et al. |
| 8,502,221 B2 | | 8/2013 | Yamazaki |
| 8,530,285 B2 | | 9/2013 | Yamazaki et al. |
| 8,581,260 B2 | | 11/2013 | Yamazaki et al. |
| 8,664,036 B2 | | 3/2014 | Yamazaki et al. |
| 8,686,425 B2 | | 4/2014 | Yamazaki et al. |
| 8,816,469 B2 | | 8/2014 | Kamata |
| 8,823,074 B2 | | 9/2014 | Suzawa et al. |
| 8,981,518 B2 | | 3/2015 | Kamata |
| 9,054,134 B2 | | 6/2015 | Yamazaki et al. |
| 9,064,967 B2 | | 6/2015 | Suzawa et al. |
| 9,240,488 B2 | | 1/2016 | Yamazaki et al. |
| 9,318,613 B2 | | 4/2016 | Yamazaki |
| 9,378,980 B2 | | 6/2016 | Yamazaki et al. |
| 9,391,095 B2 | | 7/2016 | Yamazaki et al. |
| 9,431,545 B2 | | 8/2016 | Saito et al. |
| 9,728,651 B2 | | 8/2017 | Yamazaki et al. |
| 9,819,256 B2 | | 11/2017 | Kamata |
| 2001/0046027 A1 | | 11/2001 | Tai et al. |
| 2002/0056838 A1 | | 5/2002 | Ogawa |
| 2002/0132454 A1 | | 9/2002 | Ohtsu et al. |
| 2003/0189401 A1 | | 10/2003 | Kido et al. |
| 2003/0211667 A1 | | 11/2003 | Takatoku |
| 2003/0211668 A1 | | 11/2003 | Takatoku |
| 2003/0218222 A1 | | 11/2003 | Wager, III et al. |
| 2004/0038446 A1 | | 2/2004 | Takeda et al. |
| 2004/0127038 A1 | | 7/2004 | Carcia et al. |
| 2005/0017302 A1 | | 1/2005 | Hoffman |
| 2005/0017303 A1 | * | 1/2005 | Ishikawa ........... H01L 29/41733 257/347 |
| 2005/0199959 A1 | | 9/2005 | Chiang et al. |
| 2006/0035452 A1 | | 2/2006 | Carcia et al. |
| 2006/0043377 A1 | | 3/2006 | Hoffman et al. |
| 2006/0091793 A1 | | 5/2006 | Baude et al. |
| 2006/0108529 A1 | | 5/2006 | Saito |
| 2006/0108636 A1 | | 5/2006 | Sano et al. |
| 2006/0110867 A1 | | 5/2006 | Yabuta et al. |
| 2006/0113536 A1 | | 6/2006 | Kumomi et al. |
| 2006/0113539 A1 | | 6/2006 | Sano et al. |
| 2006/0113549 A1 | | 6/2006 | Den et al. |
| 2006/0113565 A1 | | 6/2006 | Abe et al. |
| 2006/0169973 A1 | | 8/2006 | Isa et al. |
| 2006/0170111 A1 | | 8/2006 | Isa et al. |
| 2006/0197092 A1 | | 9/2006 | Hoffman et al. |
| 2006/0208977 A1 | | 9/2006 | Kimura |
| 2006/0228974 A1 | | 10/2006 | Thelss et al. |
| 2006/0231882 A1 | | 10/2006 | Kim et al. |
| 2006/0234508 A1 | | 10/2006 | Shirakashi et al. |
| 2006/0238135 A1 | | 10/2006 | Kimura |
| 2006/0244107 A1 | | 11/2006 | Sugihara et al. |
| 2006/0284171 A1 | | 12/2006 | Levy et al. |
| 2006/0284172 A1 | | 12/2006 | Ishii |
| 2006/0284220 A1 | | 12/2006 | Watanabe et al. |
| 2006/0292777 A1 | | 12/2006 | Dunbar |
| 2007/0024187 A1 | | 2/2007 | Shin et al. |
| 2007/0046191 A1 | | 3/2007 | Saito |
| 2007/0052025 A1 | | 3/2007 | Yabuta |
| 2007/0054507 A1 | | 3/2007 | Kaji et al. |
| 2007/0090365 A1 | | 4/2007 | Hayashi et al. |
| 2007/0108446 A1 | | 5/2007 | Akimoto |
| 2007/0152217 A1 | | 7/2007 | Lai et al. |
| 2007/0172591 A1 | | 7/2007 | Seo et al. |
| 2007/0187678 A1 | | 8/2007 | Hirao et al. |
| 2007/0187760 A1 | | 8/2007 | Furuta et al. |
| 2007/0194379 A1 | | 8/2007 | Hosono et al. |
| 2007/0252210 A1 | | 11/2007 | Ishikawa |
| 2007/0252928 A1 | | 11/2007 | Ito et al. |
| 2007/0272922 A1 | | 11/2007 | Kim et al. |
| 2007/0287296 A1 | | 12/2007 | Chang |
| 2008/0006877 A1 | | 1/2008 | Mardilovich et al. |
| 2008/0038882 A1 | | 2/2008 | Takechi et al. |
| 2008/0038929 A1 | | 2/2008 | Chang |
| 2008/0050595 A1 | | 2/2008 | Nakagawara et al. |

(56) References Cited

U.S. PATENT DOCUMENTS

| | | | |
|---|---|---|---|
| 2008/0063840 A1* | 3/2008 | Morita | H01L 21/3065 428/156 |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0128809 A1 | 6/2008 | Ohnuma | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0254625 A1* | 10/2008 | Sharma | C11D 7/08 438/689 |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0283763 A1 | 11/2009 | Park et al. | |
| 2010/0065844 A1 | 3/2010 | Tokunaga | |
| 2010/0092800 A1 | 4/2010 | Itagaki et al. | |
| 2010/0102311 A1 | 4/2010 | Ito et al. | |
| 2010/0105164 A1 | 4/2010 | Ito et al. | |
| 2010/0109002 A1 | 5/2010 | Itagaki et al. | |
| 2010/0155721 A1 | 6/2010 | Lee et al. | |
| 2011/0065250 A1 | 3/2011 | Tokunaga | |
| 2011/0068339 A1 | 3/2011 | Konuma et al. | |
| 2011/0147738 A1 | 6/2011 | Yamazaki et al. | |
| 2011/0151618 A1 | 6/2011 | Yamazaki et al. | |
| 2011/0156026 A1* | 6/2011 | Yamazaki | H01L 21/02422 257/43 |
| 2012/0034761 A1* | 2/2012 | Kuppurao | H01L 21/02046 438/476 |
| 2012/0187397 A1 | 7/2012 | Yamazaki et al. | |
| 2013/0075732 A1 | 3/2013 | Saito et al. | |
| 2013/0105792 A1 | 5/2013 | Yamazaki et al. | |
| 2013/0119373 A1 | 5/2013 | Yamazaki | |
| 2013/0134413 A1 | 5/2013 | Yamazaki et al. | |
| 2015/0118790 A1 | 4/2015 | Yamazaki et al. | |
| 2016/0225908 A1 | 8/2016 | Yamazaki | |

FOREIGN PATENT DOCUMENTS

| | | |
|---|---|---|
| EP | 1122771 A | 8/2001 |
| EP | 1737044 A | 12/2006 |
| EP | 2120267 A | 11/2009 |
| EP | 2226847 A | 9/2010 |
| EP | 2408011 A | 1/2012 |
| EP | 2927965 A | 10/2015 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-209075 A | 8/1998 |
| JP | 10-261793 A | 9/1998 |
| JP | 11-505377 | 5/1999 |
| JP | 2000-044236 A | 2/2000 |
| JP | 2000-150900 A | 5/2000 |
| JP | 2001-237427 A | 8/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-116977 A | 4/2005 |
| JP | 2006-060209 A | 3/2006 |
| JP | 2006-165528 A | 6/2006 |
| JP | 2006-344804 A | 12/2006 |
| JP | 2008-311675 A | 12/2008 |
| JP | 2009-252887 A | 10/2009 |
| JP | 2009-278115 A | 11/2009 |
| JP | 2011-139055 A | 7/2011 |
| JP | 2011-146694 A | 7/2011 |
| JP | 2011-146697 A | 7/2011 |
| JP | 2011-176296 A | 9/2011 |
| JP | 2011-228695 A | 11/2011 |
| JP | 2013-102131 A | 5/2013 |
| TW | 201137993 | 11/2011 |
| WO | WO-2004/114391 | 12/2004 |
| WO | WO-2011/068028 | 6/2011 |
| WO | WO-2011/074407 | 6/2011 |
| WO | WO-2011/074409 | 6/2011 |
| WO | WO-2011/081009 | 7/2011 |
| WO | WO-2011/093150 | 8/2011 |
| WO | WO-2011/122364 | 10/2011 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623. pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(56) References Cited

OTHER PUBLICATIONS

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=in,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits , 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 :SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposiun Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YbFe2O4, and Yb2Fe3O7 Types of Structures for Compounds in the In2O3 and Sc2O3—A2O3—BO Systems [A: Fe, Ga, or Al; B: Mg, Mn, Fe, Ni, Cu, or Zn] at Temperatures over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission

(56) References Cited

OTHER PUBLICATIONS

AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops. Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Chinese Office Action (Application No. 201210504910.4) dated Jun. 23, 2016.

Taiwanese Office Action (Application No. 105124614) dated Nov. 17, 2016.

Taiwanese Office Action (Application No. 106110592) dated May 10, 2018.

* cited by examiner

METHOD FOR MANUFACTURING SEMICONDUCTOR DEVICE

BACKGROUND OF THE INVENTION

1. Field of the Invention

The disclosed invention relates to a semiconductor device and a method for manufacturing the semiconductor device.

In this specification and the like, a semiconductor device refers to all types of devices which can function by utilizing semiconductor characteristics; an electro-optical device, a light-emitting display device, a semiconductor circuit, and an electronic device are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide including indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

In order to achieve high-speed operation, low power consumption, cost reduction, or the like of a transistor, it is necessary to miniaturize a transistor.

However, as transistors are miniaturized, deterioration in electric characteristics of the transistors, such as lowering in the threshold voltage, an increase of variation in the threshold voltages, and an increase in the amount of off-state current, is likely to occur.

In addition, as transistors are miniaturized, the transistors are likely to be damaged due to dry etching or affected by diffusion of an impurity element into a semiconductor layer. As a result, a yield or reliability is likely to be reduced.

An object of one embodiment of the present invention is to provide a structure of a semiconductor device which achieves high-speed response and high-speed operation by improving on characteristics (e.g., on-state current or field-effect mobility) of a miniaturized transistor, and to provide a manufacturing method thereof, in order to achieve a high-performance semiconductor device.

Another object of the present invention is to provide a highly reliable transistor with less variation and favorable electric characteristics.

Further, another object of one embodiment of the present invention is to achieve high performance, high reliability, and high productivity also in a semiconductor device including the transistor.

In a semiconductor device including a transistor in which an oxide semiconductor layer, a gate insulating layer and a gate electrode layer on side surfaces of which sidewall insulating layers are provided are stacked in this order, a source electrode layer and a drain electrode layer are provided in contact with the oxide semiconductor layer and the sidewall insulating layers. In a process for manufacturing the semiconductor device, a conductive layer and an interlayer insulating layer are stacked to cover the oxide semiconductor layer, the sidewall insulating layers, and the gate electrode layer. Then, the interlayer insulating layer and the conductive layer are cut (grinded or polished), so that the conductive layer over the gate electrode layer is removed. Accordingly, a source electrode layer and a drain electrode layer are formed. As the cutting (grinding or polishing) method, a chemical mechanical polishing (CMP) method can be preferably used.

When the conductive layer over the gate electrode layer is removed in the formation step of the source electrode layer and the drain electrode layer, etching treatment using a resist mask is not performed, so that a minute process can be precisely performed. Consequently, in a process for manufacturing the semiconductor device, a transistor having a miniaturized structure with less variation in shape or characteristics can be manufactured with high yield.

Further, an insulating layer is preferably provided over the gate electrode layer. Part or all of the insulating layer may be removed in a step of removing part of the conductive layer which is provided over the insulating layer and to be a source electrode layer and a drain electrode layer.

Furthermore, a dopant may be introduced into the oxide semiconductor layer by a self-aligned process in which the gate electrode layer is used as a mask, so that low-resistance regions which include the dopant and have a lower resistance than a channel formation region and between which the channel formation region is sandwiched are formed in the oxide semiconductor layer. The dopant is an impurity by which the electrical conductivity of the oxide semiconductor layer is changed. As the method for introducing the dopant, an ion implantation method, an ion doping method, a plasma immersion ion implantation method, or the like can be used.

With an oxide semiconductor layer which includes low-resistance regions between which a channel formation region is sandwiched in the channel length direction, the transistor has excellent on-state characteristics (e.g., on-state current and field-effect mobility) and enables high-speed operation and high-speed response.

Further, after the oxide semiconductor layer is formed, cleaning treatment for removing impurities attached to the oxide semiconductor layer is performed. This cleaning treatment is preferably performed before the gate insulating layer is formed. An alkaline solution such as a tetramethylammonium hydroxide (TMAH) solution, an acidic solution such as a diluted hydrofluoric acid solution or an oxalic acid solution, or water can be used.

By performing cleaning treatment, a highly reliable transistor with stable electric characteristics can be achieved.

One embodiment of the present invention is a semiconductor device including the following components: an oxide semiconductor layer which includes a channel formation region and is provided over an oxide insulating layer; a gate insulating layer over the oxide semiconductor layer; a stacked layer of a gate electrode layer and an insulating layer over the gate insulating layer; sidewall insulating layers covering side surfaces of the gate electrode layer and side surfaces of the insulating layer; a source electrode layer and a drain electrode layer in contact with the oxide semiconductor layer, side surfaces of the gate insulating layer, and side surfaces of the sidewall insulating layers; and an interlayer insulating layer over the source electrode layer and the drain electrode layer. In the semiconductor device, top surfaces of the source electrode layer and the drain electrode layer are located at lower positions than a top surface of the insulating layer, top surfaces of the sidewall insulating layers, and a top surface of the interlayer insulating layer. In addition, top surfaces of the source electrode layer and the drain electrode layer are located at higher positions than a top surface of the gate electrode layer. Further, in the oxide semiconductor layer, a region which does not overlap with the gate electrode layer (the region includes a portion overlapping with the gate insulating film) includes a dopant.

In addition, in the oxide semiconductor layer, a region which overlaps with neither the source electrode layer nor the drain electrode layer may have a higher oxygen concentration than a region overlapping with the source electrode layer or the drain electrode layer.

One embodiment of the present invention is a method for manufacturing a semiconductor device including the following steps of: forming an oxide insulating layer; forming an oxide semiconductor layer over the oxide insulating layer; forming an island-shaped oxide semiconductor layer by selectively etching a part of the oxide semiconductor layer; cleaning a top surface and a side surface of the island-shaped oxide semiconductor layer; forming a gate insulating layer over the island-shaped oxide semiconductor layer; stacking a gate electrode layer and an insulating layer over the gate insulating layer to overlap with the island-shaped oxide semiconductor layer; introducing a dopant to a part of the island-shaped oxide semiconductor layer with use of the gate electrode layer and the insulating layer as a mask; forming a sidewall insulating layer over the gate insulating layer to cover a side surface of the gate electrode layer and a side surface of the insulating layer; forming a conductive layer over the island-shaped oxide semiconductor layer, the gate insulating layer, the gate electrode layer, the insulating layer, and the sidewall insulating layer; forming an interlayer insulating layer over the conductive layer; and forming a source electrode layer and a drain electrode layer by dividing the conductive layer by removing a part of the interlayer insulating layer and a part of the conductive layer with a chemical mechanical polishing method until the insulating layer over the gate electrode layer is exposed.

In addition, heat treatment (dehydration or dehydrogenation treatment) for releasing hydrogen or moisture may be performed on the oxide semiconductor layer. When a crystalline oxide semiconductor layer is used as the oxide semiconductor layer, heat treatment for crystallization may be performed.

In addition, oxygen may be supplied to the oxide semiconductor layer. By the dehydration or dehydrogenation treatment, oxygen which is a main constituent material of an oxide semiconductor may also be released and reduced. There is an oxygen vacancy in a portion in the oxide semiconductor layer, from which oxygen is released, and the oxygen vacancy causes a donor level which causes a variation in the electrical characteristics of a transistor.

For example, an insulating layer including much (excessive) oxygen, which serves as an oxygen supply source, may be provided so as to be in contact with the oxide semiconductor layer, whereby oxygen can be supplied to the oxide semiconductor layer from the insulating film. In the above structure, heat treatment may be performed in the condition where at least part of the oxide semiconductor layer which has been subjected to the dehydration or dehydrogenation treatment and the insulating film containing much oxygen are in contact with each other, so that oxygen is supplied to the oxide semiconductor layer.

Alternatively, in order to supply the sufficient amount of oxygen to the oxide semiconductor layer to supersaturate the oxide semiconductor layer with oxygen, insulating layers (such as silicon oxide layer) containing excessive oxygen between which the oxide semiconductor layer is sandwiched may be provided to be in contact with the oxide semiconductor layer.

Further or alternatively, oxygen (which includes at least one of an oxygen radical, an oxygen atom, and an oxygen ion) may be introduced to the oxide semiconductor layer which has been subjected to dehydration or dehydrogenation treatment to supply oxygen to the oxide semiconductor layer. For the introduction of oxygen, an ion implantation method, an ion doping method, a plasma immersion ion implantation method, plasma treatment performed in an atmosphere containing oxygen, or the like can be employed.

Note that an oxide semiconductor which is highly purified (purified OS) by reduction of an impurities such as moisture or hydrogen can be made to be an i-type (intrinsic) oxide semiconductor or an oxide semiconductor extremely close to an i-type semiconductor (a substantially i-type oxide semiconductor) by being supplied with oxygen to reduce oxygen vacancies in the oxide semiconductor. A transistor including the i-type or substantially i-type oxide semiconductor in a semiconductor layer where a channel is formed has characteristics of a very small amount of off-state current. Specifically, the hydrogen concentration of the oxide semiconductor layer is lower than or equal to $5\times10^{19}$ atoms/cm$^3$, preferably lower than or equal to $5\times10^{18}$ atoms/cm$^3$, much preferably lower than or equal to $5\times10^{17}$ atoms/cm$^3$. Note that the above hydrogen concentration in the oxide semiconductor layer is measured by secondary ion mass spectrometry (SIMS).

In addition, the carrier density of the i-type or substantially i-type oxide semiconductor, which is measured by Hall effect measurement, is lower than $1\times10^{14}$/cm$^3$, preferably lower than $1\times10^{12}$/cm$^3$, further preferably lower than $1\times10^{11}$/cm$^3$. Furthermore, the band gap of the oxide semiconductor is 2 eV or more, preferably 2.5 eV or more, further preferably 3 eV or more. With use of the i-type or substantially i-type oxide semiconductor for a semiconductor layer where a channel is formed, the amount of off-state current of the transistor can be reduced.

Thus, oxygen is preferably supplied to the oxide semiconductor layer which has been subjected to the dehydration or dehydrogenation treatment. By supply of oxygen to the oxide semiconductor layer, oxygen vacancies in the oxide semiconductor layer can be filled.

Further, a blocking layer (such as an aluminum oxide layer) for suppressing release of oxygen from the oxide semiconductor layer is preferably provided so as to surround the oxide semiconductor layer and be provided on the outer side of the insulating layer containing excessive oxygen.

When the oxide semiconductor layer is surrounded by the insulating layer containing excessive oxygen or the blocking layer, the oxide semiconductor layer can have composition almost the same as the stoichiometric composition or be in a supersaturated state where the amount of contained oxygen exceeds the stoichiometric amount. For example, in the case where the oxide semiconductor layer includes an In—Ga—Zn-based oxide, an example of the stoichiometric composition is In:Ga:Zn:O=1:1:1:4 (atomic ratio). The atomic ratio of oxygen in the oxide semiconductor layer is 4 or 4 or more.

According to one embodiment of the present invention, a miniaturized transistor with less variation and favorable electric characteristics can be provided with high yield.

When cleaning treatment (impurity-removing treatment) is performed after the oxide semiconductor layer is formed, a highly reliable transistor with stable electric characteristics can be provided.

Further, also in a semiconductor device including the transistor, high performance, high reliability, and high productivity can be achieved.

DETAILED DESCRIPTION OF THE INVENTION

Figure 1A:
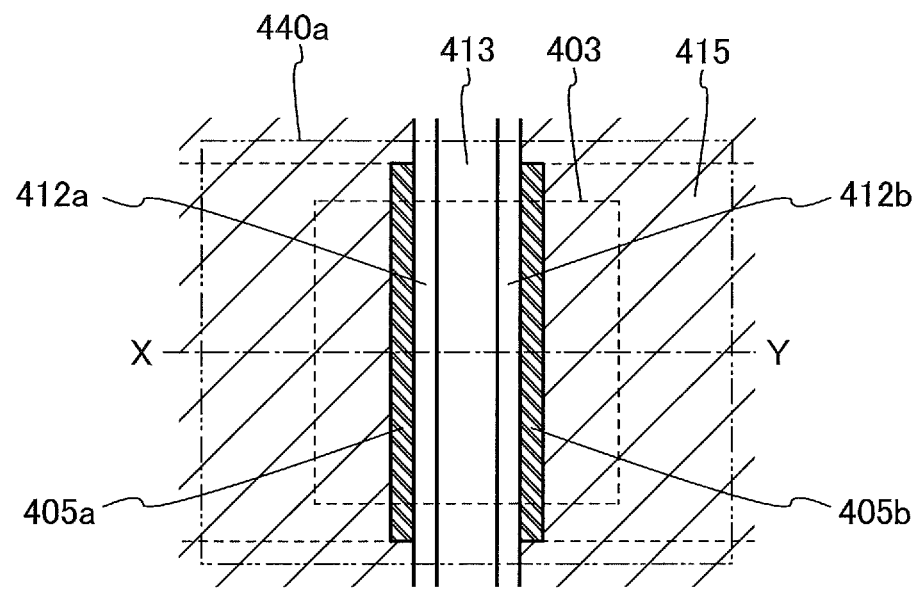
FIGS. 1A and 1B are a plan view and a cross-sectional view illustrating one embodiment of a semiconductor device.

Embodiments will be described in detail with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

In addition, in this specification and the like, ordinal numbers such as "first", "second", and "third" are used in order to avoid confusion among components, and the terms do not limit the components numerically.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

(Embodiment 1)

In this embodiment, one embodiment of a semiconductor device and a method for manufacturing the semiconductor device will be described with reference to FIGS. 1A and 1B. In this embodiment, a transistor including an oxide semiconductor layer is shown as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual gate structure including two gate electrode layers positioned over and below a channel region with a gate insulating layer provided therebetween.

Figure 1B:
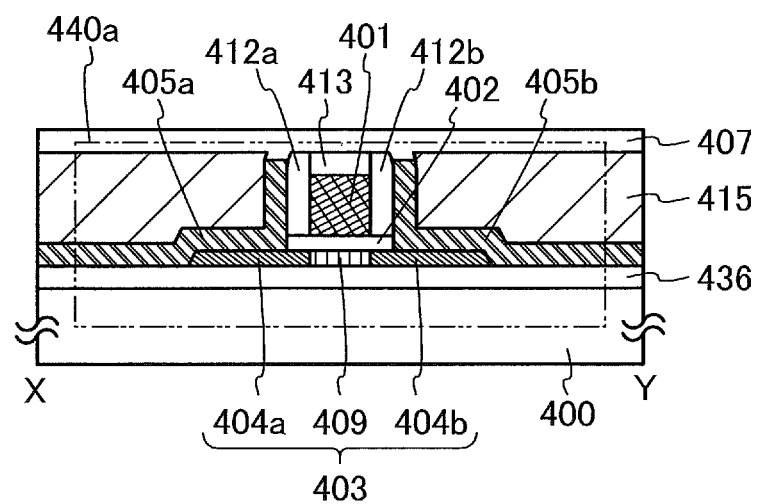

A transistor 440a illustrated in FIGS. 1A and 1B is an example of a top-gate transistor. FIG. 1A is a plan view and FIG. 1B is a cross-sectional view along dashed line X-Y in FIG. 1A.

As illustrated in FIG. 1B, which is a cross-sectional view in the channel length direction, a semiconductor device including the transistor 440a includes, over a substrate 400 having an insulating surface over which an oxide insulating layer 436 is provided, an oxide semiconductor layer 403 including a channel formation region 409 and low-resistance regions 404a and 404b, a source electrode layer 405a, a drain electrode layer 405b, a gate insulating layer 402, a gate electrode layer 401, sidewall insulating layers 412a and 412b provided on side surfaces of the gate electrode layer 401, an insulating layer 413 over the gate electrode layer 401, an interlayer insulating layer 415 over the source electrode layer 405a and the drain electrode layer 405b, and an insulating layer 407 covering the transistor 440a. Note that in FIG. 1A, the insulating layer 407 and the oxide insulating layer 436 are omitted for easy understanding.

The interlayer insulating layer 415 is provided for planarizing unevenness due to the transistor 440a. The height of a top surface of the interlayer insulating layer 415 (here, the "height of a top surface of the interlayer insulating layer 415" means a perpendicular distance from a surface of the substrate 400 to a top surface of the interlayer insulating layer 415) is substantially the same as that of each top surface of the sidewall insulating layers 412a and 412b and the insulating layer 413. Further, the height of each top surface of the source electrode layer 405a and the drain electrode layer 405b is lower than that of each top surface of the interlayer insulating layer 415, the sidewall insulating layers 412a and 412b, and the insulating layer 413, and higher than that of a top surface of the gate electrode layer 401.

Further, in FIGS. 1A and 1B, the insulating layer 407 is provided in contact with the interlayer insulating layer 415, the source electrode layer 405a, the drain electrode layer 405b, the sidewall insulating layers 412a and 412b, and the insulating layer 413.

The low-resistance regions 404a and 404b in the oxide semiconductor layer 403 are formed by a self-aligned process. Specifically, a dopant is introduced into the oxide semiconductor layer 403 with use of the gate electrode layer 401 as a mask, so that the low-resistance regions 404a and 404b including the dopant are formed in the oxide semiconductor layer 403. In the oxide semiconductor layer 403, the dopant is not introduced into a region overlapping with the gate electrode layer 401, and such a region becomes the channel formation region 409. The low-resistance regions 404a and 404b including the dopant have lower resistance than the channel formation region 409.

The dopant is an impurity which changes the conductivity of the oxide semiconductor layer 403. As the method for introducing the dopant, an ion implantation method, an ion doping method, a plasma immersion ion implantation method, or the like can be used.

With the oxide semiconductor layer 403 including the low-resistance regions 404a and 404b between which the channel formation region 409 is provided in the channel length direction, on-state characteristics (e.g., on-state current and field-effect mobility) of the transistor 440a are increased, which enables high-speed operation and high-speed response of the transistor.

An oxide semiconductor to be used for the oxide semiconductor layer 403 preferably contains at least indium (In) or zinc (Zn). In particular, In and Zn are preferably contained. In addition, as a stabilizer for reducing the variation in electric characteristics of a transistor using the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, the following oxide semiconductor can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn—O-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Still alternatively, a material represented by $In_2SnO_5(ZnO)_n$ (n>0 is satisfied, and n is an integer) may be used as an oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the semiconductor oxide is not limited to the materials given above, but a material with an appropriate composition may be used depending on needed semiconductor characteristics (e.g., mobility, threshold voltage, and variation). In order to obtain the required semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, mobility can be increased by reducing the defect density in a bulk also in the case of using an In—Ga—Zn-based oxide.

For example, the case where the composition of an oxide having an atomic ratio where In:Ga:Zn=a:b:c (a+b+c=1) is in the neighborhood of the composition of an oxide having an atomic ratio where In:Ga:Zn=A:B:C (A+B+C=1) means that a, b, and c satisfy the following relation: $(a-A)^2+(b-B)^2+(c-C)^2 \leq r^2$, and r may be 0.05, for example. The same applies to other oxides.

The oxide semiconductor is in a single crystal state, a polycrystalline (also referred to as polycrystal) state, an amorphous state, or the like.

The oxide semiconductor is preferably a c-axis aligned crystalline oxide semiconductor (CAAC-OS).

The CAAC-OS is not completely single crystal or completely amorphous. The CAAC-OS is an oxide semiconductor with a crystal-amorphous mixed phase structure where crystal portions are included in an amorphous phase. Note that in most cases, the crystal part fits inside a cube whose one side is less than 100 nm. From an observation image obtained with a transmission electron microscope (TEM), a boundary between an amorphous portion and a crystal portion in the CAAC-OS is not clear. Further, with the TEM, a grain boundary in the CAAC-OS is not found. Thus, in the CAAC-OS, a reduction in electron mobility, due to the grain boundary, is suppressed.

In the crystal portion included in the CAAC-OS, the c-axes are aligned in a direction perpendicular to a surface where the CAAC-OS is formed or a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal portion may be different from those of another crystal portion. In this specification, a simple term "perpendicular" includes a range from 85° to 95°.

In the CAAC-OS, distribution of crystal portions is not necessarily uniform. For example, in the formation process of the CAAC-OS, in the case where crystal growth occurs from a surface side of the oxide semiconductor layer, the proportion of crystal portions in the vicinity of the surface of the oxide semiconductor layer is higher than that in the vicinity of the surface where the oxide semiconductor layer is formed in some cases. Further, when an impurity is added to the CAAC-OS, the crystal portion in a region to which the impurity is added becomes amorphous in some cases.

Since the c-axes of the crystal portions included in the CAAC-OS film are aligned in the direction perpendicular to the surface where the CAAC-OS film is formed or a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). The direction of c-axis of the crystal portion is the direction perpendicular to the surface where the CAAC-OS is formed or the surface of the CAAC-OS. The crystal portion is formed by film formation or by performing treatment for crystallization such as heat treatment after film formation.

With use of the CAAC-OS in a transistor, a change in electric characteristics of the transistor due to irradiation with visible light or ultraviolet light is small. Thus, the transistor has high reliability.

Note that part of oxygen included in the oxide semiconductor layer may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

Note that, $R_a$ is obtained by three-dimension expansion of arithmetic mean deviation so as to be able to apply it to a plane. The $R_a$ can be expressed as an "average value of the absolute values of deviations from a reference surface to a specific surface" and is defined by the formula below.

$$Ra = \frac{1}{S_0}\int_{y_1}^{y_2}\int_{x_1}^{x_2} |f(x, y) - Z_0| dx dy \quad \text{[FORMULA 1]}$$

Here, the specific surface is a surface that is a target of roughness measurement, and is a quadrilateral region specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Moreover, $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

The oxide semiconductor layer has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulsed laser deposition method, an atomic layer deposition (ALD) method, or the like as appropriate. The oxide semiconductor layer 403 may be formed with a sputtering apparatus which performs deposition in the state where top surfaces of a plurality of substrates are substantially perpendicular to a top surface of a sputtering target.

An example of a method for manufacturing a semiconductor device including the transistor 440a is described with reference to FIGS. 2A to 2D and FIGS. 3A to 3D.

First, over the substrate 400, the oxide insulating layer 436 is formed.

There is no particular limitation on a substrate that can be used as the substrate 400 as long as it has heat resistance high enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate made of silicon, silicon carbide, or the like; a compound semiconductor substrate made of silicon germanium or the like; an SOI substrate; or the like can be used as the substrate 400, or the substrate provided with a semiconductor element can be used as the substrate 400.

The semiconductor device may be manufactured using a flexible substrate as the substrate 400. To manufacture a flexible semiconductor device, the transistor 440a including the oxide semiconductor layer 403 may be directly formed over a flexible substrate; or alternatively, the transistor 440a including the oxide semiconductor layer 403 may be formed over a substrate, and then may be separated and transferred to a flexible substrate. Note that in order to separate the transistor 440a from the manufacturing substrate and transfer it to the flexible substrate, a separation layer may be provided between the manufacturing substrate and the transistor 440a including the oxide semiconductor layer 403.

The oxide insulating layer 436 can be formed by a plasma CVD method, a sputtering method, or the like using any of silicon oxide, silicon oxynitride, aluminum oxide, aluminum oxynitride, hafnium oxide, and gallium oxide, or a mixed material thereof.

As the oxide insulating layer 436, a thermal oxidation film may be used. The thermal oxidation film can be formed in the following manner: a substrate is subjected to heat treatment in an oxidation atmosphere, so that a surface of the substrate is oxidized. For example, a single crystal silicon substrate is used as the substrate 400, and heat treatment is performed at 900° C. to 1200° C. in an atmosphere containing oxygen or water vapor for several hours, whereby a thermal oxidation film can be formed on a surface of the substrate 400.

The oxide insulating layer 436 may be either a single layer or a stacked layer. For example, a silicon oxide layer, an In—Hf—Zn-based oxide layer, and the oxide semiconductor layer 403 may be stacked in that order over the substrate 400; a silicon oxide layer, an In—Zr—Zn-based oxide layer where In:Zr:Zn=1:1:1 (atomic ratio), and the oxide semiconductor layer 403 may be stacked in that order over the substrate 400; or a silicon oxide layer, an In—Gd—Zn-based oxide film where In:Gd:Zn=1:1:1 (atomic ratio), and the oxide semiconductor layer 403 may be stacked in that order over the substrate 400.

Further, a nitride insulating layer may be provided between the oxide insulating layer 436 and the substrate 400. The nitride insulating layer can be formed by a plasma CVD method, a sputtering method, or the like with use of silicon nitride, silicon nitride oxide, aluminum nitride, or aluminum nitride oxide, or a mixed material of any of these materials.

In this embodiment, a single crystal silicon substrate is used as the substrate 400, and a 300-nm-thick silicon oxide film is formed as the oxide insulating layer 436 by a sputtering method over the substrate 400.

Figure 2A:
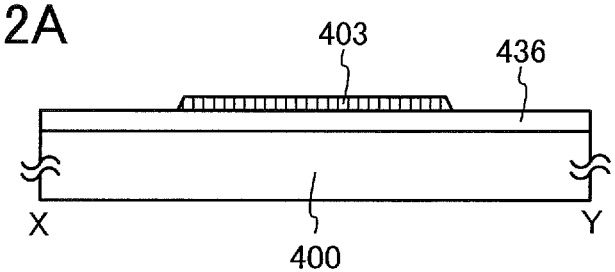
FIGS. 2A to 2D are cross-sectional views illustrating one embodiment of a method for manufacturing a semiconductor device.

Next, the oxide semiconductor layer 403 is formed over the oxide insulating layer 436 (see FIG. 2A).

The oxide insulating layer 436, which is in contact with the oxide semiconductor layer 403, preferably contains a large amount of oxygen which exceeds at least the stoichiometric amount of oxygen in the layer (bulk). For example, in the case where a silicon oxide film is used as the oxide insulating layer 436, the composition formula is $SiO_{2+\alpha}$ ($\alpha>0$). By using such a film as the oxide insulating layer 436, oxygen can be supplied to the oxide semiconductor layer 403, leading to favorable characteristics. By supply of oxygen to the oxide semiconductor layer 403, oxygen vacancies in the layer can be filled.

For example, when the oxide insulating layer 436 containing much (excessive) oxygen, which serves as an oxygen supply source, is provided so as to be in contact with the oxide semiconductor layer 403, oxygen can be supplied from the oxide insulating layer 436 to the oxide semiconductor layer 403. Heat treatment may be performed in the state where the oxide semiconductor layer 403 and the oxide insulating layer 436 are in contact with each other at least partly to supply oxygen to the oxide semiconductor layer 403.

Oxygen (including at least one of oxygen radicals, oxygen atoms, and oxygen ions) may be introduced into the oxide insulating layer 436 so that the oxide insulating layer 436 is in an oxygen excess state. For the introduction of oxygen, an ion implantation method, an ion doping method, a plasma immersion ion implantation method, plasma treatment performed in an atmosphere containing oxygen, or the like can be employed. In the case of performing plasma treatment in an atmosphere containing oxygen, an ashing apparatus can be used, for example.

In order that hydrogen or water will be not contained in the oxide semiconductor layer 403 as much as possible in the formation step of the oxide semiconductor layer 403, it is preferable to heat the substrate provided with the oxide insulating layer 436 in a preheating chamber of a sputtering apparatus as a pretreatment for formation of the oxide semiconductor layer 403 so that impurities such as hydrogen and moisture adsorbed to the substrate and/or the oxide insulating layer 436 are eliminated and evacuated. As an evacuation unit provided in the preheating chamber, a cryopump is preferable.

Therefore, planarization treatment may be performed on the region of the oxide insulating layer 436 which is to be in contact with the oxide semiconductor layer 403. As the planarization treatment, polishing treatment (e.g., a chemical mechanical polishing method), dry-etching treatment, or plasma treatment can be used, though there is no particular limitation on the planarization treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the top surface of the oxide insulating layer 436.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the oxide insulating layer 436.

Planarization treatment may be performed on a surface of the silicon oxide film used as the oxide insulating layer 436 by a chemical mechanical polishing method (the polishing conditions: a polyurethane-based polishing cloth, silica-based slurry, a slurry temperature of room temperature, a polishing pressure of 0.001 MPa, a rotation number in polishing (table/spindle) of 60 rpm/56 rpm, and a polishing time of 0.5 minutes) so that the average surface roughness (Ra) of the surface of the silicon oxide film is preferably approximately 0.15 nm.

The oxide semiconductor layer 403 is preferably deposited under a condition such that much oxygen is contained (for example, by a sputtering method in an atmosphere where the proportion of oxygen is 100%) so as to be a film containing much oxygen (preferably the film including a region containing excessive oxygen as compared to the stoichiometric composition of the oxide semiconductor in a crystalline state).

It is preferable that the oxide semiconductor layer 403 be highly purified so as to hardly contain impurities such as copper, aluminum, or chlorine. In a process for manufacturing a transistor, a step which has no risk that such impurities enter the oxide semiconductor layer or adhere to the surface of the oxide semiconductor layer is preferably selected as appropriate. Specifically, the concentration of copper in the oxide semiconductor layer 403 is lower than or equal to $1\times10^{18}$ atoms/cm$^3$, preferably lower than or equal to $1\times10^{17}$ atoms/cm$^3$. Further, the concentration of aluminum in the oxide semiconductor layer 403 is lower than or equal to $1\times10^{18}$ atoms/cm$^3$. Further, the concentration of chlorine in the oxide semiconductor layer 403 is lower than or equal to $2\times10^{18}$ atoms/cm$^3$.

Further, the oxide semiconductor layer 403 immediately after being formed is preferably in such a supersaturated state where the amount of contained oxygen exceeds the stoichiometric amount. For example, in the case where the oxide semiconductor layer 403 is formed by a sputtering method, deposition is preferably performed under such a condition that the ratio of oxygen to a deposition gas is high. In particular, deposition is preferably performed in an oxygen atmosphere (100% oxygen gas). When deposition is performed under such a condition that the ratio of oxygen to a deposition gas is high, particularly in an atmosphere containing oxygen at 100%, a release of Zn from the film can be suppressed at a deposition temperature even higher than or equal to 300° C.

Note that in this embodiment, as a target for forming the oxide semiconductor layer 403 by a sputtering method, an oxide target whose composition is In, Ga, and Zn (=3:1:2 [atomic ratio]) is used to form an In—Ga—Zn-based oxide film (IGZO film).

The relative density (the fill rate) of the metal oxide target is 90% to 100% inclusive, preferably 95% to 99.9% inclusive. By using the metal oxide target with high relative density, a dense oxide semiconductor layer 403 can be formed.

It is preferable to use a high-purity gas from which impurities such as hydrogen, water, a hydroxyl group, or a hydride are removed as a sputtering gas used when the oxide semiconductor layer 403 is formed.

The substrate is held in a deposition chamber kept under reduced pressure. Then, a sputtering gas from which hydrogen and moisture are removed is introduced while residual moisture in the deposition chamber is removed, and the oxide semiconductor layer 403 is formed over the substrate 400 using the above target. In order to remove moisture remaining in the deposition chamber, an entrapment vacuum pump such as a cryopump, an ion pump, or a titanium sublimation pump is preferably used. As an evacuation unit, a turbo molecular pump to which a cold trap is added may be used. In the deposition chamber which is evacuated with a cryopump, a hydrogen atom, a compound containing a hydrogen atom such as water ($H_2O$) (more preferably, also a compound containing a carbon atom), and the like are removed, whereby the impurity concentration in the oxide semiconductor layer 403 formed in the deposition chamber can be reduced.

The concentrations of alkali metals such as sodium (Na), lithium (Li), and potassium (K) in the oxide semiconductor layer 403 are as follows. The concentration of Na is lower than or equal to $5\times10^{16}$ $cm^{-3}$, preferably lower than or equal to $1\times10^{16}$ $cm^{-3}$, further preferably lower than or equal to $1\times10^{15}$ $cm^{-3}$. The concentration of Li is lower than or equal to $5\times10^{15}$ $cm^{-3}$, preferably lower than or equal to $1\times10^{15}$ $cm^{-3}$. The concentration of K is lower than or equal to $5\times10^{15}$ $cm^{-3}$, preferably lower than or equal to $1\times10^{15}$ $cm^{-3}$.

The oxide insulating layer 436 and the oxide semiconductor layer 403 are preferably formed in succession without exposure to air. By successive formation of the oxide insulating layer 436 and the oxide semiconductor layer 403 without exposure to air, impurities such as hydrogen and moisture can be prevented from being adsorbed onto a surface of the oxide insulating layer 436.

The oxide semiconductor layer 403 can be formed by processing an oxide semiconductor film into an island shape by a photolithography step.

Note that unless otherwise specified, a photolithography step in this specification includes a step of forming a resist mask, a step of etching a conductive layer or an insulating layer, and a step of removing the resist mask.

A resist mask used for forming the island-shaped oxide semiconductor layer 403 may be formed by an inkjet method. Formation of the resist mask by an inkjet method needs no photomask; thus, manufacturing cost can be reduced.

Note that the etching of the oxide semiconductor layer here may be performed by either one or both a dry etching method and a wet etching method. As an etchant used for wet etching of the oxide semiconductor layer, for example, a mixed solution of phosphoric acid, acetic acid, and nitric acid, or the like can be used. Alternatively, ITO-07N (produced by KANTO CHEMICAL CO., INC.) may be used.

In order to form a minute pattern, a dry etching method which can conduct anisotropic etching is preferably used. As an example of the dry etching method, an ICP (Inductively Coupled Plasma) etching method can be used. For example, an oxide semiconductor layer is etched by the ICP etching method (the etching conditions: an etching gas of $BCl_3$ and $Cl_2$ ($BCl_3$:$Cl_2$=60 sccm:20 sccm), a power of 450 W, a bias power of 100 W, and a pressure of 1.9 Pa), so that the oxide semiconductor layer is processed into an island shape.

Further, in the case where the oxide semiconductor layer is etched by a dry etching method to form the island-shaped oxide semiconductor layer 403, an etching gas or an element left in the treatment chamber may be attached as impurities to a peripheral portion of the island-shaped oxide semiconductor layer 403, which is not covered with the resist mask.

When the impurities are attached to the oxide semiconductor layer 403, deterioration in electric characteristics of a transistor, such as an increase in off-state current, a change in threshold voltage, and an increase of variation in threshold voltages, are likely to be caused. In addition, a parasitic channel is likely to be generated in the oxide semiconductor layer 403, electrodes which should be electrically isolated might be electrically connected through the oxide semiconductor layer 403.

Depending on kinds of impurities, the impurity may enter the oxide semiconductor layer 403 in the vicinity of a surface thereof and extracts oxygen in the oxide semiconductor layer 403, whereby oxygen vacancies may be formed in the oxide semiconductor layer 403. For example, chlorine and boron contained in the etching gas or aluminum that is one of constituent materials of the treatment chamber may serve as a factor of lowering resistance of the oxide semiconductor layer 403 (making an n-type oxide semiconductor layer).

Thus, in one embodiment of the present invention, after the etching step for forming the island-shaped oxide semiconductor layer 403 is performed, cleaning treatment for removing impurities attached to the oxide semiconductor layer 403 (impurity-removing treatment) is performed.

Note that the impurity-removing treatment is preferably performed just before formation of a gate insulating layer 442, which is performed after formation of the oxide semiconductor layer 403. When the impurity-removing treatment is performed just before formation of the gate insulating layer 442, the impurity element on the top surface and side surfaces of the oxide semiconductor layer 403, which has been attached after the removal of the resist mask, can be removed, so that the state of an interface between the oxide semiconductor layer 403 and the gate insulating layer 442 can be favorable.

By performing cleaning treatment (impurity-removing treatment) before formation of the gate insulating layer 442, a highly reliable transistor with less variation in characteristics and stable electric characteristics can be provided.

The impurity-removing treatment is cleaning treatment with use of a solution. The cleaning treatment with a solution can be performed using an alkaline solution such as a tetramethylammonium hydroxide (TMAH) solution, an acidic solution such as a diluted hydrofluoric acid solution or an oxalic acid solution, or water. For example, in the case where a diluted hydrofluoric acid solution is used, 50 wt % hydrofluoric acid is diluted with water 100 times to 100000 times, preferably 1000 times to 100000 times. In other words, a diluted hydrofluoric acid solution in which the concentration of hydrofluoric acid is 0.5 wt % to $5\times10^{-4}$ wt %, preferably $5\times10^{-2}$ wt % to $5\times10^{-4}$ wt % is preferably used for cleaning treatment. By the cleaning treatment, the impurities attached to the oxide semiconductor layer 403 can be removed. Note that as a solution containing oxalic acid, ITO-07N (produced by KANTO CHEMICAL CO., INC.) may be used.

Further, in the case where the impurity-removing treatment is performed with use of a diluted hydrofluoric acid solution, the top surface and side surfaces of the oxide semiconductor layer 403 can be etched. In other words, together with part of the oxide semiconductor layer 403, the impurities attached to the top surface and side surfaces of the oxide semiconductor layer 403 and the impurities taken into the oxide semiconductor layer 403 in the vicinity of the top surface and side surface thereof can be removed. Furthermore, defect portions generated on the top surface and side surfaces of the oxide semiconductor layer 403 can be removed.

As a result of the impurity-removing treatment, the following peak values (maximum values) of concentrations of chlorine, boron, and aluminum can be obtained at the surface of the insulating layer and the surface of the oxide semiconductor layer by SIMS analysis. The chlorine concentration can be $1 \times 10^{19}/cm^3$ or lower (preferably, $5 \times 10^{18}/cm^3$ or lower, further preferably $2 \times 10^{18}/cm^3$ or lower). The boron concentration can be $1 \times 10^{19}/cm^3$ or lower (preferably, $5 \times 10^{18}/cm^3$ or lower, further preferably $2 \times 10^{18}/cm^3$ or lower). The aluminum concentration can be $1 \times 10^{19}/cm^3$ or lower (preferably, $5 \times 10^{18}/cm^3$ or lower, further preferably $2 \times 10^{18}/cm^3$ or lower).

Further, heat treatment may be performed on the oxide semiconductor layer 403 in order to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, or in a nitrogen atmosphere, or the like. For example, the substrate is put in an electric furnace which is a kind of heat treatment apparatus, and the oxide semiconductor layer 403 is subjected to the heat treatment at 450° C. for one hour in a nitrogen atmosphere.

Further, an apparatus used for this heat treatment is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Note that in this heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, much preferably 7N (99.99999%) or higher (that is, the impurity concentration is preferably 1 ppm or lower, much preferably 0.1 ppm or lower).

In addition, after the oxide semiconductor layer 403 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the dinitrogen monoxide gas acts to supply oxygen that is a main component of the oxide semiconductor and that is reduced by the step for removing an impurity for the dehydration or dehydrogenation, so that the oxide semiconductor layer 403 can be a high-purified, i-type (intrinsic) oxide semiconductor.

The timing of performing heat treatment for dehydration or dehydrogenation may be either before or after the island-shaped oxide semiconductor layer 403 is formed as long as it is after formation of the oxide semiconductor layer. The heat treatment for dehydration or dehydrogenation may be performed plural times and may be combined with another heat treatment.

The heat treatment for dehydration or dehydrogenation is preferably performed in such a condition that the oxide insulating layer 436 is covered with a film of an oxide semiconductor which has not been processed into the island-shaped oxide semiconductor layer 403; accordingly, oxygen contained in the oxide insulating layer 436 can be prevented from being released by the heat treatment.

Through the dehydration or dehydrogenation treatment, oxygen that is a main constituent material of an oxide semiconductor might be eliminated and thus might be reduced. There is an oxygen vacancy in a portion in the oxide semiconductor layer, from which oxygen is removed, and the oxygen vacancy causes a donor level which causes a variation in the electrical characteristics of a transistor.

Thus, oxygen (which includes at least one of oxygen radicals, oxygen atoms, and oxygen ions) may be added to the oxide semiconductor layer 403 which has been subjected to the dehydration or dehydrogenation treatment, so that oxygen is supplied to the oxide semiconductor layer.

Introduction (supply) of oxygen to the dehydrated or dehydrogenated oxide semiconductor layer 403 enables the oxide semiconductor layer 403 to be highly purified and to be i-type (intrinsic). Variation in electric characteristics of a transistor including the highly-purified and i-type (intrinsic) oxide semiconductor layer 403 is suppressed, and the transistor is electrically stable.

For the introduction of oxygen, an ion implantation method, an ion doping method, a plasma immersion ion implantation method, plasma treatment performed in an atmosphere containing oxygen, or the like can be employed.

In the step of introducing oxygen to the oxide semiconductor layer 403, oxygen may be directly added to the oxide semiconductor layer 403 or added to the oxide semiconductor layer 403 through another film. An ion implantation method, an ion doping method, a plasma immersion ion implantation method, or the like may be employed for the addition of oxygen through another film, whereas plasma treatment performed in an oxygen atmosphere or the like can also be employed for the addition of oxygen directly into an exposed oxide semiconductor layer 403.

The preferable timing of introducing oxygen into the oxide semiconductor layer 403 is after the dehydration or dehydrogenation treatment but not limited thereto. Further, oxygen may be added plural times into the dehydrated or dehydrogenated oxide semiconductor layer 403.

As described above, it is preferable that the oxide semiconductor layer 403 be highly purified by removing impurities such as hydrogen and be an i-type (intrinsic) or substantially i-type (intrinsic) oxide semiconductor layer which is supersaturated with oxygen by supplying oxygen sufficiently thereto. Specifically, the hydrogen concentration of the oxide semiconductor layer is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$. Further, in order to supply the sufficient amount of oxygen to the oxide semiconductor layer to supersaturate the oxide semiconductor layer with oxygen, insulating layers (such as silicon oxide layer) containing excessive oxygen between which the oxide semiconductor layer is sandwiched are provided to be in contact with and surround the oxide semiconductor layer.

Further, the hydrogen concentration in the insulating layer containing excessive oxygen is important, because it affects characteristics of a transistor. Further, in the case where the hydrogen concentration in the insulating layer containing excessive oxygen is higher than or equal to $7.2 \times 10^{20}$ atoms/cm$^3$, variation in initial characteristics of the transistor is increased, a channel length dependence of electric characteristics of the transistor is increased, and the transistor is significantly deteriorated through the BT stress test; therefore, the hydrogen concentration in the insulating layer containing excessive oxygen is preferably lower than $7.2 \times 10^{20}$ atoms/cm$^3$. In other words, the hydrogen concentration in the oxide semiconductor layer is preferably lower than or equal to $5 \times 10^{19}$ atoms/cm$^3$, and the hydrogen concentration in the insulating layer containing excessive oxygen is preferably lower than $7.2 \times 10^{20}$ atoms/cm$^3$.

Figure 2B:
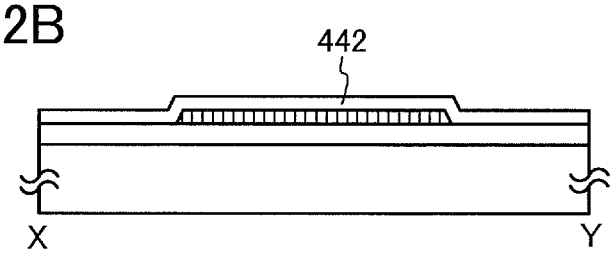

Next, the gate insulating layer 442 is formed to cover the oxide semiconductor layer 403 (see FIG. 2B).

Note that in order to improve coverage with the gate insulating layer 442, the surface of the oxide semiconductor layer 403 may also be subjected to the above-described planarization treatment. In particular, in the case where a thin insulating layer is used as the gate insulating layer 442, it is preferable that the oxide semiconductor layer 403 have improved surface flatness.

The gate insulating layer 442 can be formed to have a thickness greater than or equal to 1 nm and less than or equal to 20 nm by a sputtering method, an MBE method, a CVD method, a pulse laser deposition method, an ALD method, or the like as appropriate. The gate insulating layer 442 may also be formed with use of a sputtering apparatus which performs film deposition with surfaces of a plurality of substrates set substantially perpendicular to a top surface of a sputtering target.

As a material of the gate insulating layer 442, for example, silicon oxide, gallium oxide, aluminum oxide, silicon nitride, silicon oxynitride, aluminum oxynitride, silicon nitride oxide, or the like can be used. It is preferable that the gate insulating layer 442 include oxygen in a portion which is in contact with the oxide semiconductor layer 403. In particular, the gate insulating layer 442 preferably contains a large amount of oxygen which exceeds at least the stoichiometric amount of oxygen in the layer (bulk). For example, in the case where a silicon oxide film is used as the gate insulating layer 442, the composition formula is $SiO_{2+\alpha}$ ($\alpha > 0$). In this embodiment, a silicon oxide film of $SiO_{2+\alpha}$ ($\alpha > 0$) is used as the gate insulating layer 442. By using the silicon oxide film as the gate insulating layer 442, oxygen can be supplied to the oxide semiconductor layer 403, leading to good characteristics. Further, the gate insulating layer 442 is preferably formed in consideration of the size of a transistor and the step coverage with the gate insulating layer 442.

Before the gate insulating layer 442 is formed, impurities such as moisture or organic substances attached on the top surface and side surfaces of the oxide semiconductor layer 403 are preferably removed by plasma treatment using oxygen, dinitrogen monoxide, or a rare gas (typically, argon), or the like.

The gate insulating layer 442 can be formed using a high-k material such as hafnium oxide, yttrium oxide, hafnium silicate ($HfSi_xO_y$, ($x>0$, $y>0$)), hafnium silicate to which nitrogen is added ($HfSiO_xN_y$, ($x>0$, $y>0$)), hafnium aluminate ($HfAl_xO_y$, ($x>0$, $y>0$)), or lanthanum oxide, whereby gate leakage current can be reduced. Further, the gate insulating layer 442 has either a single-layer structure or a stacked-layer structure.

After formation of the gate insulating layer 442, oxygen (including at least one of oxygen radicals, oxygen atoms, and oxygen ions) may be introduced into the gate insulating layer 442 so that the gate insulating layer 442 is in an oxygen excess state. For the introduction of oxygen, an ion implantation method, an ion doping method, a plasma immersion ion implantation method, plasma treatment performed in an atmosphere containing oxygen, or the like can be employed.

Figure 2C:
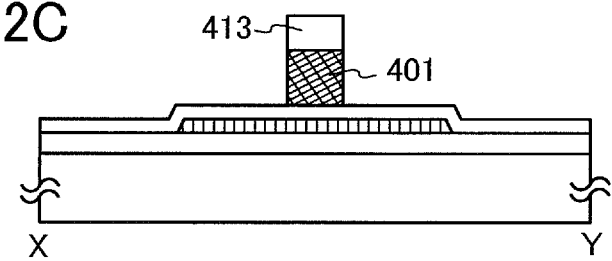

Next, a stacked layer of a conductive layer and an insulating layer is formed over the gate insulating layer 442, and part of the conductive layer and part of the insulating layer are selectively etched, so that a stacked layer of the gate electrode layer 401 and the insulating layer 413 is formed (see FIG. 2C).

The gate electrode layer 401 can be formed using a metal material such as molybdenum, titanium, tantalum, tungsten, aluminum, copper, chromium, neodymium, or scandium or an alloy material which contains any of these materials as its main component. Alternatively, a semiconductor layer typified by a polycrystalline silicon film doped with an impurity element such as phosphorus, or a silicide film such as a nickel silicide film may be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As one layer of the gate electrode layer 401 which is in contact with the gate insulating layer 442, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV (electron volts) or higher which enables the threshold voltage, which is one of electric characteristics of a transistor, to be positive when used as the gate electrode layer. Thus, a normally-off switching element can be achieved.

For the insulating layer 413, typically, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating layer 413 can be formed by a plasma CVD method, a sputtering method, or the like.

Figure 2D:
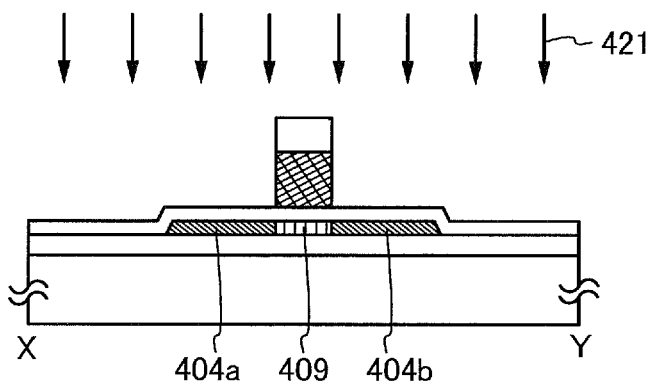

Next, a dopant 421 is introduced into the oxide semiconductor layer 403 with use of the gate electrode layer 401 and the insulating layer 413 as a mask, so that the low-resistance regions 404a and 404b are formed (see FIG. 2D).

The dopant 421 is an impurity by which the electrical conductivity of the oxide semiconductor layer 403 is changed. One or more selected from the following can be used as the dopant 421: Group 15 elements (typical examples thereof are nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn).

The dopant 421 can be introduced into the oxide semiconductor layer 403 through another film (e.g., the gate insulating layer 442) by an implantation method.

As the method for introducing the dopant 421, an ion implantation method, an ion doping method, a plasma immersion ion implantation method, or the like can be used. In that case, it is preferable to use a single ion of the dopant 421, or a fluoride ion or chloride ion thereof.

The introduction of the dopant 421 may be controlled by setting the addition conditions such as the accelerated voltage and the dosage, or the thickness of the films through which the dopant passes as appropriate. In this embodiment, phosphorus is used as the dopant 421, whose ion is added by an ion implantation method. Note that the dosage of the dopant 421 may be greater than or equal to $1\times10^{13}$ ions/cm$^2$ and less than or equal to $5\times10^{16}$ ions/cm$^2$.

The concentration of the dopant 421 in the low-resistance region is preferably higher than or equal to $5\times10^{18}$/cm$^3$ and lower than or equal to $1\times10^{22}$/cm$^3$.

The dopant 421 may be introduced while the substrate 400 is heated.

The introduction of the dopant 421 into the oxide semiconductor layer 403 may be performed plural times, and the number of kinds of dopant may be plural.

Further, heat treatment may be performed after the introduction of the dopant 421. The heat treatment is preferably performed at a temperature higher than or equal to 300° C. and lower than or equal to 700° C. (further preferably higher than or equal to 300° C. and lower than or equal to 450° C.) for one hour in an oxygen atmosphere. The heat treatment may be performed in a nitrogen atmosphere, or the air (ultra-dry air) or under reduced pressure.

In this embodiment, phosphorus (P) ions are implanted into the oxide semiconductor layer 403 by an ion implantation method. Note that the conditions of the phosphorus (P) ion implantation are as follows: the acceleration voltage is 30 kV and the dosage is $1.0\times10^{15}$ ions/cm$^2$.

When the oxide semiconductor layer 403 is a CAAC-OS film, part of the oxide semiconductor layer 403 may be amorphous due to the introduction of the dopant 421 in some cases. In that case, the crystallinity of the oxide semiconductor layer 403 can be recovered by performing heat treatment thereon after the introduction of the dopant 421.

Through a self-aligned process in which the gate electrode layer 401 and the insulating layer 413 are used as a mask when the dopant 421 is introduced as described above, the low-resistance regions 404a and 404b between which the channel formation region 409 is sandwiched are formed in the oxide semiconductor layer 403.

Next, an insulating layer is formed over the gate electrode layer 401 and the insulating layer 413, and the insulating layer is etched, so that the sidewall insulating layers 412a and 412b are formed. Further, the gate insulating layer 442 is etched with use of the gate electrode layer 401 and the sidewall insulating layers 412a and 412b as masks, so that the gate insulating layer 402 is formed (see FIG. 3A).

The sidewall insulating layers 412a and 412b can be formed using a material and a method similar to those of the insulating layer 413. In this embodiment, a silicon oxynitride film formed by a CVD method is used.

Next, a conductive layer 444 (not illustrated) for forming a source electrode layer and a drain electrode layer (including a wiring formed from the same layer as the source electrode layer and the drain electrode layer) is formed over the oxide semiconductor layer 403, the gate insulating layer 402, the gate electrode layer 401, the sidewall insulating layers 412a and 412b, and the insulating layer 413.

The conductive layer 444 is formed using a material that can withstand a heat treatment performed later. For the material used for the conductive layer 444, a metal containing an element selected from Al, Cr, Cu, Ta, Ti, Mo, and W, a metal nitride containing any of the above elements as a component (e.g., titanium nitride, molybdenum nitride, or tungsten nitride), or the like can be used, for example. Alternatively, a refractory metal film of Ti, Mo, W, or the like or a metal nitride film of any of these elements (a titanium nitride film, a molybdenum nitride film, or a tungsten nitride film) may be stacked on one of or both a lower side and an upper side of a metal layer of Al, Cu, or the like. Alternatively, the conductive layer 444 may be formed using conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO), indium oxide-zinc oxide ($In_2O_3$—ZnO), or any of these metal oxide in which silicon oxide is contained can be used.

A resist mask is formed over the conductive layer 444 by a photolithography step, and the conductive layer 444 is selectively etched, so that an island-shaped conductive layer 445 is formed. Note that in the above etching step, the conductive layer 445 over the gate electrode layer 401 is not removed.

In the case where a tungsten layer with a thickness of 30 nm is used as the conductive layer, part of the tungsten layer may be selectively etched (etching conditions: an etching gas of $CF_4$, $Cl_2$, and $O_2$ ($CF_4$: $Cl_2$: $O_2$=55 sccm: 45 sccm: 55 sccm); a power of 3000 W; a bias power of 140 W; and a pressure of 0.67 Pa), so that an island-shaped tungsten layer is formed.

Figure 3A:
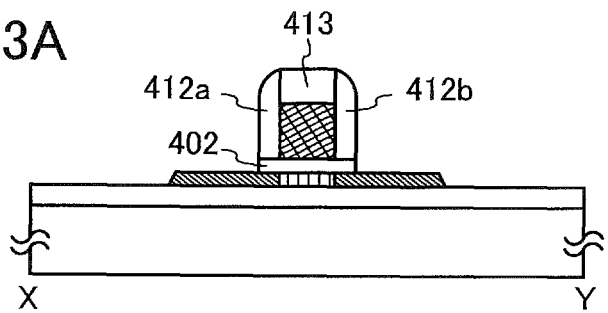
FIGS. 3A to 3D are cross-sectional views illustrating one embodiment of a method for manufacturing a semiconductor device.
Figure 3B:
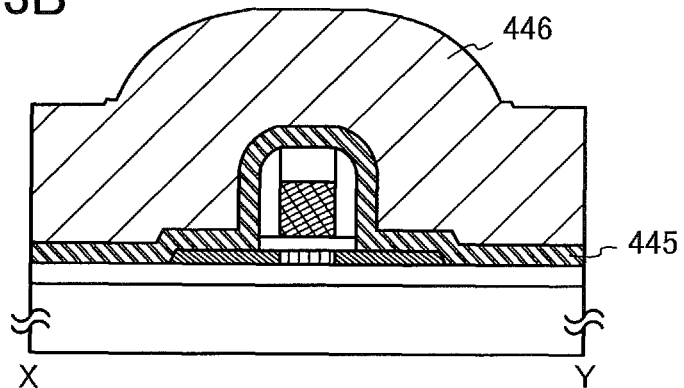

Next, an insulating layer 446 that is to be an interlayer insulating layer 415 is stacked over the island-shaped conductive layer 445 (see FIG. 3B).

The insulating layer 446 can be formed using a material and a method similar to those of the insulating layer 413. The insulating layer 446 is formed to such a thickness as to planarize unevenness caused by the layers formed over the substrate 400.

In this embodiment, a 300-nm-thick silicon oxynitride layer is formed by a CVD method.

Next, the insulating layer 446 and the conductive layer 445 are subjected to polishing treatment by a chemical mechanical polishing method, and parts of the insulating layer 446 and the conductive layer 445 are removed so that the insulating layer 413 is exposed.

By the polishing treatment, the insulating layer 446 is processed into the interlayer insulating layer 415, and the conductive layer 445 over the gate electrode layer 401 is removed, so that the source electrode layer 405a and the drain electrode layer 405b are formed.

Although the chemical mechanical polishing method is employed for removing the insulating layer 446 and the conductive layer 445 in this embodiment, a different cutting (grinding or polishing) method may be employed. Further, in addition to the cutting (grinding or polishing) method such as a chemical mechanical polishing method, etching (dry etching or wet etching), plasma treatment, or the like may be employed in combination for the step of removing the conductive layer 445 over the gate electrode layer 401. For example, after the removing step by a chemical mechanical polishing method, a dry etching method or plasma treatment (e.g., reverse sputtering method) may be performed in order to improve the planarity of a surface to be processed. In the case where a cutting (grinding or polishing) method is combined with etching, plasma treatment, or the like, the order of the steps is not limited and may be set as appropriate in accordance with the material, thickness, and surface unevenness of the insulating layer 446 and the conductive layer 445.

Note that in this embodiment, the source electrode layer 405a and the drain electrode layer 405b are provided in contact with side surfaces of the sidewall insulating layers 412a and 412b provided on side surfaces of the gate electrode layer 401, and the source electrode layer 405a and the drain electrode layer 405b each of which has a top end portion positioned a little lower than those of the sidewall insulating layers 412a and 412b cover the side surfaces of the sidewall insulating layers 412a and 412b. The shapes of the source electrode layer 405a and the drain electrode layer 405b depend on the conditions of the polishing treatment for removing the conductive layer 445, and in some cases, as shown in this embodiment, the source electrode layer 405a and the drain electrode layer 405b are depressed in the film thickness direction from the surfaces of the sidewall insulating layers 412a and 412b and the insulating layer 413 on which polishing treatment is performed. However, depending on the conditions of the polishing treatment, the height of each of the top ends of the source electrode layer 405a and the drain electrode layer 405b is almost equal to that of each of the top ends of the sidewall insulating layers 412a and 412b in some cases.

Figure 3C:
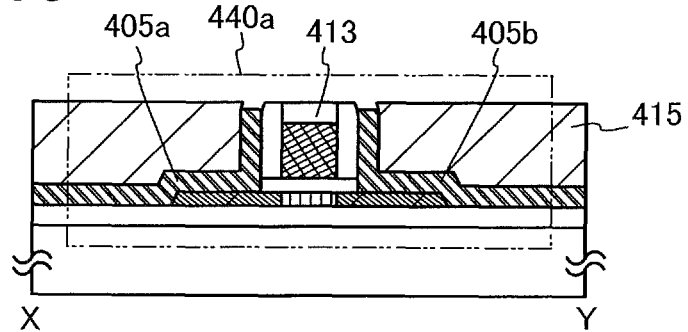

Through the above process, the transistor 440a of this embodiment can be manufactured (see FIG. 3C).

In the manufacturing process of the transistor 440a, the conductive layer 445 provided over the gate electrode layer 401, the insulating layer 413, and the sidewall insulating layers 412a and 412b is removed by chemical mechanical polishing treatment, so that the conductive layer 445 is divided; thus, the source electrode layer 405a and the drain electrode layer 405b are formed.

The source electrode layer 405a and the drain electrode layer 405b are in contact with the sidewall insulating layer 412a and the sidewall insulating layer 412b, respectively, and an exposed portion of a top surface of the oxide semiconductor layer 403. The distance (the shortest distance) between the gate electrode layer 401 and a region (contact region) in which the oxide semiconductor layer 403 is in contact with the source electrode layer 405a or the drain electrode layer 405b corresponds to a width of the sidewall insulating layer 412a or 412b in the channel length direction, whereby the further miniaturization can be achieved and variation in the manufacturing process can be suppressed.

Accordingly, the distance between the gate electrode layer 401 and the region (contact region) in which the oxide semiconductor layer 403 is in contact with the source electrode layer 405a or the drain electrode layer 405b can be made short, so that the resistance between the gate electrode layer 401 and the region (contact region) in which the oxide semiconductor layer 403 is in contact with the source electrode layer 405a or the drain electrode layer 405b is reduced; thus, the on-state characteristics of the transistor 440a can be improved.

Further, precise processing can be performed accurately because etching with use of a resist mask is not performed when the conductive layer 445 over the gate electrode layer 401 is removed in a formation step of the source electrode layer 405a and the drain electrode layer 405b. Consequently, in a process for manufacturing the semiconductor device, the transistor 440a having a miniaturized structure with less variation in shape or characteristics can be manufactured with high yield.

Figure 4A:
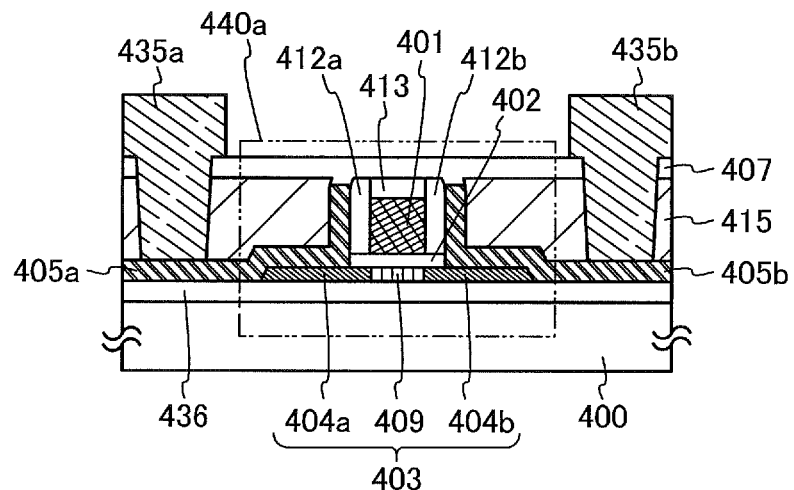
FIGS. 4A to 4C are cross-sectional views illustrating one embodiment of a semiconductor device.

When the conductive layer 445 over the gate electrode layer 401 is removed in the step for forming the source electrode layer 405a and the drain electrode layer 405b, part or all of the insulating layer 413 may be removed. FIG. 4C illustrates an example of a transistor 440c in which all of the insulating layer 413 is removed and the gate electrode layer 401 is exposed. Further, an upper part of the gate electrode layer 401 may also be removed. A structure in which the gate electrode layer 401 is exposed as in the transistor 440c can be used for an integrated circuit in which another wiring or another semiconductor element is stacked over the transistor 440c.

A highly dense inorganic insulating layer (typically an aluminum oxide layer) which is to be a protective insulating layer may be provided over the transistor 440a.

Figure 3D:
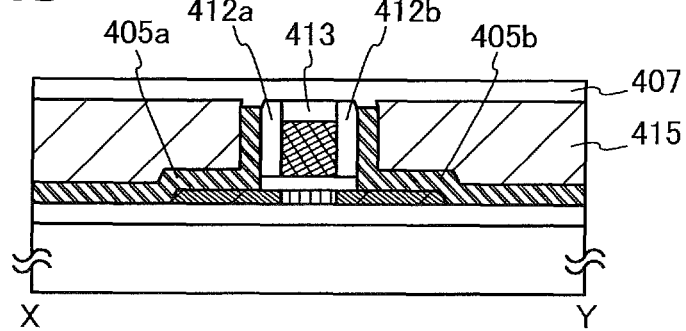

In this embodiment, the insulating layer 407 is formed over and in contact with the insulating layer 413, the source electrode layer 405a, the drain electrode layer 405b, the sidewall insulating layers 412a and 412b, and the interlayer insulating layer 415 (see FIG. 3D).

Further, a highly-dense inorganic insulating layer (typically an aluminum oxide layer) which is to be a protective insulating layer may be provided between the source electrode layer 405a and the interlayer insulating layer 415 and between the drain electrode layer 405b and the interlayer insulating layer 415.

Figure 4B:
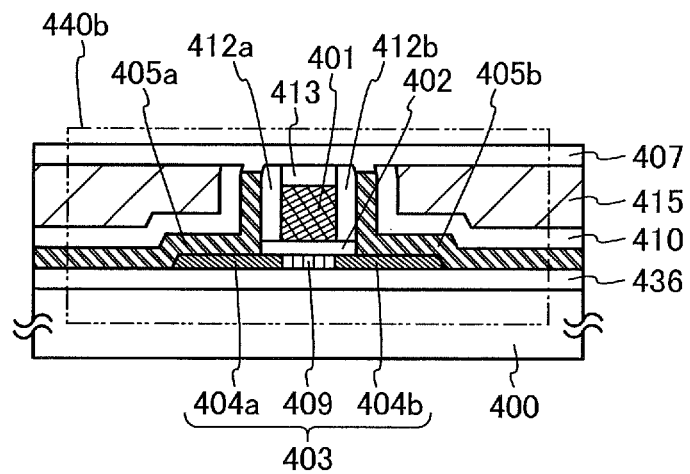
Figure 4C:
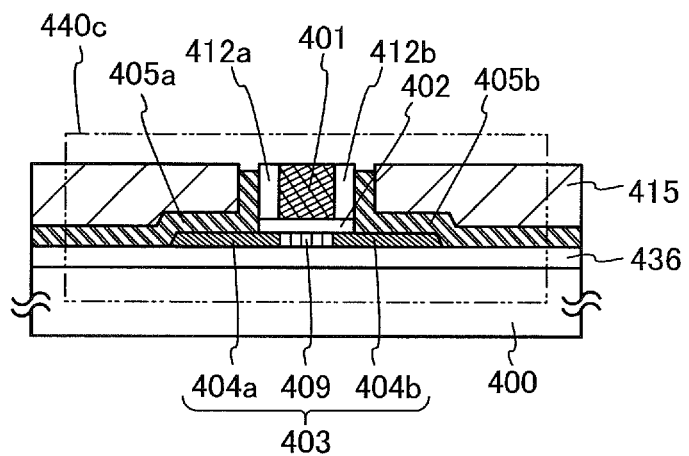

FIG. 4B illustrates an example of a transistor 440b in which an insulating layer 410 is provided between the source electrode layer 405a and the interlayer insulating layer 415 and between the drain electrode layer 405b and the interlayer insulating layer 415. In the transistor 440b, a top surface of the insulating layer 410 is also planarized by the cutting (grinding or polishing) step which is used for forming the source electrode layer 405a and the drain electrode layer 405b.

Each of the insulating layers 407 and 410 may have either a single-layer structure or a stacked-layer structure, and preferably contains at least an aluminum oxide layer.

Each of the insulating layers 407 and 410 can be formed by a plasma CVD method, a sputtering method, an evaporation method, or the like.

A material used for the insulating layers 407 and 410 other than aluminum oxide, an inorganic insulating material such as silicon oxide, silicon oxynitride, aluminum oxynitride, or gallium oxide can be used, for example. Further, hafnium oxide, magnesium oxide, zirconium oxide, lanthanum oxide, barium oxide, or a metal nitride film (e.g., aluminum nitride) can also be used.

In this embodiment, an aluminum oxide layer formed by a sputtering method is used for the insulating layers 407 and 410. When the aluminum oxide layer has high density (the film density is higher than or equal to 3.2 g/cm$^3$, preferably higher than or equal to 3.6 g/cm$^3$), the transistors 440a and 440b can have stable electric characteristics. The film density can be measured by Rutherford backscattering spectrometry (RBS) or X-ray reflectometry (XRR).

The aluminum oxide layers which can be used as the insulating layers 407 and 410 over the oxide semiconductor layer 403 have a high shielding effect (blocking effect) of preventing penetration of both oxygen and impurities such as hydrogen or moisture.

Therefore, in and after the manufacturing process, the insulating layers formed using aluminum oxide each function as a protective film for preventing an impurities such as hydrogen or moisture, which cause a change in characteristics, from entering the oxide semiconductor layer 403 and also preventing oxygen, which is a main constituent material of the oxide semiconductor, from being released from the oxide semiconductor layer 403.

The insulating layers 407 and 410 are preferably formed using a method in which impurities such as water or hydrogen are prevented from entering the insulating layers 407 and 410 (preferably a sputtering method or the like) as appropriate.

In order to remove remaining moisture in a deposition chamber as in the case of the deposition of the oxide semiconductor layer, an entrapment vacuum pump (e.g., a cryopump) is preferably used. When the insulating layers 407 and 410 are formed in the deposition chamber evacuated using a cryopump, the impurity concentrations of the insulating layers 407 and 410 can be reduced. In addition, as an evacuation unit for removing moisture remaining in the deposition chamber, a turbo molecular pump provided with a cold trap may be used.

It is preferable that a high-purity gas in which impurities such as hydrogen, water, a hydroxyl group, or a hydride are reduced be used as the sputtering gas for the deposition of the insulating layers 407 and 410.

In addition, a planarization insulating layer may be formed over the transistor in order to reduce surface unevenness due to the transistor. As the planarization insulating layer, an organic material such as a polyimide resin, an acrylic resin, or a benzocyclobutene-based resin can be used. Other than such organic materials, it is also possible to use a low-dielectric constant material (a low-k material) or the like. Note that the planarization insulating layer may be formed by stacking a plurality of insulating layers formed using any of these materials.

Further, FIG. 4A illustrates an example in which openings reaching the source electrode layer 405a and the drain electrode layer 405b are formed in the interlayer insulating layer 415 and the insulating layer 407, and wiring layers 435a and 435b are formed in the openings. With use of the wiring layers 435a and 435b, the transistor 440a is connected to another transistor or another element, which can lead to formation of a variety of circuits.

The wiring layers 435a and 435b can be formed using a material and a method similar to those of the gate electrode layer 401, the source electrode layer 405a, and the drain electrode layer 405b. For example, a metal film containing an element selected from Al, Cr, Cu, Ta, Ti, Mo, and W, a metal nitride film containing any of the above elements as a component (e.g., a titanium nitride film, a molybdenum nitride film, or a tungsten nitride film), or the like can be used. A metal film having a refractory metal such as Ti, Mo, W, or the like or a metal nitride film of any of these elements (a titanium nitride film, a molybdenum nitride film, and a tungsten nitride film) may be stacked on one of or both a lower side and an upper side of a metal film of Al, Cu, or the like. A conductive layer used for the wiring layers 435a and 435b may be formed using conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials in which silicon oxide is contained can be used.

For example, as the wiring layers 435a and 435b, a single layer of a molybdenum film, a stack of a tantalum nitride film and a copper film, or a stack of a tantalum nitride film and a tungsten film can be used.

Through the manufacturing process of a semiconductor device as described above, the transistor 440a, 440b, or 440c having a miniaturized structure with less variation in shapes or characteristics and high on-state characteristics can be provided with high yield.

Accordingly, a semiconductor device which is miniaturized and has good electrical characteristics and a method for manufacturing the semiconductor device can be provided.

This embodiment can be implemented in appropriate combination with the structures described in the other embodiments.

(Embodiment 2)

In this embodiment, an example of a semiconductor device which includes the transistor described in this specification, which can hold stored data even when not powered, and which does not have a limitation on the number of write cycles, will be described with reference to drawings.

Figure 5A:
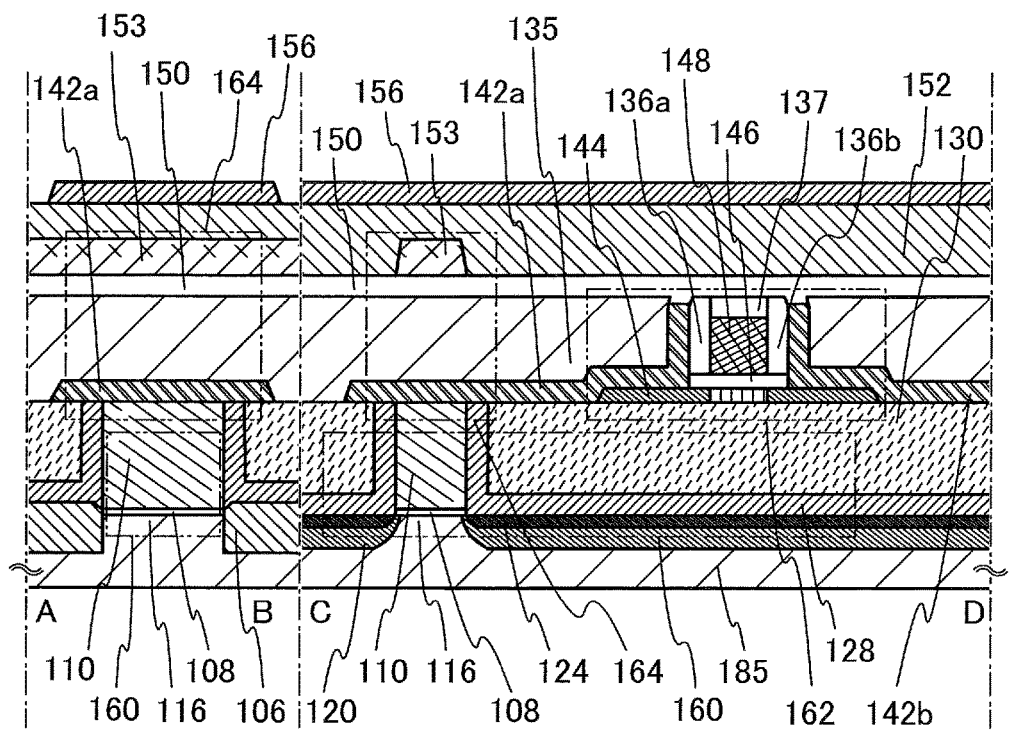
FIGS. 5A to 5C are a cross-sectional view, a plan view, and a circuit diagram illustrating one embodiment of a semiconductor device.
Figure 5B:
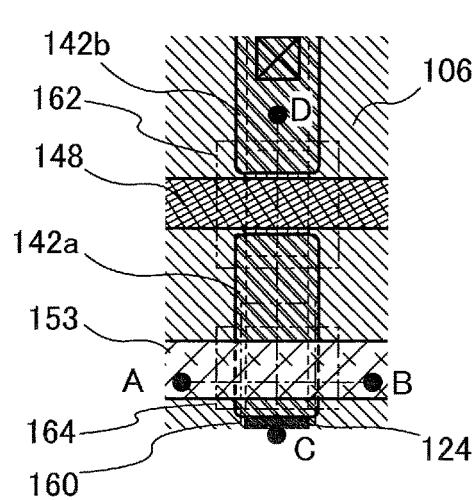
Figure 5C:
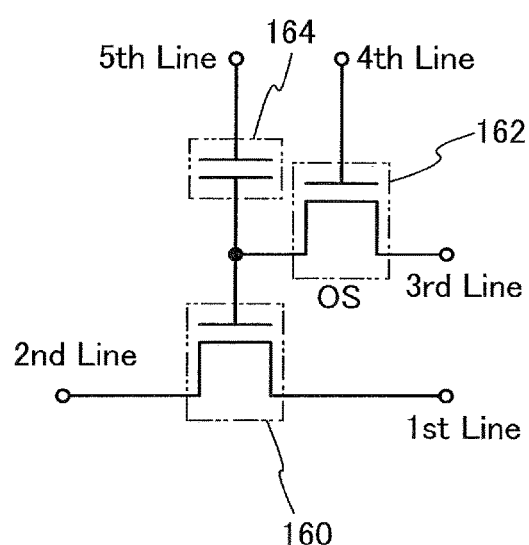

FIGS. 5A and 5B illustrate an example of a structure of a semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section along line A-B and line C-D in FIG. 5B. Note that in FIG. 5B, some components of the semiconductor device illustrated in FIG. 5A are omitted for clarity.

The semiconductor device illustrated in FIGS. 5A and 5B includes a transistor 160 including a first semiconductor material in a lower portion, and a transistor 162 including a second semiconductor material in an upper portion. The transistor 162 is an example to which a structure of the transistor 440a described in Embodiment 1 is applied.

Here, the first semiconductor material and the second semiconductor material are preferably materials having different band gaps. For example, the first semiconductor material may be a semiconductor material (e.g., silicon) other than an oxide semiconductor and the second semiconductor material may be an oxide semiconductor. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can be used. The specific constituent of the semiconductor device is not necessarily limited to those described here such as the material used for the semiconductor device and the structure of the semiconductor device (e.g., the use of the transistor described in Embodiment 1, which is formed using an oxide semiconductor, as the transistor 162 for holding data).

The transistor 160 in FIG. 5A includes a channel formation region 116 provided over a substrate 185 including a semiconductor material (e.g., silicon), impurity regions 120 with the channel formation region 116 provided therebetween, intermetallic compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 106 is provided over the substrate 185 to surround the transistor 160. An insulating layer 128 and an insulating layer 130 are provided to cover the transistor 160. Note that, in the transistor 160, the sidewall insulating layers may be formed on side surfaces of the gate electrode 110 and the impurity regions 120 may include a region having a different impurity concentration.

The transistor 160 formed using a single crystal semiconductor substrate can operate at high speed. Thus, when the transistor is used as a reading transistor, data can be read at a high speed. As treatment prior to formation of the transistor 162 and a capacitor 164, CMP treatment is performed on two insulating layers formed to cover the transistor 160, whereby the insulating layer 128 and the insulating layer 130 which are planarized are formed and, at the same time, an upper surface of the gate electrode 110 is exposed.

For the insulating layer 128 and the insulating layer 130, typically, an inorganic insulating material such as silicon oxide, silicon oxynitride, aluminum oxide, aluminum oxynitride, silicon nitride, aluminum nitride silicon nitride oxide, or aluminum nitride oxide can be used. The insulating layer 128 and the insulating layer 130 can be formed by a plasma CVD method, a sputtering method, or the like.

Alternatively, an organic material such as a polyimide resin, an acrylic resin, or a benzocyclobutene-based resin can be used. Other than such organic materials, it is also possible to use a low-dielectric constant material (a low-k material) or the like. In the case of using an organic material, a wet process such as a spin coating method or a printing method may be used to form the insulating layer 128 and the insulating layer 130.

Note that in this embodiment, a silicon nitride film is used as the insulating layer 128, and a silicon oxide film is used as the insulating layer 130.

Planarization treatment is preferably performed on a surface of the insulating layer 130 which is to be the formation region of an oxide semiconductor layer 144. In this embodiment, the oxide semiconductor layer 144 is formed over the insulating layer 130 which is sufficiently planarized by polishing treatment such as CMP treatment (the average surface roughness of the surface of the insulating layer 130 is preferably less than or equal to 0.15 nm).

The transistor 162 shown in FIG. 5A includes an oxide semiconductor in the channel formation region. Here, the oxide semiconductor layer 144 included in the transistor 162 is preferably highly purified. By using a highly purified oxide semiconductor, the transistor 162 which has extremely favorable off-state current characteristics can be obtained.

Since the off-state current of the transistor 162 is small, stored data can be held for a long time owing to such a transistor. In other words, power consumption can be sufficiently reduced because a semiconductor device in which refresh operation is unnecessary or the frequency of refresh operation is extremely low can be provided.

In a manufacturing process of the transistor 162, electrode layers 142a and 142b which function as a source electrode layer and a drain electrode layer are formed in a step of removing a conductive layer provided over a gate electrode 148, an insulating layer 137, and sidewall insulating layers 136a and 136b by chemical mechanical polishing treatment.

Thus, in the transistor 162, the distance between the gate electrode 148 and a region (contact region) where the electrode layer 142a or 142b which functions as a source electrode layer or a drain electrode layer is in contact with the oxide semiconductor layer 144 can be shortened. Thus, the resistance between the gate electrode 148 and the region (contact region) where the electrode layer 142a or 142b is in contact with the oxide semiconductor layer 144 can be reduced, which results in an improvement in the on-state characteristics of the transistor 162.

Further, precise processing can be performed accurately because etching treatment with use of a resist mask is not performed in a step of removing the conductive layer over the gate electrode 148 for forming the electrode layers 142a and 142b. Consequently, in a process for manufacturing the semiconductor device, a transistor having a miniaturized structure with less variation in shape or characteristics can be manufactured with high yield.

An interlayer insulating layer 135 and an insulating layer 150 each of which has a single-layer structure or a stacked structure are provided over the transistor 162. In this embodiment, an aluminum oxide film is used as the insulating layer 150. When the aluminum oxide layer has high density (film density of 3.2 g/cm$^3$ or more, preferably 3.6 g/cm$^3$ or more), the transistor 162 can have stable electric characteristics.

In addition, a conductive layer 153 is provided in a region overlapping with the electrode layer 142a of the transistor 162 with the interlayer insulating layer 135 and the insulating layer 150 interposed therebetween, and the electrode layer 142a, the interlayer insulating layer 135, the insulating layer 150, and the conductive layer 153 form a capacitor 164. That is, the source electrode layer 142a of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162.

The insulating layer 152 is provided over the transistor 162 and the capacitor 164. Further, a wiring 156 for connecting the transistor 162 to another transistor is provided over the insulating layer 152. Although not illustrated in FIG. 5A, the wiring 156 is electrically connected to the electrode layer 142b through an electrode formed in an opening provided in the insulating layer 150, the insulating layer 152, the gate insulating film 146, and the like. Here, the electrode is preferably provided so as to partly overlap with at least the oxide semiconductor layer 144 of the transistor 162.

In FIGS. 5A and 5B, the transistor 160 is provided so as to overlap with at least part of the transistor 162. The source region or the drain region of the transistor 160 is preferably provided so as to overlap with part of the oxide semiconductor layer 144. Further, the transistor 162 and the capacitor 164 are provided so as to overlap with at least part of the transistor 160. For example, the conductive layer 153 of the capacitor 164 is provided so as to overlap with at least part of the gate electrode 110 of the transistor 160. With such a planar layout, the area occupied by the semiconductor device can be reduced; thus, higher integration can be achieved.

Note that the electrical connection between the electrode layer 142b and the wiring 156 may be established by direct contact of the electrode layer 142b and the wiring 156 with each other or through an electrode provided in an insulating layer lying between the electrode layer 142b and the wiring 156. Alternatively, the electrical connection may be established through a plurality of electrodes.

Next, an example of a circuit configuration corresponding to FIGS. 5A and 5B is illustrated in FIG. 5C.

In FIG. 5C, a first wiring (1st Line) is electrically connected to a source electrode of the transistor 160. A second wiring (2nd Line) is electrically connected to a drain electrode of the transistor 160. A third wiring (a 3rd Line) and one of source and drain electrodes of the transistor 162 are electrically connected to each other, and a fourth wiring (a 4th Line) and a gate electrode of the transistor 162 are electrically connected to each other. A gate electrode of the transistor 160 and the other of the source electrode and the drain electrode of the transistor 162 are electrically connected to one electrode of the capacitor 164. A fifth line (5th Line) and the other electrode of the capacitor 164 are electrically connected to each other.

The semiconductor device in FIG. 5C utilizes a characteristic in which the potential of the gate electrode of the transistor 160 can be held, and thus enables data writing, holding, and reading as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and the capacitor 164. That is, predetermined charge is given to the gate electrode of the transistor 160 (writing). Here, charge for supply of a potential level or charge for supply of a different potential level (hereinafter referred to as Low level charge and High level charge) is given. After that, the potential of the fourth wiring is set to a potential at which the transistor 162 is turned off, so that the transistor 162 is turned off. Thus, the charge given to the gate electrode of the transistor 160 is held (storing).

Since the amount of off-state current of the transistor 162 is extremely small, the charge of the gate electrode of the transistor 160 is held for a long time.

Next, reading data will be described. By supplying an appropriate potential (reading potential) to the fifth wiring while a predetermined potential (constant potential) is supplied to the first wiring, the potential of the second wiring fluctuates depending on the amount of charge held in the gate electrode of the transistor 160. This is because in general, when the transistor 160 is an n-channel transistor, an apparent threshold voltage $V_{th\_H}$ in the case where a high-level charge is given to the gate electrode of the transistor 160 is lower than an apparent threshold voltage $V_{th\_L}$ in the case where a low-level charge is given to the gate electrode of the transistor 160.

Here, an apparent threshold voltage refers to the potential of the fifth wiring, which is needed to turn on the transistor 160. Thus, the potential of the fifth wiring is set to a potential $V_0$ intermediate between $V_{th\_H}$ and $V_{th\_L}$, whereby charge given to the gate electrode of the transistor 160 can be determined. For example, in the case where a high-level charge is given in writing, when the potential of the fifth wiring is set to $V_0$ ($>V_{th\_H}$), the transistor 160 is turned on. In the case where a low level charge is given in writing, even when the potential of the fifth wiring is set to $V_0$ ($<V_{th\_L}$), the transistor 160 remains in an off state. Therefore, the stored data can be read by the potential of the second wiring.

Note that in the case where memory cells are arrayed to be used, only data of desired memory cells needs to be read. In the case where such reading is not performed, a potential at which the transistor 160 is turned off, that is, a potential smaller than $V_{th\_H}$ may be given to the fifth wiring regardless of the state of the gate electrode of the transistor 160. Alternatively, a potential which allows the transistor 160 to be turned on regardless of a state of the gate electrode, that is, a potential higher than $V_{th\_L}$ may be applied to the fifth wiring.

Figure 24A:
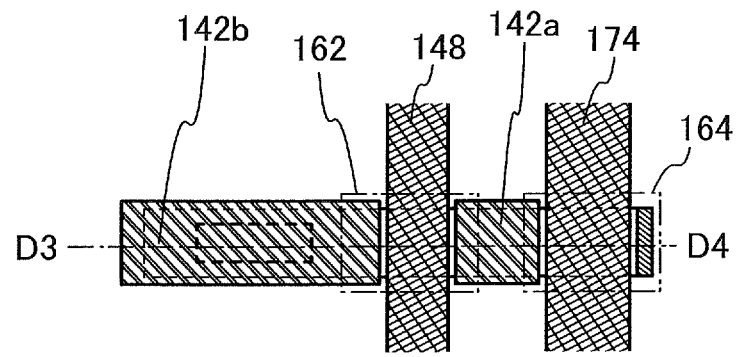
FIGS. 24A and 24B are a plan view and a cross-sectional view illustrating one embodiment of a semiconductor device.
Figure 24B:
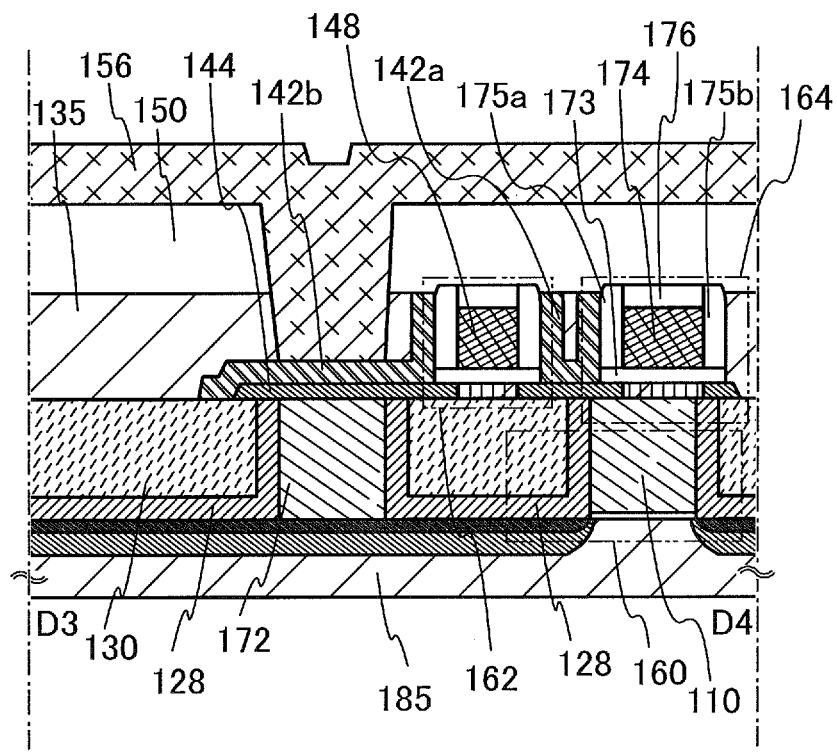

FIGS. 24A and 24B illustrate another example of the semiconductor device. FIG. 24A is a plan view of the semiconductor device, and FIG. 24B is a cross-sectional view thereof. Here, FIG. 24B corresponds to the cross section along line D3-D4 in FIG. 24A. Note that in FIG. 24A, some components of the semiconductor device illustrated in FIG. 24B are omitted for clarity.

In FIGS. 24A and 24B, the capacitor 164 includes the gate electrode 110, the oxide semiconductor layer 144, an insulating layer 173, and a conductive layer 174. The conductive layer 174 is formed by the same steps as the gate electrode layer 148, and a top surface of the conductive layer 174 is covered with an insulating layer 176, and side surfaces of the conductive layer 174 are covered with sidewall insulating layers 175a and 175b.

The electrode layer 142b of the transistor 162 is electrically connected to the wiring 156 in an opening which is formed in the interlayer insulating layer 135 and the insulating layer 150 and reaches the electrode layer 142b. Further, a conductive layer 172 is provided below and in contact with the oxide semiconductor layer 144, and electrically connects the transistor 160 to the transistor 162.

As illustrated in FIGS. 24A and 24B, the transistor 160, the transistor 162, and the capacitor 164 are closely stacked to overlap with each other, whereby the area occupied by the semiconductor device can be decreased; thus, the semiconductor device can be highly integrated.

When a transistor having a channel formation region formed using an oxide semiconductor and having extremely small off-state current is employed in the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

As described above, a miniaturized and highly-integrated semiconductor device having high electric characteristics and a method for manufacturing the semiconductor device can be provided.

This embodiment can be implemented in appropriate combination with the structures described in the other embodiments.

(Embodiment 3)

In this embodiment, a semiconductor device including the transistor described in the above embodiment, which can hold stored data even when not powered, which does not have a limitation on the number of write cycles and which has a structure different from the structure described in Embodiment 2 will be described with reference to FIGS. 6A and 6B and FIGS. 7A and 7B.

Figure 6A:
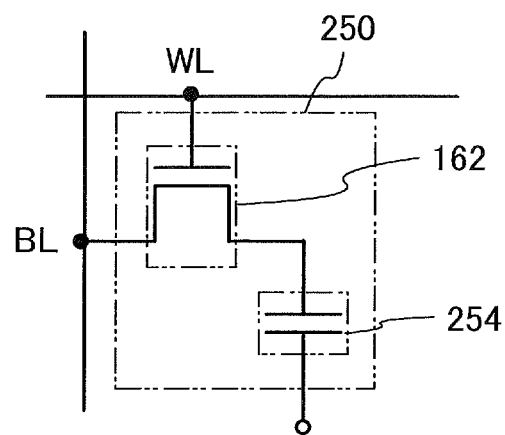
FIGS. 6A and 6B a circuit diagram and a perspective view illustrating one embodiment of a semiconductor device.
Figure 6B:
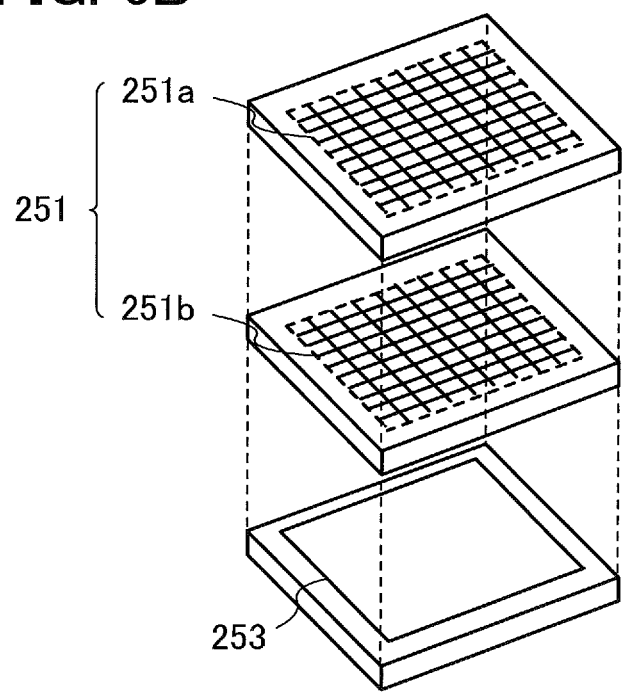

FIG. 6A illustrates an example of a circuit configuration of a semiconductor device, and FIG. 6B is a conceptual diagram illustrating an example of a semiconductor device. First, the semiconductor device illustrated in FIG. 6A will be described, and then, the semiconductor device illustrated in FIG. 6B will be described.

In the semiconductor device illustrated in FIG. 6A, a bit line BL is electrically connected to one of a source electrode and a drain electrode of the transistor 162, a word line WL is electrically connected to the gate electrode of the transistor 162, and the other of the source electrode and the drain electrode of the transistor 162 is electrically connected to a first terminal of a capacitor 254.

Next, writing and holding of data in the semiconductor device (a memory cell 250) illustrated in FIG. 6A will be described.

First, the potential of the word line WL is set to a potential at which the transistor 162 is turned on, and the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential at the first terminal of the capacitor 254 is held (holding).

In addition, the amount of off-state current is extremely small in the transistor 162 which uses an oxide semiconductor. For that reason, the potential of the first terminal of the capacitor 254 (or a charge accumulated in the capacitor 254) can be held for an extremely long period by turning off the transistor 162.

Next, reading of data will be described. When the transistor 162 is turned on, the bit line BL which is in a floating state and the first terminal of the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $G_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ (=$(C_B \times V_{B0} + C \times V_1)/(C_B + C)$) is higher than the potential of the bit line BL in the case of holding the potential $V_0$ (=$(C_B \times V_{B0} + C \times V_0)/(C_B + C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 6B will be described.

The semiconductor device illustrated in FIG. 6B includes a memory cell array 251 (memory cell arrays 251a and 251b) including a plurality of memory cells 250 illustrated in FIG. 6A as memory circuits in the upper portion, and a peripheral circuit 253 in the lower portion, which is necessary for operating the memory cell array 251 (the memory cell arrays 251a and 251b). Note that the peripheral circuit 253 is electrically connected to the memory cell array 251.

In the structure illustrated in FIG. 6B, the peripheral circuit 253 can be provided under the memory cell array 251. Thus, the size of the semiconductor device can be decreased.

It is preferable that a semiconductor material of the transistor provided in the peripheral circuit 253 be different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 6B illustrates, as an example, the semiconductor device in which two memory cell arrays 251 (the memory cell array 251a and the memory cell array 251b) are stacked; however, the number of stacked memory cell arrays is not limited thereto. Three or more memory cells may be stacked.

Next, a specific structure of the memory cell 250 illustrated in FIG. 6A will be described with reference to FIGS. 7A and 7B.

Figure 7A:
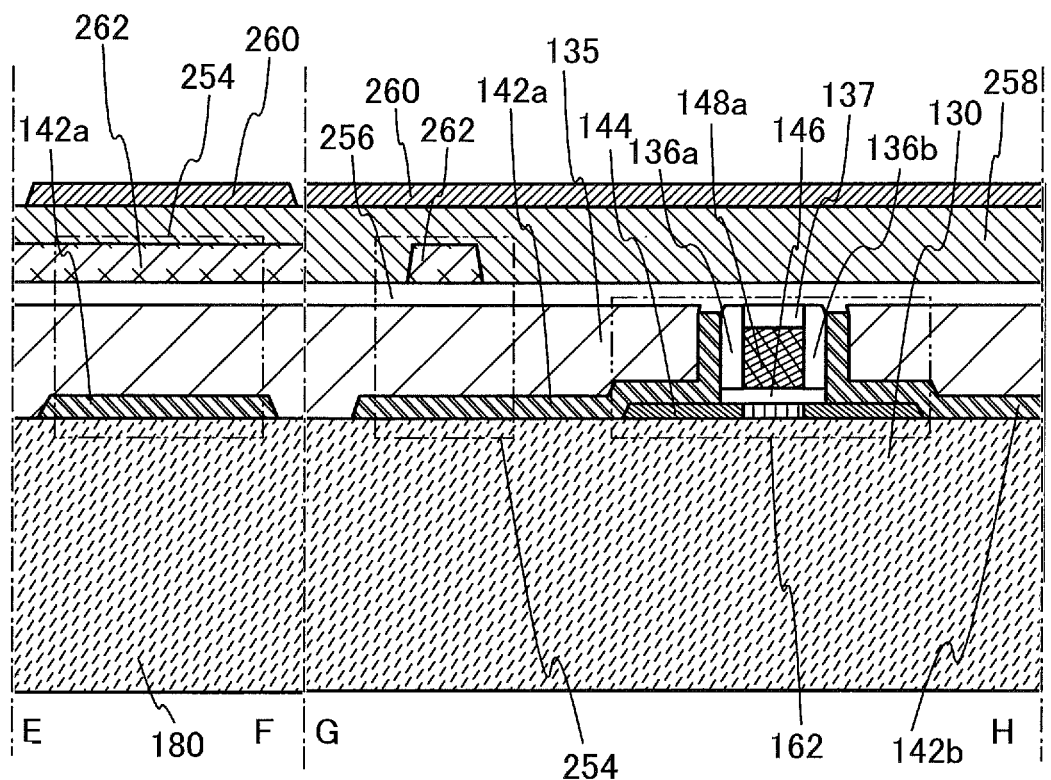
FIGS. 7A and 7B are a cross-sectional view and a plan view illustrating one embodiment of a semiconductor device.
Figure 7B:
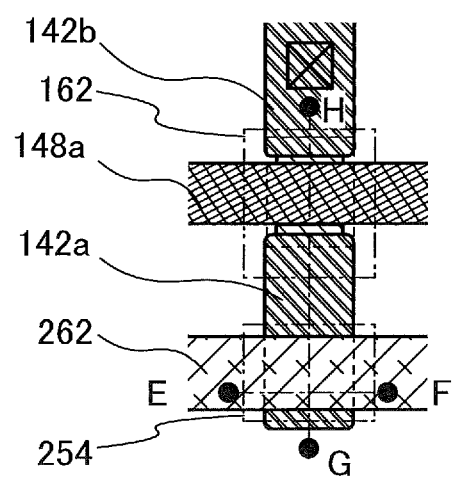

FIGS. 7A and 7B illustrate an example of a structure of the memory cell 250. FIG. 7A is a cross-sectional view of the memory cell 250, and FIG. 7B is a plan view of the memory cell 250. Here, FIG. 7A corresponds to a cross section taken along lines E-F and G-H of FIG. 7B.

The transistor 162 in FIGS. 7A and 7B can have the same structure as the transistor in the above embodiment.

An insulating layer 256 having a single-layer structure or a stacked structure is provided over the transistor 162 over an insulating layer 180. In addition, a conductive layer 262 is provided in a region overlapping with the electrode layer 142a of the transistor 162 with the insulating layer 256 provided therebetween, so that the electrode layer 142a, the interlayer insulating layer 135, the insulating layer 256, and the conductive layer 262 form the capacitor 254. That is, the electrode layer 142a of the transistor 162 functions as one electrode of the capacitor 254, and the conductive layer 262 functions as the other electrode of the capacitor 254.

An insulating layer 258 is provided over the transistor 162 and the capacitor 254. Further, a wiring 260 for connecting the memory cell 250 to an adjacent memory cell 250 is provided over the insulating layer 258. Although not illustrated, the wiring 260 is electrically connected to the electrode layer 142b of the transistor 162 through an opening provided in the insulating layer 256, the insulating layer 258, and the like. The wiring 260 may be electrically connected to the electrode layer 142b through another conductive layer provided in the opening. Note that the wiring 260 corresponds to the bit line BL in the circuit diagram of FIG. 6A.

In FIGS. 7A and 7B, the electrode layer 142b of the transistor 162 can also function as a source electrode of a transistor included in an adjacent memory cell.

When the planar layout in FIG. 7A is employed, the area occupied by the semiconductor device can be reduced; thus, the degree of integration can be increased.

As described above, the plurality of memory cells formed in multiple layers in the upper portion is each formed with a transistor including an oxide semiconductor. Since the amount of off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose amount of off-state current is sufficiently small). In addition, with a structure where the peripheral circuit and the memory circuit are stacked, the degree of integration of the semiconductor device can be increased.

As described above, a miniaturized and highly integrated semiconductor device having high electric characteristics and a method for manufacturing the semiconductor device can be provided.

This embodiment can be implemented in appropriate combination with the structures described in the other embodiments.

(Embodiment 4)

In this embodiment, examples of application of the semiconductor device described in any of the above embodiments to portable devices such as mobile phones, smartphones, or e-book readers will be described with reference to FIGS. 8A and 8B, FIG. 9, FIG. 10, and FIG. 11.

In portable electronic devices such as a mobile phone, a smart phone, and an e-book reader, an SRAM or a DRAM is used so as to store image data temporarily. An SRAM or a DRAM is used because a flash memory whose response is slow is unsuitable to be used for image processing. On the other hand, an SRAM or a DRAM has the following characteristics when used for temporary storage of image data.

Figure 8A:
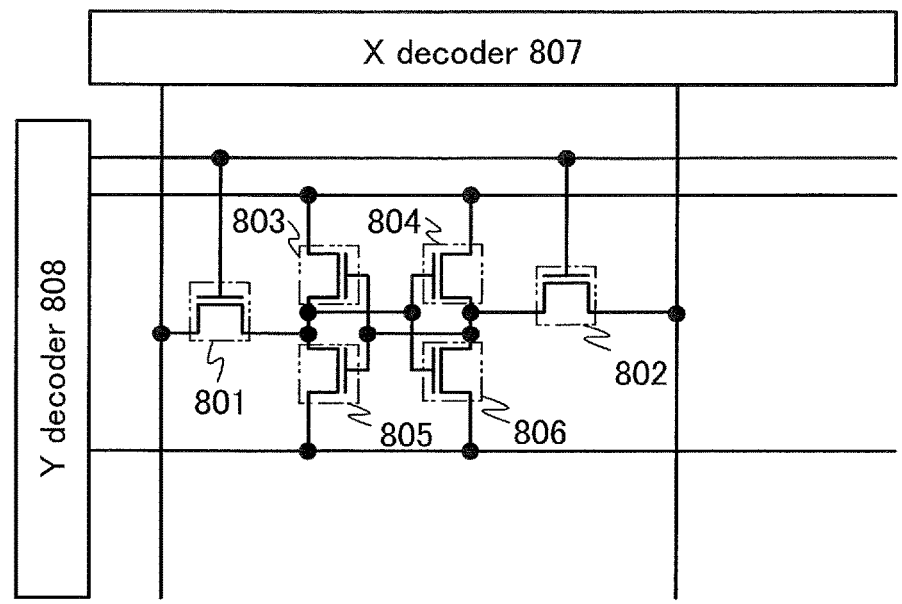
FIGS. 8A and 8B are circuit diagrams showing one embodiment of a semiconductor device.

In an ordinary SRAM, as illustrated in FIG. 8A, one memory cell includes six transistors, that is, transistors 801 to 806, which are driven with an X decoder 807 and a Y decoder 808. The transistors 803 and 805 serve as an inverter and the transistors 804 and 806 also serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 8B:
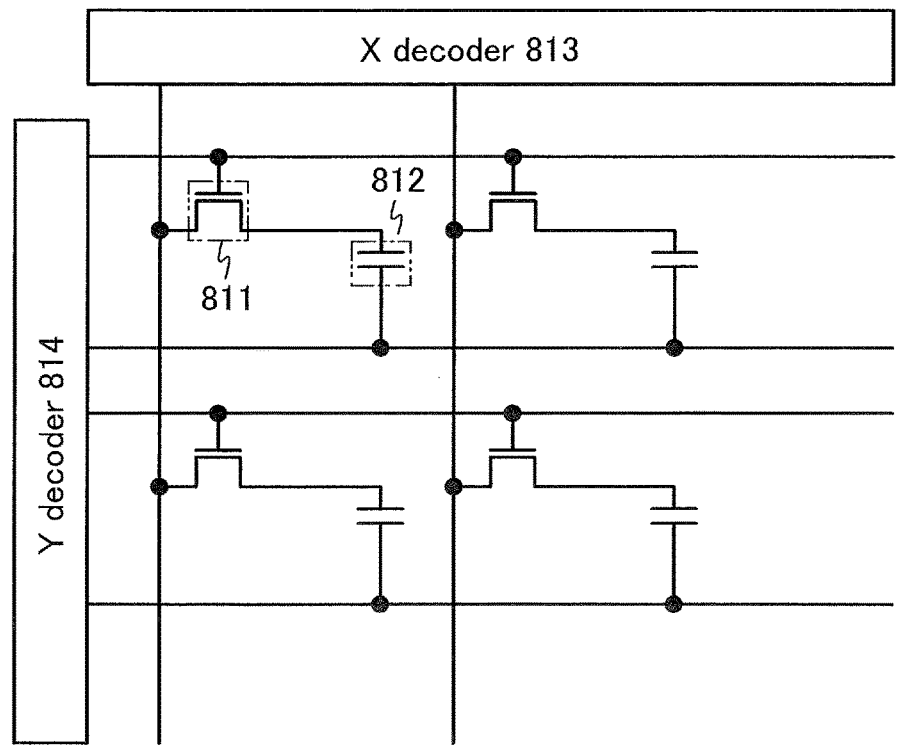

In a DRAM, as illustrated in FIG. 8B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that the DRAM needs to be refreshed periodically and consumes electric power even when a rewriting operation is not performed.

However, the area of the memory cell of the semiconductor device described in the above embodiment is about 10 $F^2$ and frequent refreshing is not needed. Therefore, the area of the memory cell is reduced, and the power consumption can be reduced.

Figure 9:
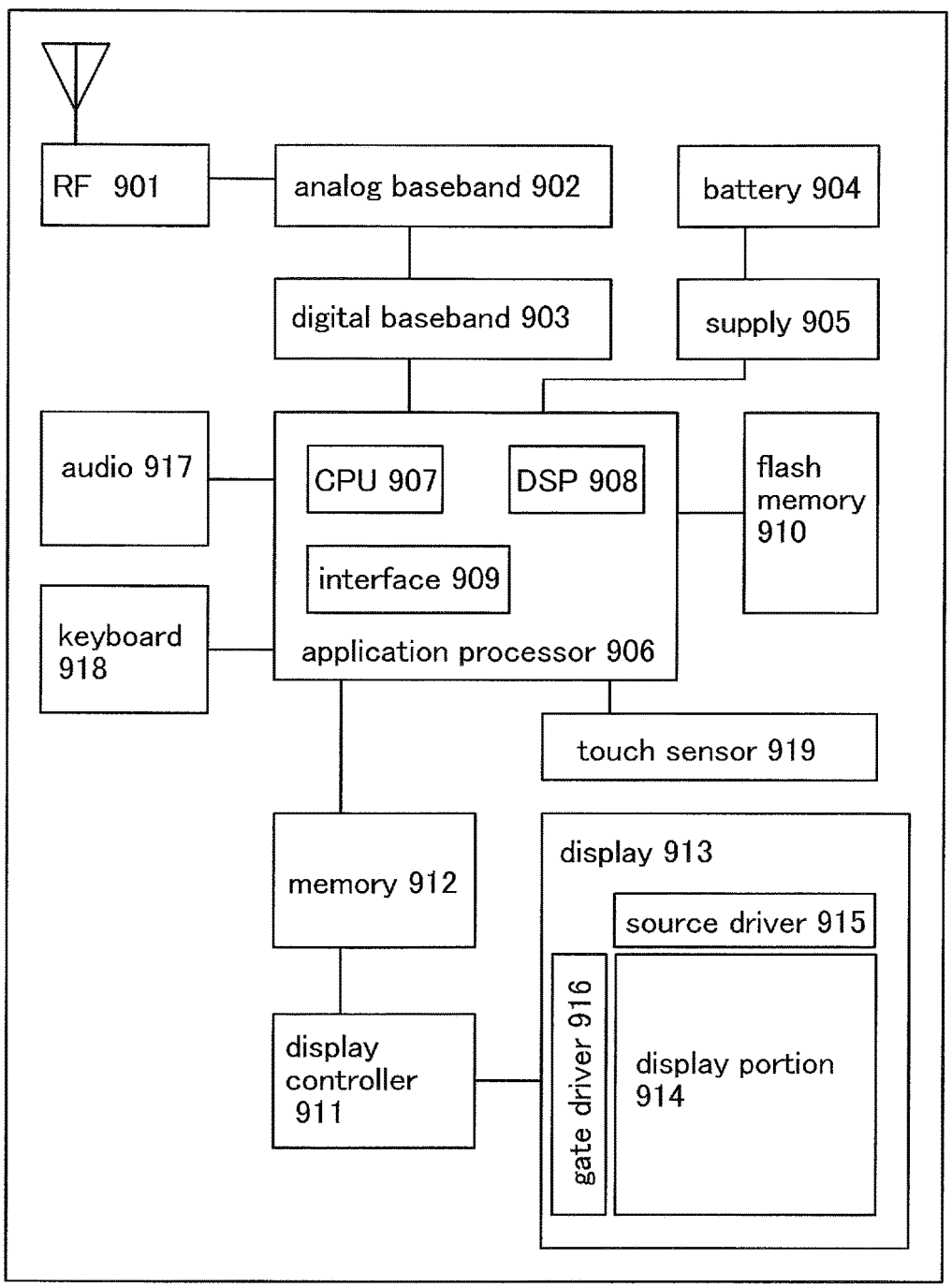
FIG. 9 is a block diagram showing one embodiment of a semiconductor device.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 10:
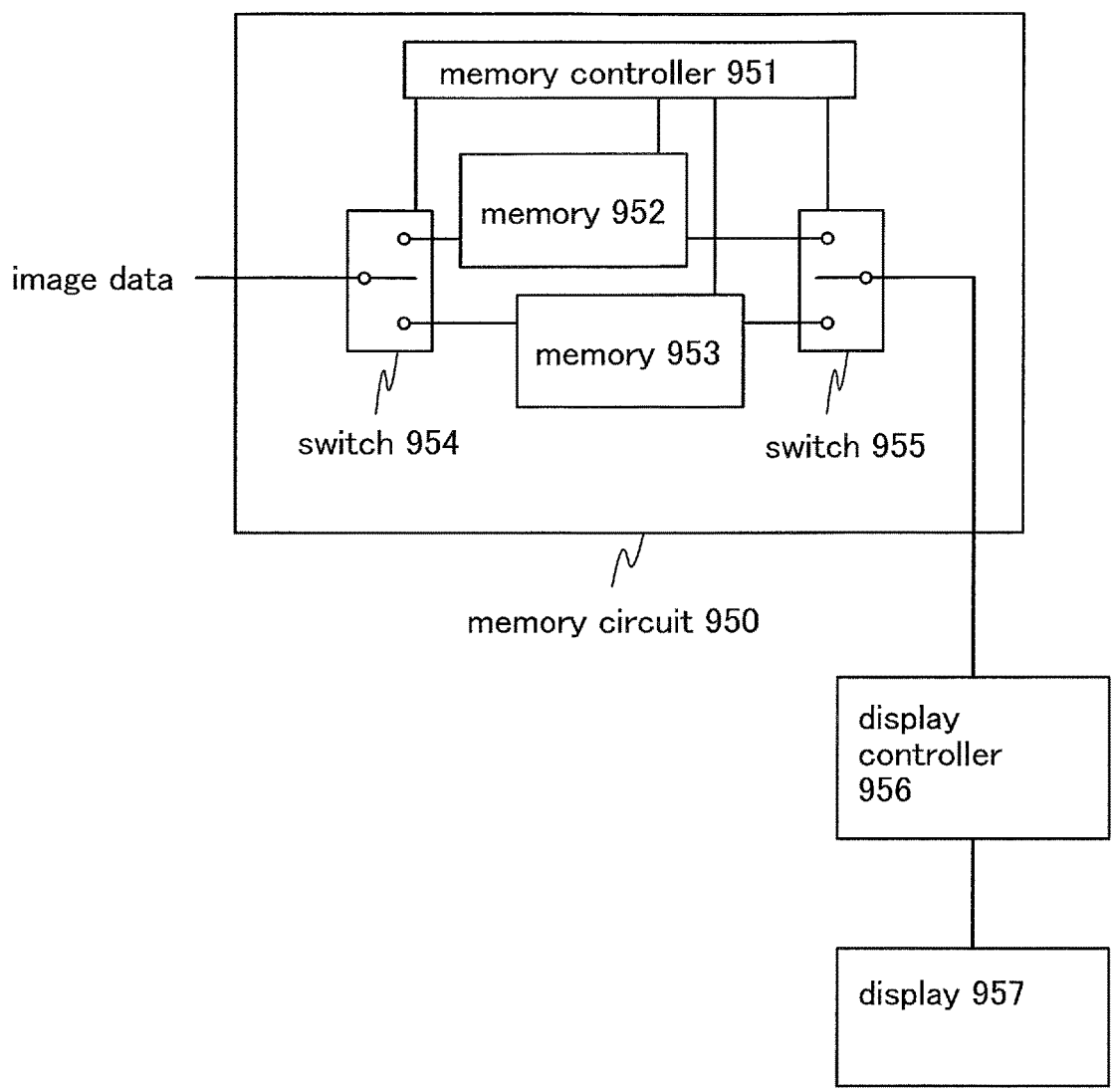
FIG. 10 is a block diagram showing one embodiment of a semiconductor device.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. Further, the memory circuit 950 is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is held in the memory 952 though the switch 954.

The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 normally at a frequency of 30 Hz to 60 Hz.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
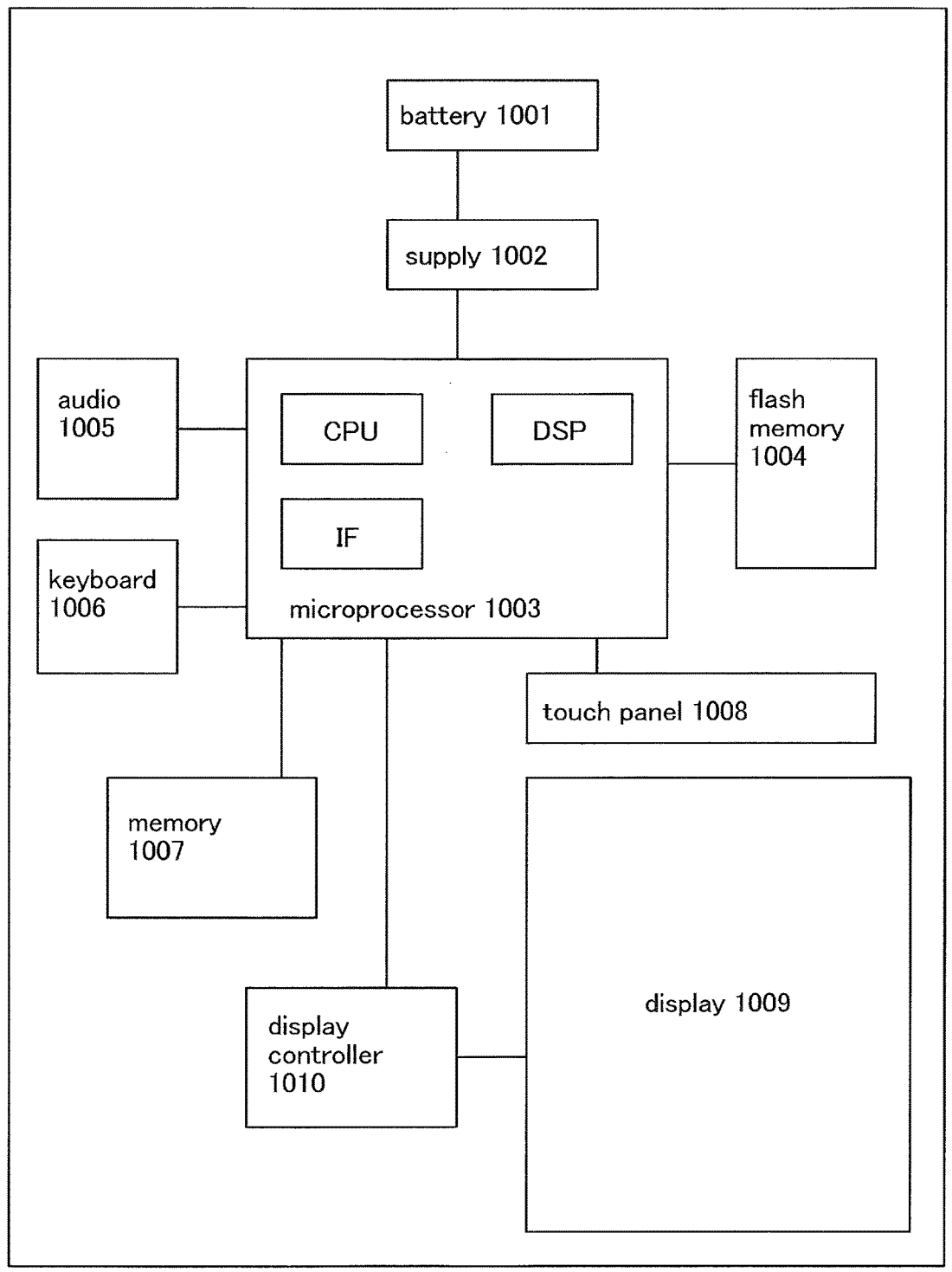
FIG. 11 is a block diagram showing one embodiment of a semiconductor device.

FIG. 11 is a block diagram of an e-book reader. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily storing the contents of a book. For example, when a user uses a highlight function, the memory circuit 1007 stores and holds data of a portion specified by the user. Note that the highlight function is used to make a difference between a specific portion and the other portions while reading an e-book, by marking the specific portion, e.g., by changing the display color, underlining, making characters bold, changing the font of characters, or the like. In order to store the data for a short time, the data may be stored in the memory circuit 1007. In order to store the data for a long time, the data stored in the memory circuit 1007 may be copied to the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

This embodiment can be implemented in appropriate combination with the structures described in the other embodiments.

(Embodiment 5)

A semiconductor device having an image sensor function of reading data of an object can be manufactured using the transistor described in the above embodiment.

Figure 12A:
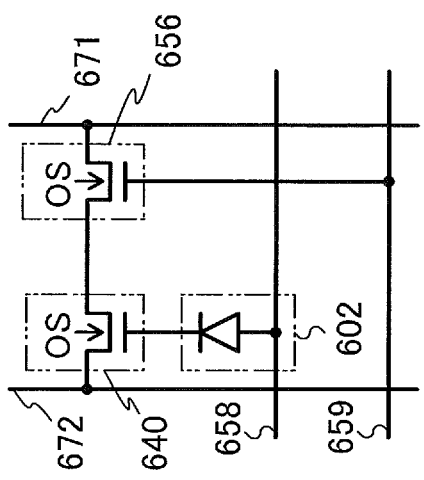
FIG. 12A is a circuit diagram and FIG. 12B is a cross-sectional view illustrating one embodiment of a semiconductor device.

An example of a semiconductor device having an image sensor function is illustrated in FIG. 12A. FIG. 12A illustrates an equivalent circuit of a photo sensor, and FIG. 12B is a cross-sectional view illustrating part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

In the circuit diagrams in this specification, a transistor including an oxide semiconductor in a semiconductor layer where a channel is formed is denoted by a symbol "OS" so that it can be clearly identified as a transistor including an oxide semiconductor in a semiconductor layer where a channel is formed. In FIG. 12A, the transistor 640 and the transistor 656 are transistors each including an oxide semiconductor in a semiconductor layer where a channel is formed, to which any of the transistors described in the above embodiments can be applied. In this embodiment, an example in which a transistor having a structure similar to that of the transistor 440a described in Embodiment 1 is used is described.

Figure 12B:
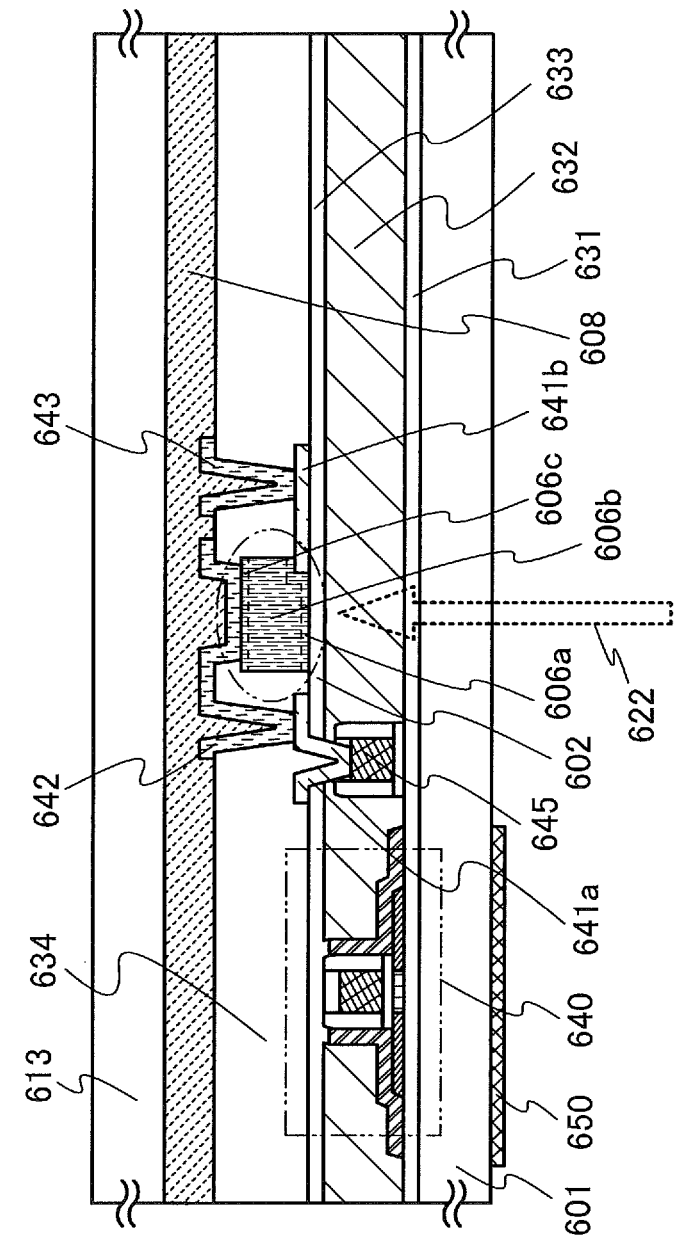

FIG. 12B is a cross-sectional view of the photodiode 602 and the transistor 640 in the photo sensor. The photodiode 602 functioning as a sensor and the transistor 640 are provided over a substrate 601 (a TFT substrate) having an insulating surface. A substrate 613 is provided over the photodiode 602 and the transistor 640 with an adhesive layer 608 interposed therebetween.

An interlayer insulating layer 632, an insulating layer 633, and an interlayer insulating layer 634 are provided over the transistor 640 provided over the insulating layer 631. The photodiode 602 is provided over the interlayer insulating layer 633. In the photodiode 602, a first semiconductor layer 606a, a second semiconductor layer 606b, and a third semiconductor layer 606c are sequentially stacked from the interlayer insulating layer 633 side, between electrode layers 641a and 641b formed over the interlayer insulating layer 633 and an electrode layer 642 formed over the interlayer insulating layer 634.

Note that a light-blocking layer 650 is provided in a region which overlaps with the transistor 640.

The electrode layer 641b is electrically connected to a conductive layer 643 formed over the interlayer insulating layer 634, and the electrode layer 642 that is formed by the same step as the conductive layer 643 is electrically connected to a conductive layer 645 through the electrode layer 641a. The conductive layer 645 is electrically connected to a gate electrode layer of the transistor 640, and the photodiode 602 is electrically connected to the transistor 640.

Here, a PIN photodiode in which a semiconductor layer having p-type conductivity as the first semiconductor layer 606a, a high-resistance semiconductor layer (i-type semiconductor layer) as the second semiconductor layer 606b, and a semiconductor layer having n-type conductivity as the third semiconductor layer 606c are stacked is shown as an example.

The first semiconductor layer 606a is a p-type semiconductor layer and can be formed using an amorphous silicon film containing an impurity element imparting p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion injecting method or the like in order to diffuse the impurity element. In this case, as a method for forming the amorphous silicon film, an LPCVD method, a vapor deposition method, a sputtering method, or the like may be employed. The first semiconductor layer 606a is preferably formed to have a thickness greater than or equal to 10 nm and less than or equal to 50 nm.

The second semiconductor layer 606b is an i-type semiconductor layer (intrinsic semiconductor layer) and is formed using an amorphous silicon film. As for formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, SiHCl$_3$, SiCl$_4$, SiF$_4$, or the like may be used. The second semiconductor layer 606b may be formed by an LPCVD method, a vapor deposition method, a sputtering method, or the like. The second semiconductor layer 606b is preferably formed to have a thickness greater than or equal to 200 nm and less than or equal to 1000 nm.

The third semiconductor layer 606c is an n-type semiconductor layer and is formed using an amorphous silicon film containing an impurity element imparting n-type conductivity. The third semiconductor layer 606c is formed by a plasma CVD method with use of a semiconductor source gas containing an impurity element belonging to Group 15 (e.g., phosphorus (P)). As the semiconductor source gas, silane (SiH$_4$) may be used. Alternatively, Si$_2$H$_6$, SiH$_2$Cl$_2$, SiHCl$_3$, SiCl$_4$, SiF$_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion injecting method or the like in order to diffuse the impurity element. In this case, as a method for forming the amorphous silicon film, an LPCVD method, a vapor deposition method, a sputtering method, or the like may be employed. The third semiconductor layer 606c is preferably formed to have a thickness greater than or equal to 20 nm and less than or equal to 200 nm.

The first semiconductor layer 606a, the second semiconductor layer 606b, and the third semiconductor layer 606c are not necessarily formed using an amorphous semiconductor, and they may be formed using a polycrystalline semiconductor, a microcrystalline semiconductor (a semi-amorphous semiconductor (SAS)).

The microcrystalline semiconductor belongs to a metastable state of an intermediate between amorphous and single crystal when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon contains hydrogen or halogen of at least 1 atomic percent or more in order to terminate a dangling bond. Moreover, microcrystalline silicon contains a rare gas element such as helium, argon, krypton, or neon to further promote lattice distortion, so that stability is increased and a favorable microcrystalline semiconductor can be obtained.

This microcrystalline semiconductor can be formed by a high-frequency plasma CVD method with a frequency of several tens of megahertz to several hundreds of megahertz or using a microwave plasma CVD apparatus with a frequency of 1 GHz or more. Typically, the microcrystalline semiconductor film can be formed using a compound containing silicon such as SiH$_4$, Si$_2$H$_6$, SiH$_2$Cl$_2$, SiHCl$_3$, SiCl$_4$, or SiF$_4$, which is diluted with hydrogen. The microcrystalline semiconductor film can also be formed with dilution with one or plural kinds of rare gas elements selected from helium, argon, krypton, and neon in addition to the compound containing silicon (e.g., silicon hydride) and hydrogen. In those cases, the flow ratio of hydrogen to the compound containing silicon (e.g., silicon hydride) is 5:1 to 200:1, preferably 50:1 to 150:1, further preferably 100:1. Further, a carbide gas such as CH$_4$ or C$_2$H$_6$, a germanium gas such as GeH$_4$ or GeF$_4$, F$_2$, or the like may be mixed into the gas containing silicon.

Since the mobility of holes generated by the photoelectric effect is lower than that of electrons, a PIN photodiode has better characteristics when a surface on the p-type semiconductor layer side is used as a light-receiving surface. Here, an example in which light received by the photodiode 602 from a surface of the substrate 601, over which the PIN photodiode is formed, is converted into electric signals is described. Light from the semiconductor layer side having a conductivity type opposite to that of the semiconductor layer side on the light-receiving surface is disturbance light; therefore, the electrode layer is preferably formed from a light-blocking conductive layer. Note that a surface of the n-type semiconductor layer side can alternatively be used as the light-receiving surface.

With use of an insulating material, the insulating layer 631, the interlayer insulating layer 632, and the insulating layer 633 can be formed, depending on the material, by a method or a tool (equipment) such as a sputtering method, a plasma-enhanced CVD method, an SOG method, spin coating, dipping, spray coating, a droplet discharge method (such as an ink-jet method), a printing method (such as screen printing or offset printing), a doctor knife, a roll coater, a curtain coater, or a knife coater.

In this embodiment, an aluminum oxide film is used as the insulating layer 633. The insulating layer 633 can be formed by a sputtering method or a plasma CVD method.

The aluminum oxide film which is provided as the insulating layer 633 over the oxide semiconductor layer has a high blocking effect by which both of oxygen and impurities such as hydrogen or moisture is prevented from being permeated through the film.

Therefore, in and after the manufacturing process, the aluminum oxide film functions as a protective layer for preventing entry of an impurity such as hydrogen or moisture, which causes a change in characteristics, into the oxide semiconductor and for preventing release of oxygen, which is a main constituent material of the oxide semiconductor, from the oxide semiconductor.

In this embodiment, in the manufacturing process of the transistor 640, a conductive layer provided over a gate electrode layer, an insulating layer, and sidewall insulating layers are removed by chemical mechanical polishing treatment, so that the conductive film is divided; thus, a source electrode layer and a drain electrode layer are formed.

Thus, a distance between the gate electrode layer and the region where the source electrode layer or the drain electrode layer is in contact with the oxide semiconductor layer (a contact region) can be shortened; therefore, the resistance between the gate electrode layer and the region where the source electrode layer or the drain electrode layer is in contact with the oxide semiconductor layer (a contact region) can be reduced, so that on characteristics of transistor 640 can be improved.

In the step of removing the conductive layer over the gate electrode layer for forming the source electrode layer and the drain electrode layer, etching treatment with use of a resist mask is not performed, so that a minute process can be precisely performed. Thus, in the manufacturing process of the semiconductor device, the transistor 640 having less variation in shapes and characteristics and a minute structure can be manufactured with high yield.

An inorganic insulating material is used for the insulating layer 631, the interlayer insulating layer 632, and the insulating layer 633. For example, a single-layer structure or a stacked-layer structure including any of oxide insulating materials such as silicon oxide, silicon oxynitride, aluminum oxide, and aluminum oxynitride; and nitride insulating materials such as silicon nitride, silicon nitride oxide layer, aluminum nitride, and aluminum nitride oxide can be used.

For a reduction in surface roughness, an insulating layer functioning as a planarization insulating layer is preferably used as the interlayer insulating layer 634. For the interlayer insulating layer 634, an organic insulating material having heat resistance such as a polyimide resin, an acrylic resin, a benzocyclobutene resin, a polyamide resin, or an epoxy resin can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

With detection of light that enters the photodiode 602, data on an object to be detected can be read. Note that a light source such as a backlight can be used at the time of reading data on an object.

As described above, a miniaturized and highly integrated semiconductor device having high electric characteristics and a method for manufacturing the semiconductor device can be provided.

This embodiment can be implemented in appropriate combination with the structures described in the other embodiments.

(Embodiment 6)

In this embodiment, the cases where the semiconductor device described in any of the above embodiments is applied to an electronic device will be described with reference to FIGS. 23A to 23F. In this embodiment, the semiconductor device described in any of the above embodiments is applied to electronic devices such as a computer, a mobile phone (also referred to as a cellular phone or a mobile phone device), a personal digital assistant (including a portable game machine, an audio reproducing device, and the like), a digital camera, a digital video camera, an electronic paper, and a television device (also referred to as a television or a television receiver).

Figure 23A:
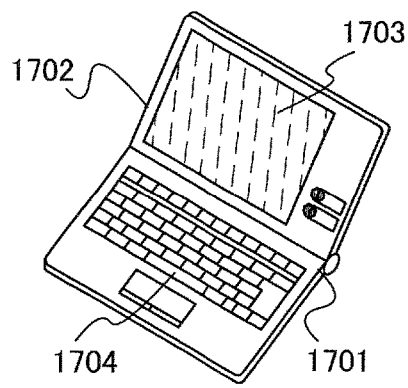
FIGS. 23A to 23F illustrate examples of electronic devices.

FIG. 23A is a laptop personal computer including a housing 1701, a housing 1702, a display portion 1703, a keyboard 1704, and the like. The semiconductor devices described in any of the above embodiments are provided in the housing 1701 and the housing 1702. Thus, a highly reliable laptop personal computer in which writing and reading of data are performed at high speed and power consumption is sufficiently reduced can be achieved.

Figure 23D:
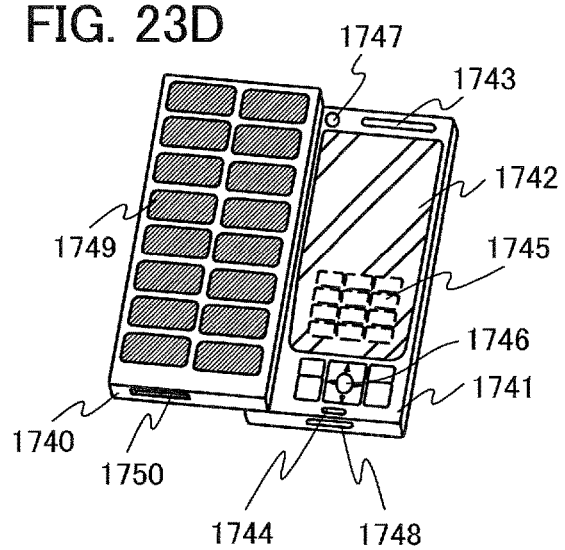
Figure 23B:
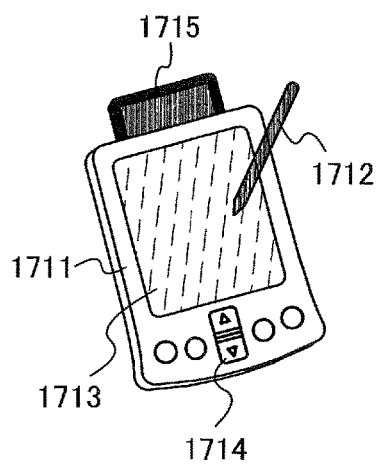

FIG. 23B illustrates a personal digital assistant (PDA) in which a main body 1711 is provided with a display portion 1713, an external interface 1715, operation buttons 1714, and the like. Further, a stylus 1712 for operation of the personal digital assistant, and the like are provided. In the main body 1711, the semiconductor device described in any of the above embodiments is provided. Therefore, a highly reliable personal digital assistant in which writing and reading of data are performed at high speed and power consumption is sufficiently reduced can be achieved.

Figure 23E:
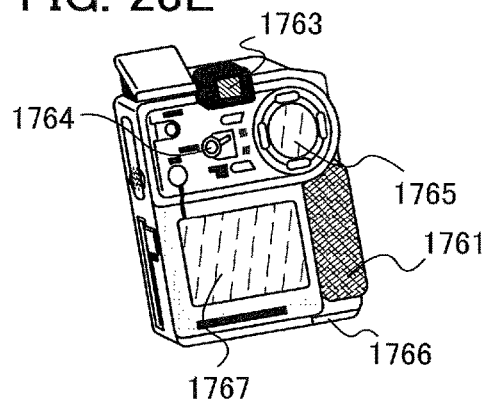
Figure 23C:
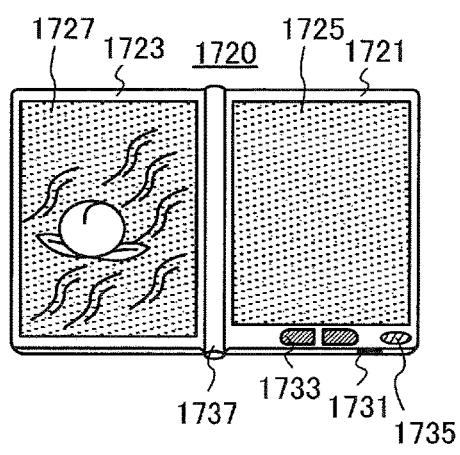

FIG. 23C is an e-book reader 1720 mounted with electronic paper, which includes two housings, a housing 1721 and a housing 1723. The housing 1721 and the housing 1723 are provided with a display portion 1725 and a display portion 1727, respectively. The housing 1721 is connected to the housing 1723 by a hinge 1737, so that the e-book reader can be opened and closed using the hinge 1737 as an axis. The housing 1721 is provided with a power switch 1731, an operation key 1733, a speaker 1735, and the like. In at least one of the housings 1721 and 1723, the semiconductor device described in any of the above embodiments is provided. Therefore, a highly reliable e-book reader in which writing and reading of data are performed at high speed and power consumption is sufficiently reduced can be achieved.

FIG. 23D is a mobile phone including two housings, a housing 1740 and a housing 1741. Further, the housings 1740 and 1741 in a state where they are developed as illustrated in FIG. 23D can shift by sliding to a state where one is lapped over the other; therefore, the size of the mobile phone can be reduced, which makes the mobile phone suitable for being carried. The housing 1741 includes a display panel 1742, a speaker 1743, a microphone 1744, a touch panel 1745, a pointing device 1746, a camera lens 1747, an external connection terminal 1748, and the like. The housing 1740 includes a solar cell 1749 for charging the mobile phone, an external memory slot 1750, and the like. In addition, an antenna is incorporated in the housing 1741. The semiconductor device described in the above embodiment is provided in at least one of the housings 1740 and 1741. Therefore, a highly reliable mobile phone in which data writing and data reading are performed at high speed and power consumption is sufficiently low can be achieved.

FIG. 23E is a digital camera including a main body 1761, a display portion 1767, an eyepiece 1763, an operation switch 1764, a display portion 1765, a battery 1766, and the like. The semiconductor device described in any of the above embodiments is provided in the main body 1761. Therefore, a highly reliable digital camera in which data writing and data reading are performed at high speed and power consumption is sufficiently low can be achieved.

Figure 23F:
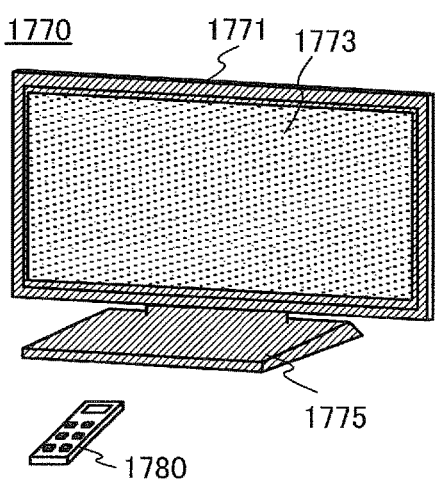

FIG. 23F is a television device 1770 including a housing 1771, a display portion 1773, a stand 1775, and the like. The television device 1770 can be operated by an operation switch of the housing 1771 or a remote controller 1780. The semiconductor device described in the above embodiment is mounted in the housing 1771 and the remote controller 1780. Therefore, a highly reliable television device in which data writing and data reading are performed at high speed and power consumption is sufficiently low can be achieved.

As described above, the semiconductor device according to the above embodiment is mounted on the electronic devices described in this embodiment. Therefore, highly reliable electronic devices with low power consumption can be achieved.

This embodiment can be implemented in appropriate combination with the structures described in the other embodiments.

EXAMPLE 1

An effect of cleaning treatment with use of hydrofluoric acid for removing impurities attached to an oxide semiconductor layer was evaluated, and in this example, the evaluation results are shown. Example Samples 1 to 4 in each of which a silicon oxide layer and an oxide semiconductor layer were formed in this order over a silicon wafer were prepared. Example Sample 1 is a reference sample in which the oxide semiconductor layer was not processed (unprocessed sample). In Example Sample 2, only dry etching was performed on the oxide semiconductor layer. In Example Sample 3, dry etching was performed, and then wet etching was performed for 30 seconds with use of hydrofluoric acid diluted to a concentration of 0.0025%. In Example Sample 4, dry etching was performed, and then wet etching was performed for 3 seconds with use of hydrofluoric acid diluted to a concentration of 0.5%.

With respect to Example Samples 1 to 4, the impurity concentrations in the oxide semiconductor layers were analyzed with SIMS, whereby effects of cleaning treatment with use of hydrofluoric acid were evaluated.

Next, manufacturing methods of Example Samples 1 to 4 are described. First, common steps between Example Samples 1 to 4 are described.

First, a 300-nm-thick silicon oxide layer was formed over a silicon substrate by a sputtering method with use of a silicon oxide target. The sputtering conditions were as follows: a sputtering gas was a mixed gas of argon and oxygen ($Ar:O_2=25$ sccm:25 sccm); the pressure was 0.4 Pa; the power was 5 kW; and the substrate temperature was 100° C.

Next, over the silicon oxide layer, a 100-nm-thick first IGZO layer was formed by a sputtering method with use of an oxide target containing In, Ga, and Zn (=3:1:2 [atomic ratio]). The sputtering conditions were as follows: a sputtering gas was a mixed gas of argon and oxygen ($Ar:O_2=30$ sccm:15 sccm); the pressure was 0.4 Pa; the power was 0.5 kW; and the substrate temperature was 200° C.

Next, each of the first IGZO layers of Example Samples 2 to 4 were subjected to dry etching with an inductively coupled plasma (ICP) etching method. The dry etching conditions were as follows: an etching gas was boron trichloride and chlorine ($BCl_3:Cl_2=60$ sccm:20 sccm); the power was 450 W; the bias power was 100 W; and the pressure was 1.9 Pa.

Next, each of the first IGZO layers of Example Samples 3 and 4 were subjected to wet etching with use of hydrofluoric acid. With respect to Example Sample 3, with use of hydrofluoric acid diluted to a concentration of 0.0025%, wet etching was performed for 30 seconds. With respect to Example Sample 4, with use of hydrofluoric acid diluted to a concentration of 0.5%, wet etching was performed for 3 seconds.

Then, on each of surfaces of Example Samples 1 to 4, a 100-nm-thick second IGZO layer was formed as a protective layer under the same conditions as those of the first IGZO layer, in order to prevent contamination of the surfaces of the samples.

Example Samples 1 to 4 manufactured in the above manner were subjected to SIMS analysis, so that the concentrations of boron (B), chlorine (CO, aluminum (Al), and fluorine (F) in the IGZO layers were examined. Note that B and Cl are constituent elements of the etching gas, Al is a constituent element of a treatment chamber of dry etching, and F is a constituent element of hydrofluoric acid.

FIG. 13, FIG. 14, FIG. 15, and FIG. 16 show SIMS analysis results. In each of FIGS. 13 to 16, the horizontal axis represents the depth from the surfaces of samples. A value of 0 nm corresponds to a position of the outermost surfaces of the samples (the outermost surfaces of the second IGZO layers). Note that in each of FIGS. 13 to 16, the range of depth shown in the horizontal axis is from 60 nm to 140 nm in order to clearly show the analysis results. The vertical axis represents the concentration of the analyzed element at a specific depth on a logarithmic scale.

In each of FIGS. 13 to 16, an interface between the first IGZO layer and the second IGZO layer exists at a depth of approximately 100 nm. In this example, this interface refers to as a surface of the first IGZO layer. Further, a region 701 shows an element concentration profile in the first IGZO layer, and a region 702 shows an element concentration profile in the second IGZO layer. Note that each element concentration profile was quantified by using a standard sample which was manufactured with an IGZO layer.

In FIGS. 13 to 16, element concentration profiles 711, 721, 731, and 741 each represent an element concentration profile of Example Sample 1. Element concentration profiles 712, 722, 732, and 742 each represent an element concentration profile of Example Sample 2. Element concentration profiles 713, 723, 733, and 743 each represent an element concentration profile of Example Sample 3. Element concentration profiles 714, 724, 734, and 744 each represent an element concentration profile of Example Sample 4. Note that by SIMS analysis, an absolute estimation of the concentration at the interface cannot be performed in some cases, but a relative estimation can be performed.

Figure 13:
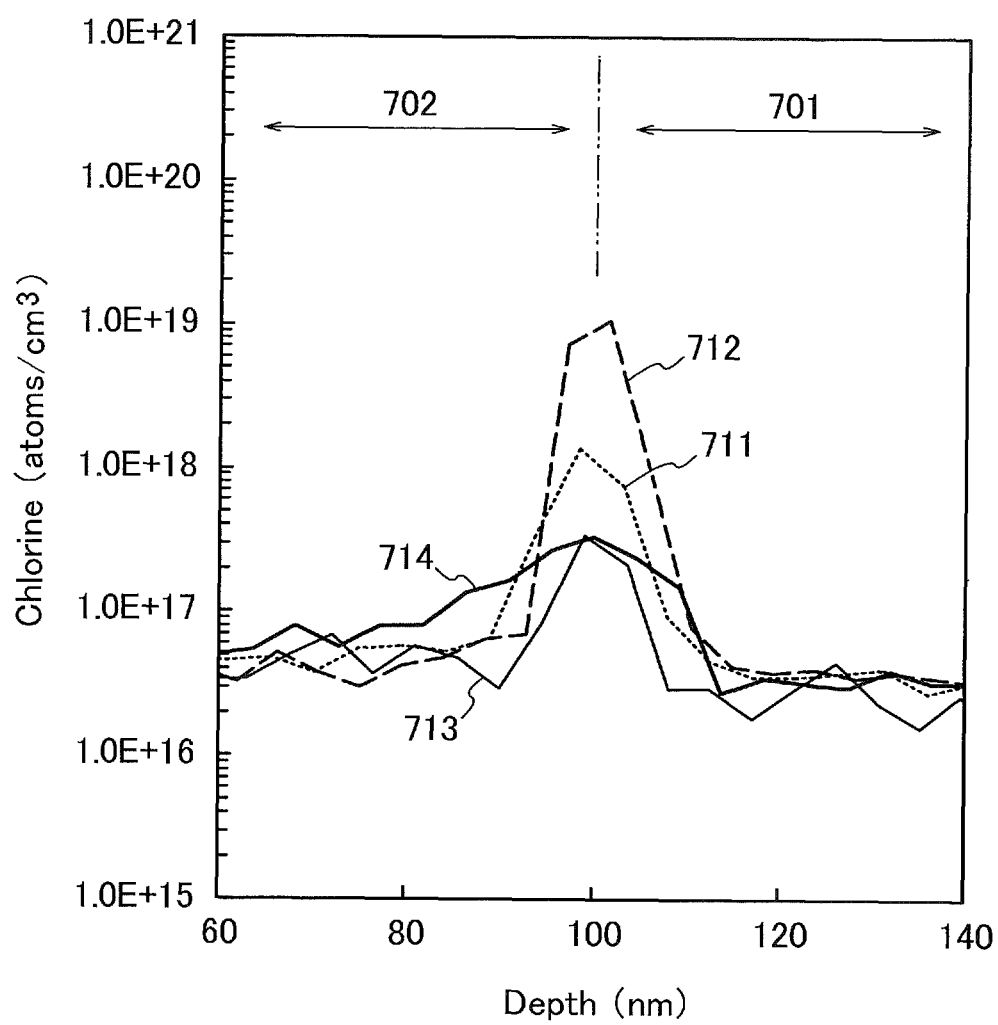
FIG. 13 is a graph showing SIMS analysis results.

FIG. 13 shows analysis results of chlorine concentration in the first and second IGZO layers. In each of Example Samples 1 to 4, the chlorine concentration was drastically increased in the vicinity of the surface of the first IGZO layer. In the vicinity of the surfaces of the first IGZO layers of Example Samples 1 to 4, the following highest concentrations (peak values) were obtained: about $1.4 \times 10^{18}$ atoms/$cm^3$ in Example Sample 1 (element concentration profile 711); about $1.1 \times 10^{19}$ atoms/$cm^3$ in Example Sample 2 (element concentration profile 712); about $3.4 \times 10^{17}$ atoms/$cm^3$ in Example Sample 3 (element concentration profile 713); and about $3.3 \times 10^{17}$ atoms/$cm^3$ in Example Sample 4 (element concentration profile 714). The values estimated as chlorine concentrations in the regions 701 and 702 other than the vicinity of the interface are just noise levels.

Figure 14:
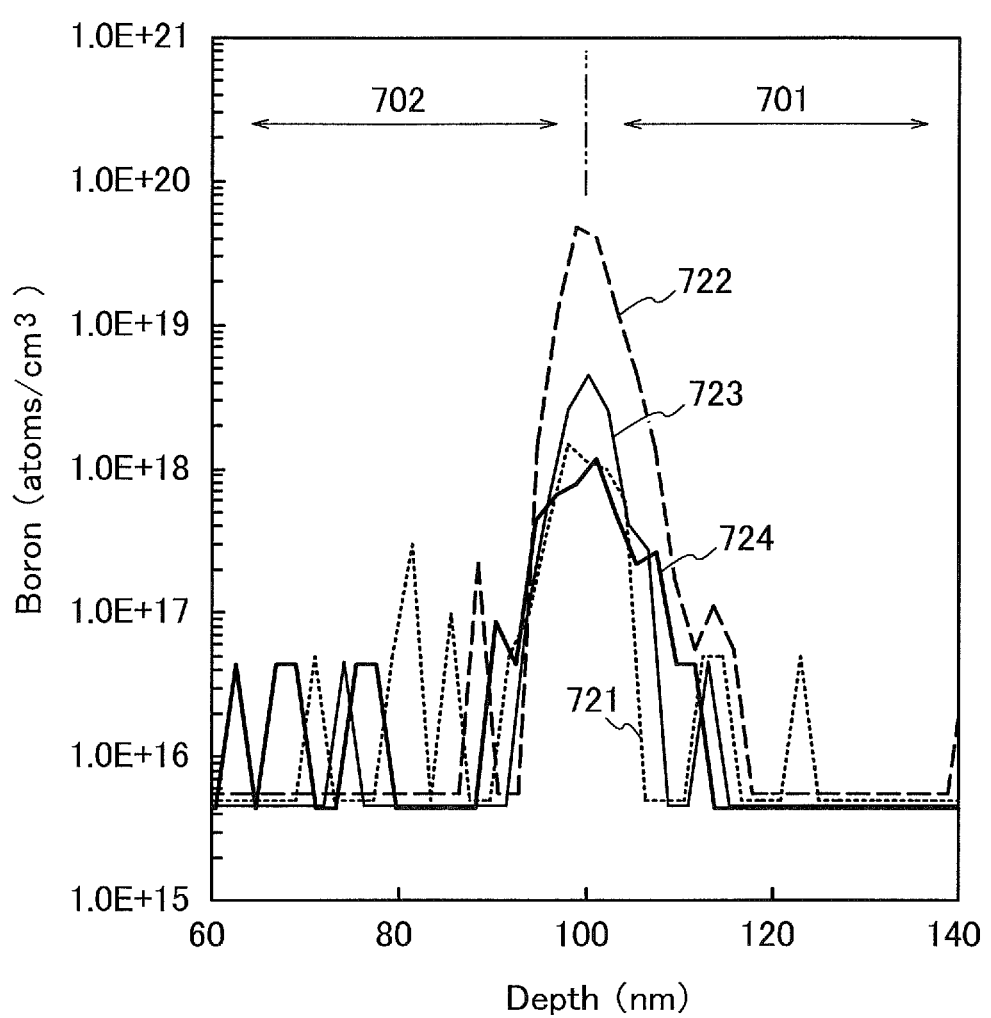
FIG. 14 is a graph showing SIMS analysis results.

FIG. 14 shows analysis results of boron concentration in the first and second IGZO layers. In each of Example Samples 1 to 4, the boron concentration was drastically increased in the vicinity of the surface of the first IGZO layer. In the vicinity of the surfaces of the first IGZO layers of Example Samples 1 to 4, the following highest concentrations (peak values) were obtained: about $1.5 \times 10^{18}$ atoms/$cm^3$ in Example Sample 1 (element concentration profile 721); about $4.8 \times 10^{20}$ atoms/$cm^3$ in Example Sample 2 (element concentration profile 722); about $4.5 \times 10^{18}$ atoms/$cm^3$ in Example Sample 3 (element concentration profile 723); and about $1.2 \times 10^{18}$ atoms/$cm^3$ in Example Sample 4 (element concentration profile 724). The values estimated as boron concentrations in the regions 701 and 702 other than the vicinity of the interface are just noise levels.

Figure 15:
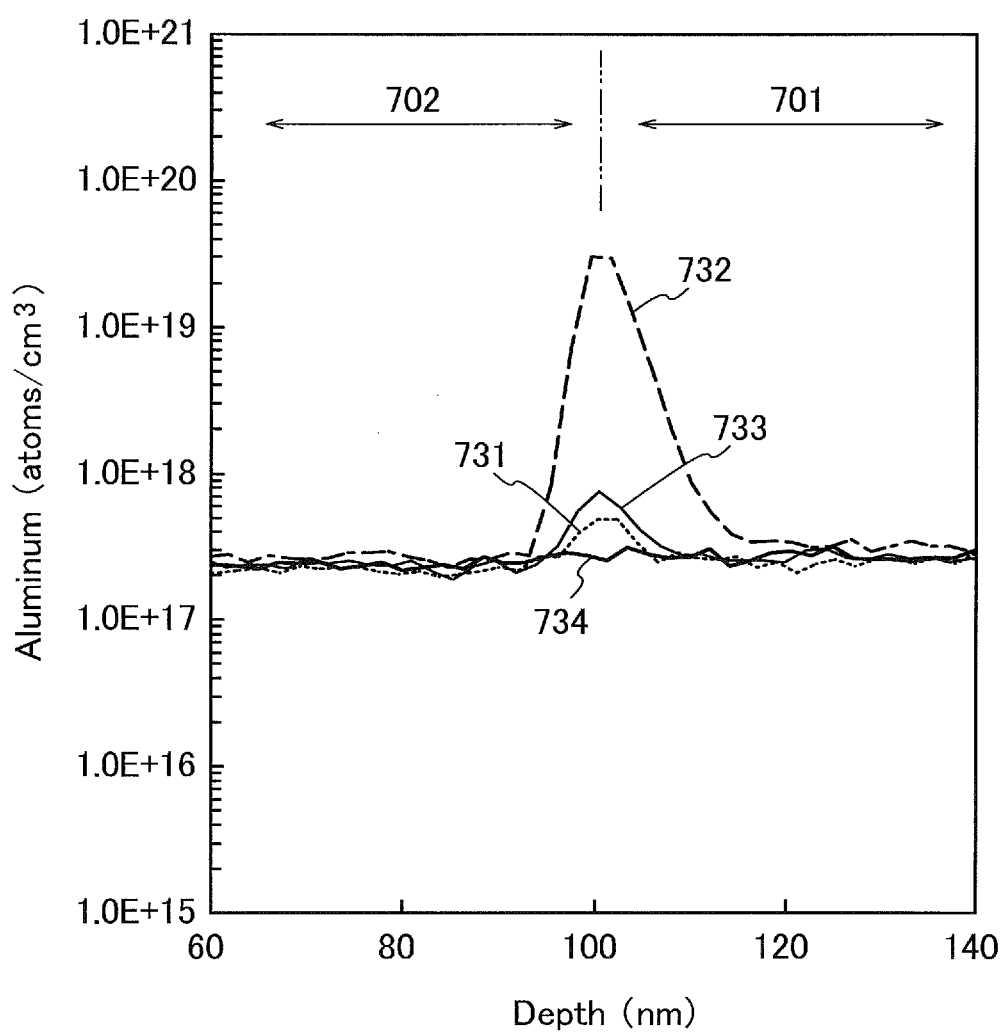
FIG. 15 is a graph showing SIMS analysis results.

FIG. 15 shows analysis results of aluminum concentration in the first and second IGZO layers. In each of Example Samples 1 to 3, the aluminum concentration was drastically increased in the vicinity of the surface of the first IGZO layer. In the vicinity of the surfaces of the first IGZO layers of Example Samples 1 to 3, the following highest concentrations (peak values) were obtained: about $4.9 \times 10^{17}$ atoms/$cm^3$ in Example Sample 1 (element concentration profile 731); about $3.0 \times 10^{19}$ atoms/$cm^3$ in Example Sample 2 (element concentration profile 732); and about $7.5 \times 10^{17}$ atoms/$cm^3$ in Example Sample 3 (element concentration profile 733). Note that in Example Sample 4, the element concentration profile 734 shows just a noise level value. The values estimated as aluminum concentrations in the regions 701 and 702 other than the vicinity of the interface are just noise levels.

Figure 16:
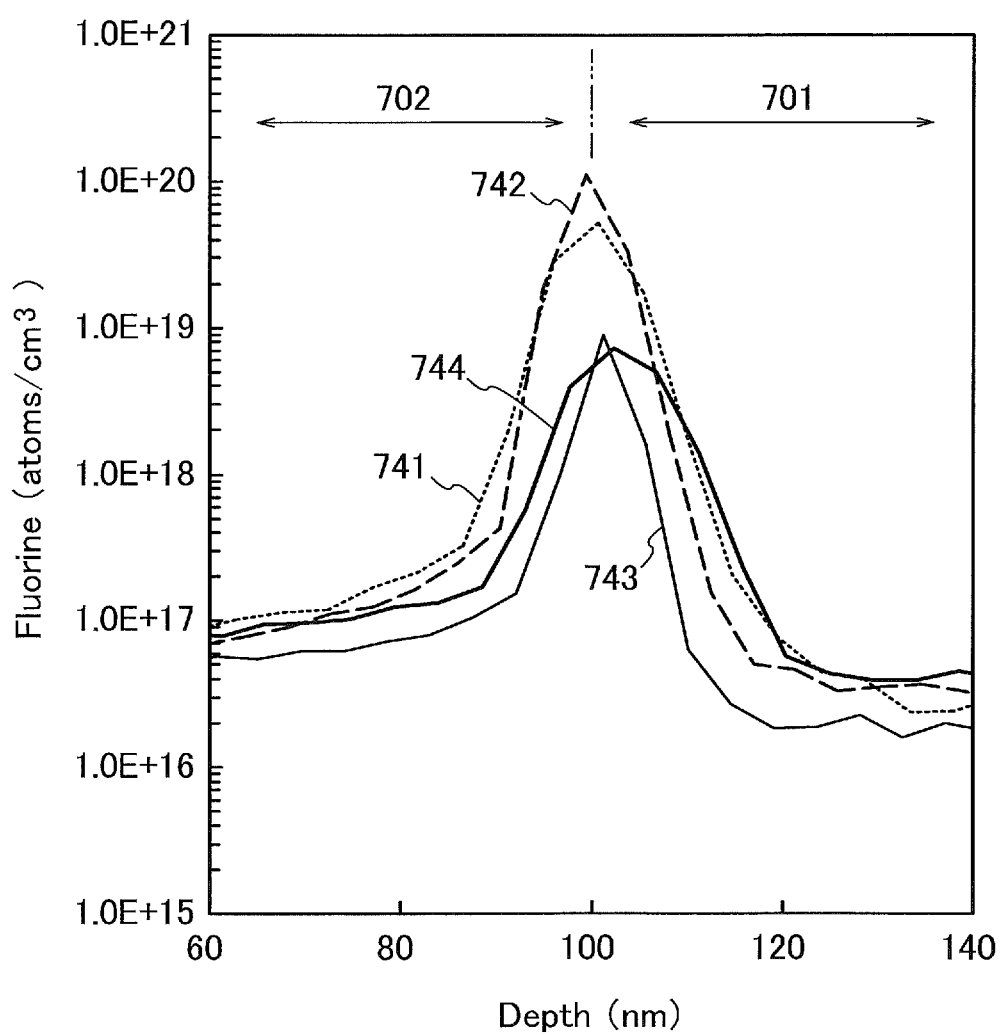
FIG. 16 is a graph showing SIMS analysis results.

FIG. 16 shows analysis results of fluorine concentration in the first and second IGZO layers. In each of Example Samples 1 to 4, the fluorine concentration was drastically increased in the vicinity of the surface of the first IGZO layer. In the vicinity of the surfaces of the first IGZO layers of Example Samples 1 to 4, the following highest concentrations (peak values) were obtained: about $5.2 \times 10^{19}$ atoms/cm$^3$ in Example Sample 1 (element concentration profile 741); about $1.1 \times 10^{20}$ atoms/cm$^3$ in Example Sample 2 (element concentration profile 742); about $8.9 \times 10^{18}$ atoms/cm$^3$ in Example Sample 3 (element concentration profile 743); and about $7.2 \times 10^{18}$ atoms/cm$^3$ in Example Sample 4 (element concentration profile 744). The values estimated as fluorine concentrations in the regions 701 and 702 other than the vicinity of the interface are just noise levels.

The above SIMS analysis results mean that the amount of chlorine, boron, aluminum, and fluorine on the surface of the first IGZO layer was increased due to dry etching, and that the amount of chlorine, boron, aluminum, and fluorine was reduced or removed by treatment with hydrofluoric acid, which was performed after the dry etching. Further, the fluorine concentrations of the samples subjected to the treatment with hydrofluoric acid (Example Samples 3 and 4) were lower than the fluorine concentration of the unprocessed sample (Example Sample 1). This result indicates that an effect of removal of fluorine is greater than an effect of attachment of fluorine due to the hydrofluoric acid treatment.

It is found that impurity elements attached to the surface of the oxide semiconductor layer can be removed by cleaning treatment with use of hydrofluoric acid.

EXAMPLE 2

An effect of cleaning treatment with use of ITO-07N (produced by KANTO CHEMICAL CO., INC.) for removing impurities attached to an oxide semiconductor layer was evaluated, and in this example, the evaluation results are shown. ITO-07N is a solution containing 5 wt % oxalic acid. Example Samples 1 to 3 in each of which a silicon oxide layer and an oxide semiconductor layer were formed in this order over a silicon wafer were prepared. Example Sample 1 is a reference sample in which the oxide semiconductor layer was not processed (unprocessed sample). In Example Sample 2, only dry etching was performed on the oxide semiconductor layer. In Example Sample 3, dry etching was performed, and then wet etching was performed for 30 seconds with use of ITO-07N diluted with pure water 100 times.

With respect to Example Samples 1 to 3, the impurity concentrations in the oxide semiconductor layers were analyzed with SIMS, whereby effects of cleaning treatment with use of ITO-07N were evaluated.

Next, manufacturing methods of Example Samples 1 to 3 are described. First, common steps between Example Samples 1 to 3 are described.

First, a 300-nm-thick silicon oxide layer was formed over a silicon substrate by a sputtering method with use of a silicon oxide target. The sputtering conditions were as follows: a sputtering gas was a mixed gas of argon and oxygen (Ar:O$_2$=25 sccm:25 sccm); the pressure was 0.4 Pa; the power was 5 kW; and the substrate temperature was 100° C.

Next, over the silicon oxide layer, a 100-nm-thick first IGZO layer was formed by a sputtering method with use of an oxide target containing In, Ga, and Zn (=3:1:2 [atomic ratio]). The sputtering conditions were as follows: a sputtering gas was a mixed gas of argon and oxygen (Ar:O$_2$=30 sccm:15 sccm); the pressure was 0.4 Pa; the power was 0.5 kW; and the substrate temperature was 200° C.

Next, each of the first IGZO layers of Example Samples 2 and 3 were subjected to dry etching with an inductively coupled plasma (ICP) etching method. The dry etching conditions were as follows: an etching gas was boron trichloride and chlorine (BCl$_3$:Cl$_2$=60 sccm:20 sccm); the power was 450 W; the bias power was 100 W; and the pressure was 1.9 Pa.

Next, the first IGZO layer of the Example Sample 3 was subjected to wet etching for 30 seconds with use of ITO-07N diluted with pure water 100 times.

Then, on each of surfaces of Example Samples 1 to 3, a 100-nm-thick second IGZO layer was formed as a protective layer under the same conditions as those of the first IGZO layer, in order to prevent contamination of the surfaces of the samples.

Example Samples 1 to 3 manufactured in the above manner were subjected to SIMS analysis, so that the concentrations of boron (B), chlorine (CO, aluminum (Al), and carbon (C) in the IGZO layers were examined. Note that B and Cl are constituent elements of the etching gas, Al is a constituent element of a treatment chamber of dry etching, and C is a constituent element of ITO-07N (oxalic acid).

FIG. 17, FIG. 18, FIG. 19, and FIG. 20 show SIMS analysis results. In each of FIGS. 17 to 20, the horizontal axis represents the depth from the surfaces of samples. A value of 0 nm corresponds to a position of the outermost surfaces of the samples (the outermost surfaces of the second IGZO layers). Note that in each of FIGS. 17 to 20, the range of depth shown in the horizontal axis is from 60 nm to 140 nm in order to clearly show the analysis results. The vertical axis represents the concentration of the analyzed element at a specific depth on a logarithmic scale.

In each of FIGS. 17 to 20, an interface between the first IGZO layer and the second IGZO layer exists at a depth of approximately 100 nm. In this example, this interface refers to as a surface of the first IGZO layer. Further, a region 701 shows an element concentration profile in the first IGZO layer, and a region 702 shows an element concentration profile in the second IGZO layer. Note that each element concentration profile was quantified by using a standard sample which was manufactured with an IGZO layer.

In FIGS. 17 to 20, element concentration profiles 751, 761, 771, and 781 each represent the element concentration profile of Example Sample 1. Element concentration profiles 752, 762, 772, and 782 each represent the element concentration profile of Example Sample 2. Element concentration profiles 753, 763, 773, and 783 each represent the element concentration profile of Example Sample 3. Note that by SIMS analysis, an absolute estimation of the concentration at the interface cannot be performed in some cases, but a relative estimation can be performed.

Figure 17:
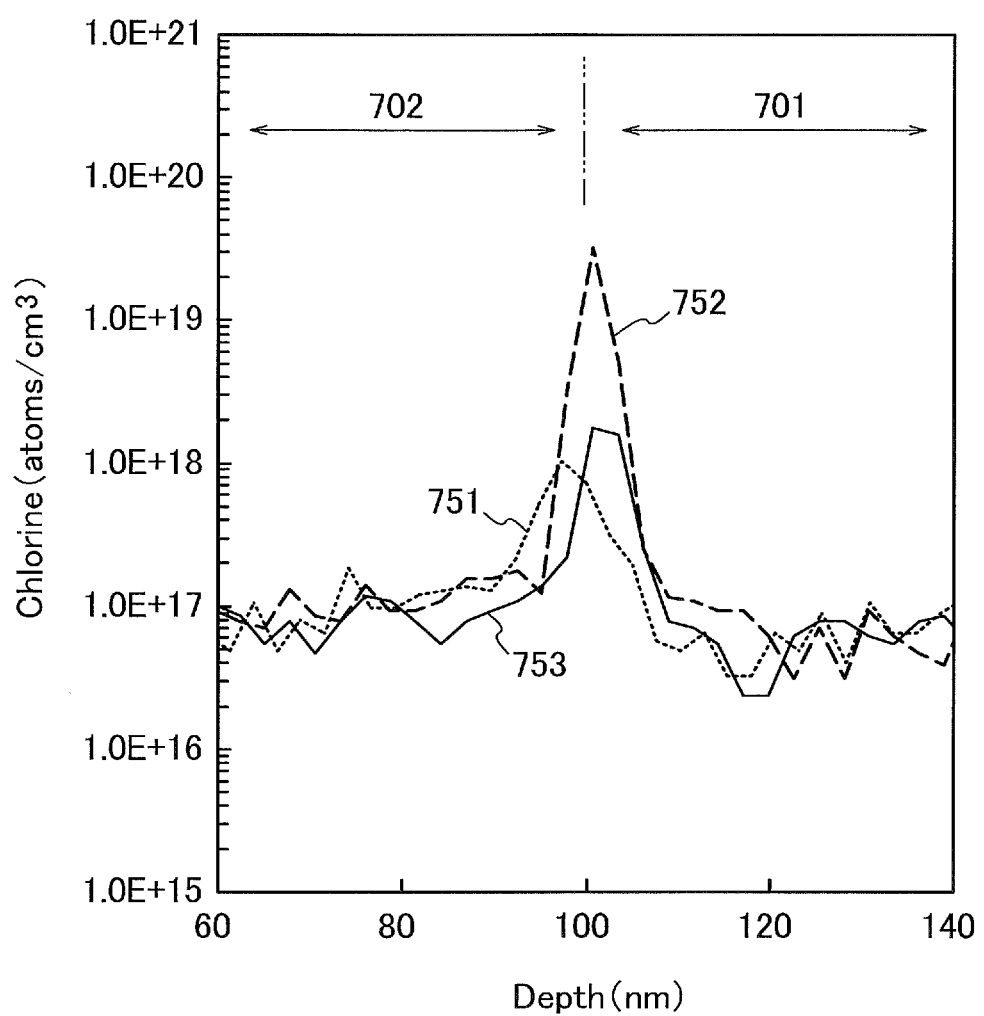
FIG. 17 is a graph showing SIMS analysis results.

FIG. 17 shows analysis results of chlorine concentration in the first and second IGZO layers. In each of Example Samples 1 to 3, the chlorine concentration was drastically increased in the vicinity of the surface of the first IGZO layer. In the vicinity of the surfaces of the first IGZO layers of Example Samples 1 to 3, the following highest concentrations were obtained: about $1.0 \times 10^{18}$ atoms/cm$^3$ in Example Sample 1 (element concentration profile 751); about $3.2 \times 10^{19}$ atoms/cm$^3$ in Example Sample 2 (element concentration profile 752); and about $1.8 \times 10^{18}$ atoms/cm$^3$ in Example Sample 3 (element concentration profile 753). The values estimated as chlorine concentrations in the regions 701 and 702 other than the vicinity of the interface are just noise levels.

Figure 18:
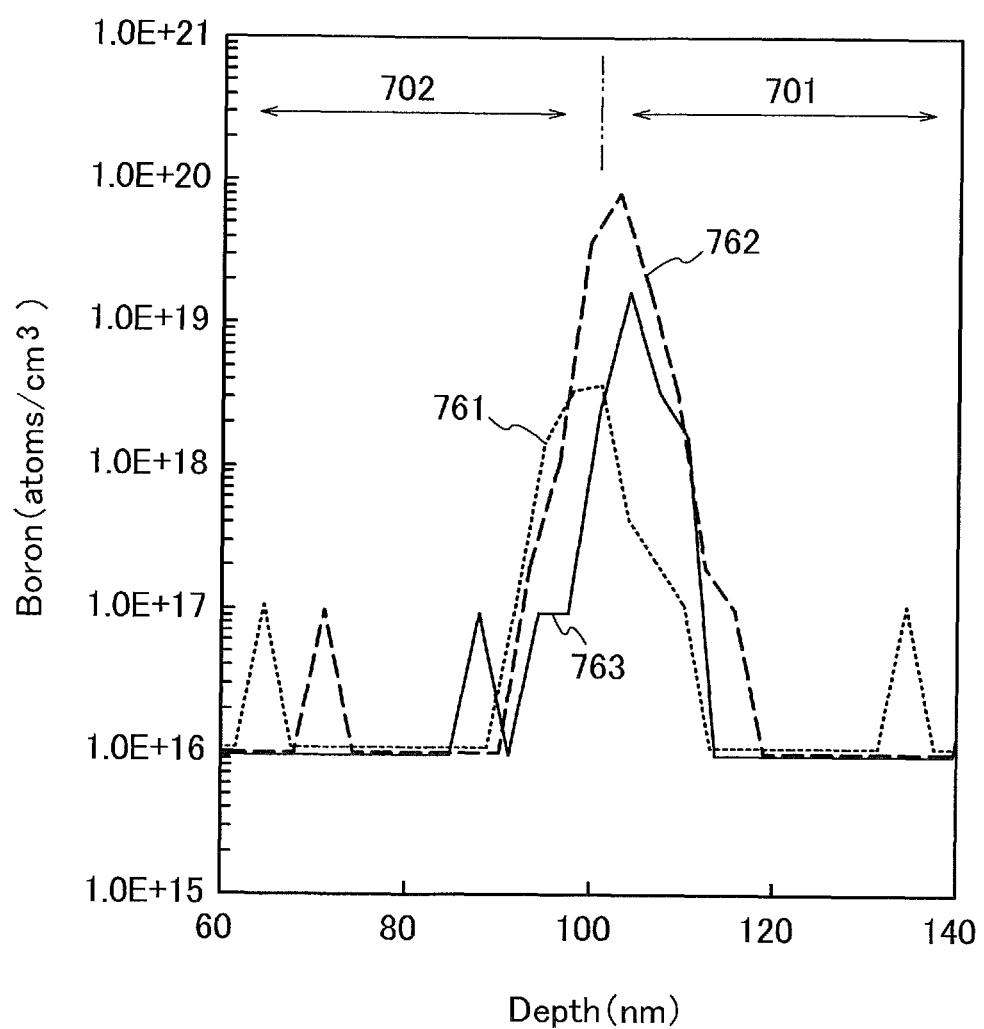
FIG. 18 is a graph showing SIMS analysis results.

FIG. 18 shows analysis results of boron concentration in the first and second IGZO layers. In each of Example Samples 1 to 3, the boron concentration was drastically increased in the vicinity of the surface of the first IGZO layer. In the vicinity of the surfaces of the first IGZO layers of Example Samples 1 to 3, the following highest concentrations were obtained: about $3.7\times10^{18}$ atoms/cm$^3$ in Example Sample 1 (element concentration profile 761); about $8.1\times10^{19}$ atoms/cm$^3$ in Example Sample 2 (element concentration profile 762); and about $1.6\times10^{19}$ atoms/cm$^3$ in Example Sample 3 (element concentration profile 763). The values estimated as boron concentrations in the regions 701 and 702 other than the vicinity of the interface are just noise levels.

Figure 19:
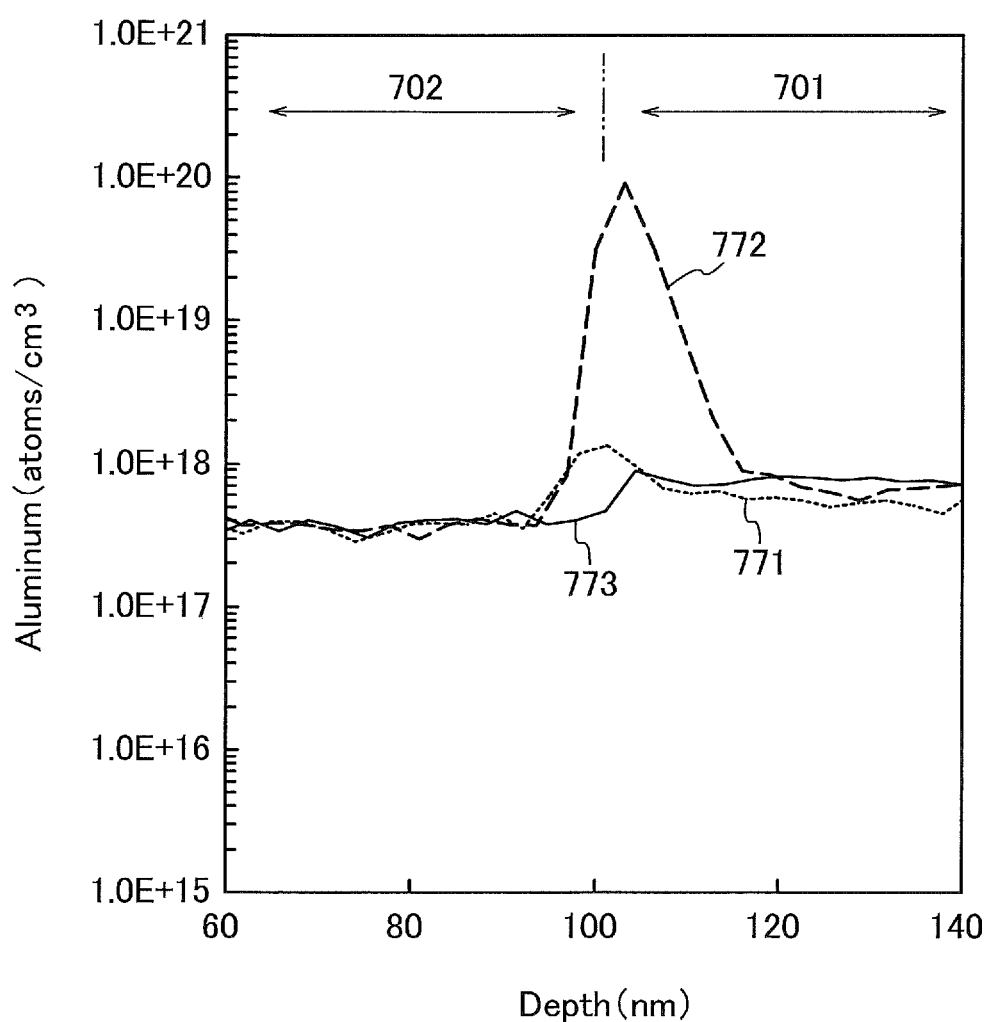
FIG. 19 is a graph showing SIMS analysis results.

FIG. 19 shows analysis results of aluminum concentration in the first and second IGZO layers. In each of Example Samples 1 to 3, the aluminum concentration was drastically increased in the vicinity of the surface of the first IGZO layer. In the vicinity of the surfaces of the first IGZO layers of Example Samples 1 to 3, the following highest concentrations were obtained: about $1.3\times10^{18}$ atoms/cm$^3$ in Example Sample 1 (element concentration profile 771); about $9.1\times10^{19}$ atoms/cm$^3$ in Example Sample 2 (element concentration profile 772); and about $8.8\times10^{17}$ atoms/cm$^3$ in Example Sample 3 (element concentration profile 773). The values estimated as aluminum concentrations in the regions 701 and 702 other than the vicinity of the interface are just noise levels.

Figure 20:
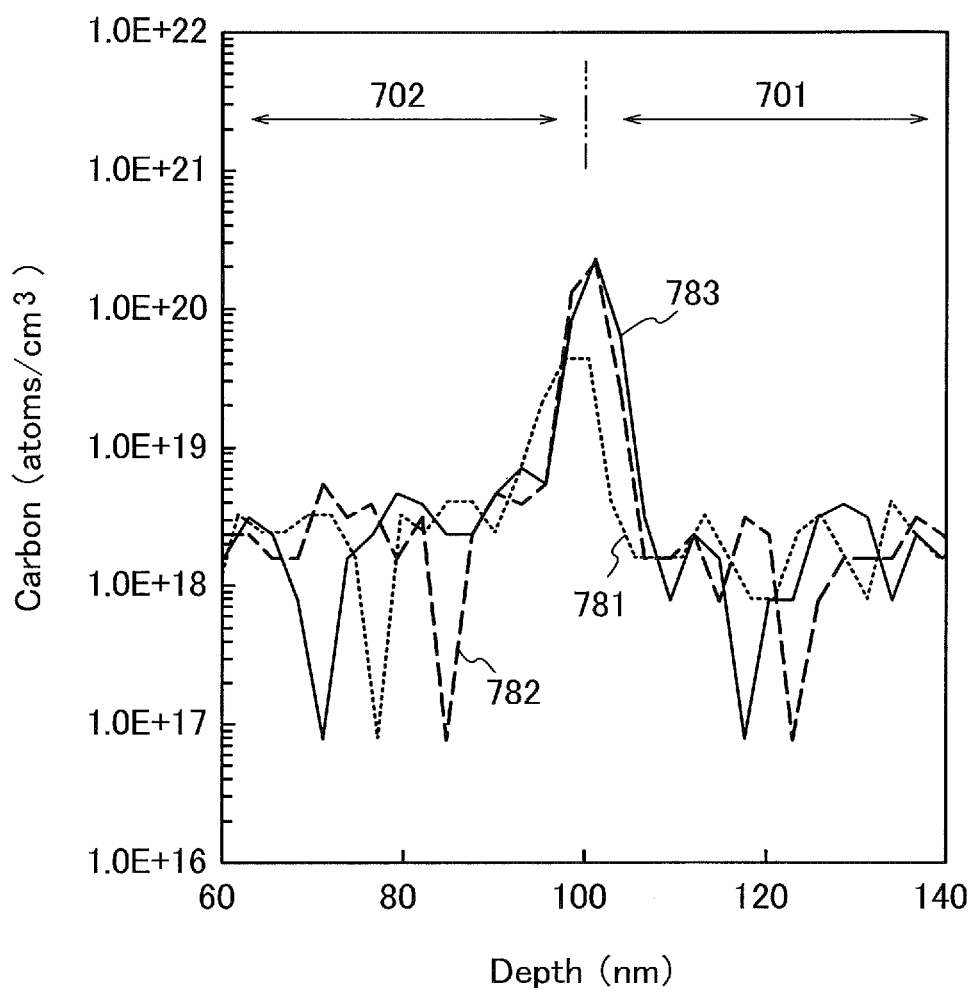
FIG. 20 is a graph showing SIMS analysis results.

FIG. 20 shows analysis results of carbon concentration in the first and second IGZO layers. In each of Example Samples 1 to 3, the carbon concentration was drastically increased in the vicinity of the surface of the first IGZO layer. In the vicinity of the surfaces of the first IGZO layers of Example Samples 1 to 3, the following highest concentrations were obtained: about $4.4\times10^{19}$ atoms/cm$^3$ in Example Sample 1 (element concentration profile 781); about $2.2\times10^{20}$ atoms/cm$^3$ in Example Sample 2 (element concentration profile 782); and about $2.3\times10^{20}$ atoms/cm$^3$ in Example Sample 3 (element concentration profile 783). The values estimated as carbon concentrations in the regions 701 and 702 other than the vicinity of the interface are just noise levels.

The above SIMS analysis results mean that the amount of chlorine, boron, aluminum, and carbon on the surface of the first IGZO layer was increased due to dry etching, and that the amount of chlorine, boron, and aluminum was reduced or removed by treatment with ITO-07N diluted with pure water 100 times, which was performed after the dry etching. Further, the amount of carbon, which had been increased due to dry etching, was hardly changed even after the above cleaning treatment. Thus, it is found that the impurity elements attached to the surface of the oxide semiconductor layer can be removed without an increase in the amount of carbon due to the cleaning treatment with use of ITO-07N.

EXAMPLE 3

In this example, transistors described in Embodiment 1 were manufactured as an example transistor 501 and an example transistor 502, and electric characteristics thereof were examined. In the example transistor 501, the island-shaped oxide semiconductor layer was formed, and then cleaning treatment with use of diluted hydrofluoric acid was not performed before the gate insulating layer was formed. In the example transistor 502, the island-shaped oxide semiconductor layer was formed, and then cleaning treatment with use of diluted hydrofluoric acid was performed before the gate insulating layer was formed.

As the example transistor 501 and the example transistor 502, transistors which have a structure similar to that of the transistor 440*a* were manufactured by the manufacturing method described in Embodiment 1. Manufacturing methods of the example transistor 501 and the example transistor 502 are described below.

First, a single crystal silicon substrate was prepared as the substrate 400, and a 300-nm-thick silicon oxide layer was formed as the oxide insulating layer 436 by a sputtering method over the substrate 400.

Next, a surface of the oxide insulating layer 436 was polished by a chemical mechanical polishing method, and then, oxygen with dosage of $1\times10^{16}$ ions/cm$^2$ was added to the oxide insulating layer 436 by an ion implantation method.

Next, over the oxide insulating layer 436, a 20-nm-thick IGZO layer was formed as an oxide semiconductor layer by a sputtering method with use of an oxide target containing In, Ga, and Zn (=3:1:2 [atomic ratio]).

Next, with a photolithography step, the oxide semiconductor layer was selectively etched, so that the island-shaped oxide semiconductor layer 403 was formed. In etching of the oxide semiconductor layer, the dry etching method described in Embodiment 1 was performed.

Next, with respect to only a sample which is to be the example transistor 502, as cleaning treatment with diluted hydrofluoric acid, wet etching treatment was performed for 30 seconds with use of hydrofluoric acid diluted to a concentration of 0.0025%.

Next, as the gate insulating layer 442, a 20-nm-thick silicon oxynitride layer was formed by a CVD method. As the gate electrode layer 401, a stacked layer of a 30-nm-thick tantalum nitride layer and a 135-nm-thick tungsten layer were formed over the gate insulating layer 442 by a sputtering method. As the insulating layer 413, a 200-nm-thick silicon oxynitride layer was formed over the gate electrode layer 401.

Then, with use of the gate electrode layer 401 and the insulating layer 413 as a mask, a phosphorus element with dosage of $1\times10^{15}$ ions/cm$^2$ was introduced into the oxide semiconductor layer 403 by an ion implantation method, so that the low-resistance regions 404*a* and 404*b* were formed.

Next, sidewall insulating layers 412*a* and 412*b* were formed using silicon oxynitride. With use of the sidewall insulating layers 412*a* and 412*b* as a mask, the gate insulating layer 442 was etched, so that the gate insulating layer 402 was formed.

Next, a 30-nm-thick tungsten layer was formed as the conductive layer 445, and a stacked layer of a 70-nm-thick aluminum oxide layer and a 460-nm-thick silicon oxynitride layer was formed as the insulating layer 446 over the tungsten layer.

Next, the insulating layer 446 and the conductive layer 445 were polished by a chemical mechanical polishing method, so that the source electrode layer 405*a*, the drain electrode layer 405*b*, and the interlayer insulating layer 415 were formed. Then, over the source electrode layer 405*a*, the drain electrode layer 405*b*, and the interlayer insulating layer 415, a 400-nm-thick silicon oxynitride layer was formed as the insulating layer 407 by a CVD method.

Next, heat treatment was performed at 400° C. for one hour in an atmosphere containing oxygen.

Next, openings reaching the source electrode layer 405*a* and the drain electrode layer 405*b* were formed in the interlayer insulating layer 415 and the insulating layer 407, and through the openings, the wiring layers 435*a* and 435*b* were formed using a 300-nm-thick tungsten layer.

Through the above steps, seven example transistors 501 and seven example transistors 502 were manufactured. Electric characteristics thereof were examined.

Figure 21A:
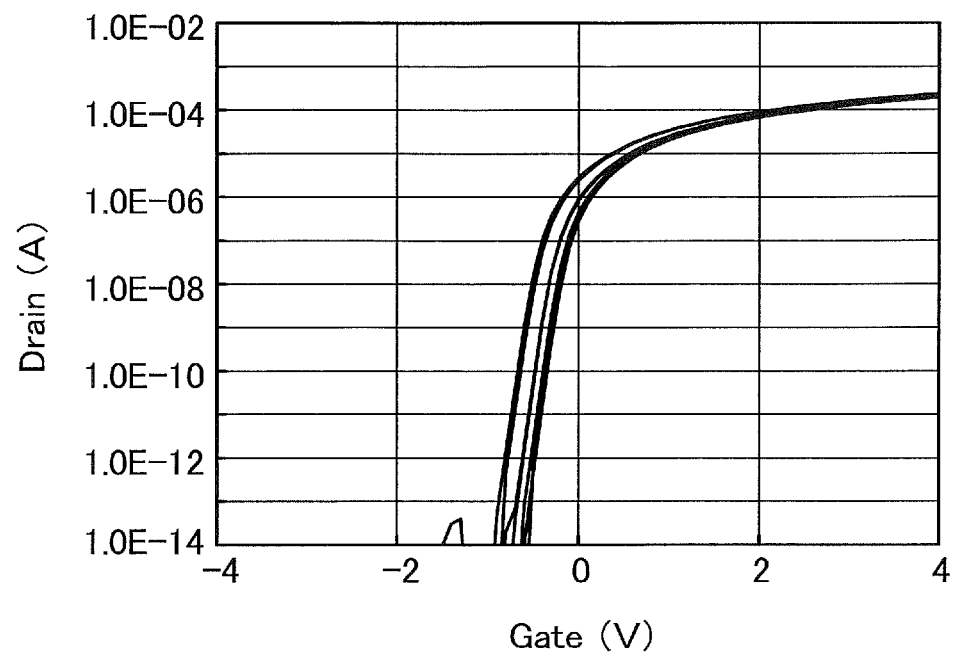
FIGS. 21A and 21B show electric characteristics of example transistors.
Figure 21B:
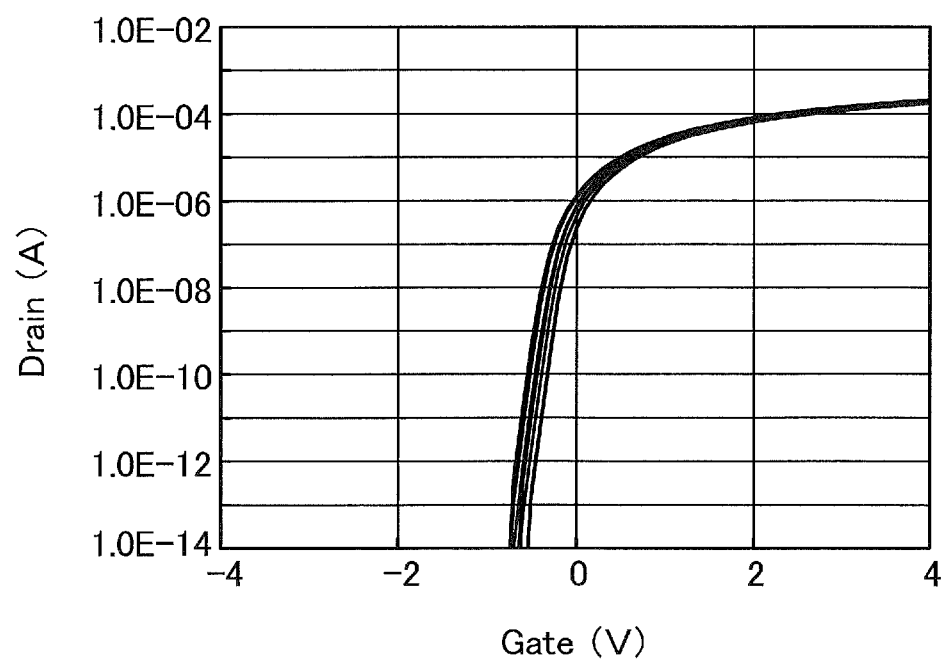

FIGS. 21A and 21B show measurement results of electric characteristics of the example transistors 501 and the example transistors 502. FIGS. 21A and 21B are graphs showing a change in drain current (Id) when the gate voltage (Vg) of the transistor is changed, which are also called Vg-Id characteristics.

In FIG. 21A, Vg-Id characteristics of the seven example transistors 501 are shown together. In FIG. 21B, Vg-Id characteristics of the seven example transistors 502 are shown together. In each of FIGS. 21A and 21B, the horizontal axis represents the gate voltage (Vg), and the vertical axis represents a value of the drain current (Id) on a logarithmic scale.

The Vg-Id characteristics shown in FIGS. 21A and 21B were measured under the following conditions: the source potential and the drain potential of the example transistors 501 and 502 were respectively 0 V and 1 V; and the gate voltages thereof were changed from −4 V to 4 V.

Table 1 shows threshold voltages of the seven example transistors 501 and the seven example transistors 502, which were calculated from the measurement results in FIGS. 21A and 21B. In Table 1, the threshold voltages of the seven example transistors 501 and the threshold voltages of the seven example transistors 502 are numbered as Sample Numbers 1 to 7.

TABLE 1

| Sample Number | Threshold Voltage (V) 501 | Threshold Voltage (V) 502 |
| --- | --- | --- |
| 1 | −0.18 | −0.22 |
| 2 | −0.07 | −0.23 |
| 3 | −0.11 | −0.05 |
| 4 | −0.19 | −0.10 |
| 5 | −0.38 | −0.15 |
| 6 | −0.09 | −0.05 |
| 7 | −0.34 | −0.16 |
| Average Value | −0.19 | −0.14 |
| Standard Deviation | 0.11 | 0.07 |

Figure 22:
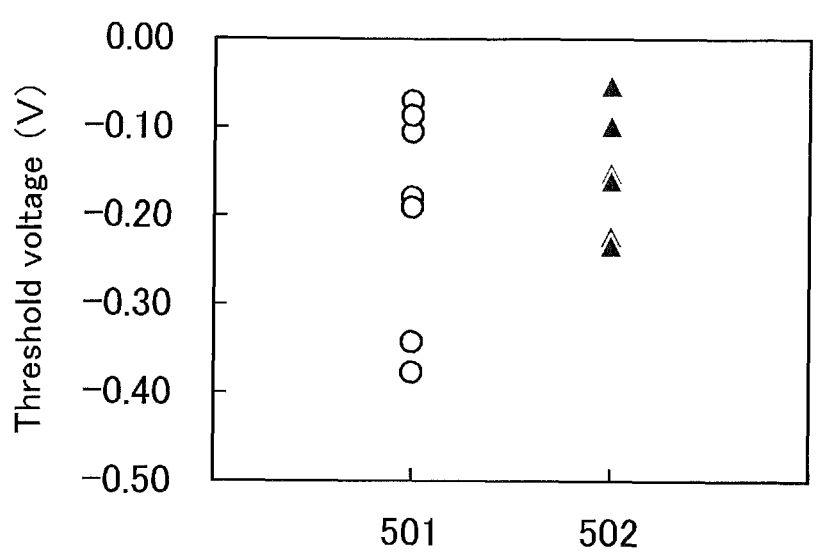
FIG. 22 shows variation in threshold values of example transistors.

FIG. 22 is a graph of the threshold voltages shown in Table 1, which shows variation in the threshold voltages of the seven example transistors 501 and variation in the threshold voltages of the seven example transistors 502. In FIG. 22, white circles represent the threshold voltages of the example transistors 501, and black triangles represent the threshold voltages of the example transistors 502.

As seen from FIGS. 21A and 21B, Table 1, and FIG. 22, variation in the threshold voltages of the example transistors 502 is smaller than variation in the threshold voltages of the example transistors 501. By performing cleaning treatment before the gate insulating layer is formed, electric characteristics of the transistor can be improved.

This application is based on Japanese Patent Application serial no. 2011-263027 filed with Japan Patent Office on Nov. 30, 2011, the entire contents of which are hereby incorporated by reference.

What is claimed is:

1. A method for manufacturing a semiconductor device comprising the steps of:
   forming an oxide semiconductor layer over an insulating surface;
   etching a part of the oxide semiconductor layer so that an island-shaped oxide semiconductor layer is formed;
   cleaning a top surface and a side surface of the island-shaped oxide semiconductor layer; and
   forming a source electrode layer and a drain electrode layer over the island-shaped oxide semiconductor layer after the cleaning step,
   wherein:
   the island-shaped oxide semiconductor layer includes a region in a vicinity of the top surface of the island-shaped oxide semiconductor layer,
   a concentration of chlorine in the region is lower than or equal to $3.4 \times 10^{17}$ atoms/cm$^3$ when being measured by secondary ion mass spectrometry after the cleaning step,
   a concentration of boron in the region is lower than or equal to $4.5 \times 10^{18}$ atoms/cm$^3$ when being measured by secondary ion mass spectrometry after the cleaning step,
   a concentration of aluminum in the region is lower than or equal to $7.5 \times 10^{17}$ atoms/cm$^3$ when being measured by secondary ion mass spectrometry after the cleaning step, and
   a concentration of fluorine in the region is lower than or equal to $8.9 \times 10^{18}$ atoms/cm$^3$ when being measured by secondary ion mass spectrometry after the cleaning step.

2. The method according to claim 1, further comprising the steps of:
   forming an oxide insulating layer having the insulating surface;
   forming a gate insulating layer over the island-shaped oxide semiconductor layer after the cleaning step;
   forming a gate electrode layer over the gate insulating layer;
   forming an insulating layer over the gate electrode layer to overlap with the gate electrode layer;
   introducing a dopant into a part of the island-shaped oxide semiconductor layer with use of the gate electrode layer and the insulating layer as a mask;
   forming a sidewall insulating layer over the gate insulating layer to cover a side surface of the gate electrode layer and a side surface of the insulating layer;
   forming a conductive layer over the island-shaped oxide semiconductor layer, the gate insulating layer, the gate electrode layer, the insulating layer, and the sidewall insulating layer;
   forming an interlayer insulating layer over the conductive layer; and
   removing a part of the interlayer insulating layer and a part of the conductive layer until the insulating layer over the gate electrode layer is exposed, thereby forming the source electrode layer and the drain electrode layer.

3. The method according to claim 1, wherein the cleaning step is performed with use of an acid solution.

4. The method according to claim 2, further comprising the step of introducing oxygen into the oxide insulating layer.

5. The method according to claim 1, further comprising the step of introducing oxygen into the oxide semiconductor layer.

6. The method according to claim 2, further comprising the step of forming a layer containing aluminum oxide over the insulating layer, the source electrode layer, the drain electrode layer, the sidewall insulating layer, and the interlayer insulating layer.

7. The method according to claim 1, wherein the etching is a dry etching.

8. A method for manufacturing a semiconductor device comprising the steps of:
forming an oxide semiconductor layer over an insulating surface;
etching a part of the oxide semiconductor layer so that an island-shaped oxide semiconductor layer is formed;
cleaning a top surface and a side surface of the island-shaped oxide semiconductor layer with use of a solution containing diluted hydrofluoric acid; and
forming a source electrode layer and a drain electrode layer over the island-shaped oxide semiconductor layer after the cleaning step,
wherein:
the island-shaped oxide semiconductor layer includes a region in a vicinity of the top surface of the island-shaped oxide semiconductor layer,
a concentration of chlorine in the region is lower than or equal to $3.4 \times 10^{17}$ atoms/cm$^3$ when being measured by secondary ion mass spectrometry after the cleaning step,
a concentration of boron in the region is lower than or equal to $4.5 \times 10^{18}$ atoms/cm$^3$ when being measured by secondary ion mass spectrometry after the cleaning step,
a concentration of aluminum in the region is lower than or equal to $7.5 \times 10^{17}$ atoms/cm$^3$ when being measured by secondary ion mass spectrometry after the cleaning step, and
a concentration of fluorine in the region is lower than or equal to $8.9 \times 10^{18}$ atoms/cm$^3$ when being measured by secondary ion mass spectrometry after the cleaning step.

9. The method according to claim 8, further comprising the steps of:
forming an oxide insulating layer having the insulating surface;
forming a gate insulating layer over the island-shaped oxide semiconductor layer after the cleaning step;
forming a gate electrode layer over the gate insulating layer;
forming an insulating layer over the gate electrode layer to overlap with the gate electrode layer;
introducing a dopant into a part of the island-shaped oxide semiconductor layer with use of the gate electrode layer and the insulating layer as a mask;
forming a sidewall insulating layer over the gate insulating layer to cover a side surface of the gate electrode layer and a side surface of the insulating layer;
forming a conductive layer over the island-shaped oxide semiconductor layer, the gate insulating layer, the gate electrode layer, the insulating layer, and the sidewall insulating layer;
forming an interlayer insulating layer over the conductive layer; and
removing a part of the interlayer insulating layer and a part of the conductive layer until the insulating layer over the gate electrode layer is exposed, thereby forming the source electrode layer and the drain electrode layer.

10. The method according to claim 9, further comprising the step of introducing oxygen into the oxide insulating layer.

11. The method according to claim 8, further comprising the step of introducing oxygen into the oxide semiconductor layer.

12. The method according to claim 9, further comprising the step of forming a layer containing aluminum oxide over the insulating layer, the source electrode layer, the drain electrode layer, the sidewall insulating layer, and the interlayer insulating layer.

13. The method according to claim 8, wherein the etching is a dry etching.

14. The method according to claim 13, wherein a concentration of the diluted hydrofluoric acid is 0.5 wt % to $5 \times 10^{-4}$ wt %.

15. The method according to claim 13,
wherein the oxide semiconductor layer contains indium, gallium and zinc, and
wherein a concentration of the diluted hydrofluoric acid is $5 \times 10^{-2}$ wt % to $5 \times 10^{-4}$ wt %.

16. A method for manufacturing a semiconductor device comprising the steps of:
forming an oxide semiconductor layer over an insulating surface;
etching a part of the oxide semiconductor layer so that an island-shaped oxide semiconductor layer is formed;
cleaning a top surface and a side surface of the island-shaped oxide semiconductor layer with use of a solution containing oxalic acid; and
forming a source electrode layer and a drain electrode layer over the island-shaped oxide semiconductor layer after the cleaning step,
wherein:
the island-shaped oxide semiconductor layer includes a region in a vicinity of the top surface of the island-shaped oxide semiconductor layer,
a concentration of chlorine in the region is lower than or equal to $3.4 \times 10^{17}$ atoms/cm$^3$ when being measured by secondary ion mass spectrometry after the cleaning step,
a concentration of boron in the region is lower than or equal to $4.5 \times 10^{18}$ atoms/cm$^3$ when being measured by secondary ion mass spectrometry after the cleaning step,
a concentration of aluminum in the region is lower than or equal to $7.5 \times 10^{17}$ atoms/cm$^3$ when being measured by secondary ion mass spectrometry after the cleaning step, and
a concentration of fluorine in the region is lower than or equal to $8.9 \times 10^{18}$ atoms/cm$^3$ when being measured by secondary ion mass spectrometry after the cleaning step.

17. The method according to claim 16, further comprising the steps of:
forming an oxide insulating layer having the insulating surface;
forming a gate insulating layer over the island-shaped oxide semiconductor layer after the cleaning step;
forming a gate electrode layer over the gate insulating layer;
forming an insulating layer over the gate electrode layer to overlap with the gate electrode layer;
introducing a dopant into a part of the island-shaped oxide semiconductor layer with use of the gate electrode layer and the insulating layer as a mask;
forming a sidewall insulating layer over the gate insulating layer to cover a side surface of the gate electrode layer and a side surface of the insulating layer;
forming a conductive layer over the island-shaped oxide semiconductor layer, the gate insulating layer, the gate electrode layer, the insulating layer, and the sidewall insulating layer;

forming an interlayer insulating layer over the conductive layer; and removing a part of the interlayer insulating layer and a part of the conductive layer until the insulating layer over the gate electrode layer is exposed, thereby forming the source electrode layer and the drain electrode layer.

18. The method according to claim 17, further comprising the step of introducing oxygen into the oxide insulating layer.

19. The method according to claim 16, further comprising the step of introducing oxygen into the oxide semiconductor layer.

20. The method according to claim 17, further comprising the step of forming a layer containing aluminum oxide over the insulating layer, the source electrode layer, the drain electrode layer, the sidewall insulating layer, and the interlayer insulating layer.

21. The method according to claim 16, wherein the etching is a dry etching.

* * * * *